US012353986B2

(12) United States Patent
Song

(10) Patent No.: US 12,353,986 B2
(45) Date of Patent: Jul. 8, 2025

(54) PROCESSING-IN-MEMORY (PIM) DEVICE, CONTROLLER FOR CONTROLLING THE PIM DEVICE, AND PIM SYSTEM INCLUDING THE PIM DEVICE AND THE CONTROLLER

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 113 days.

(21) Appl. No.: 18/502,796

(22) Filed: Nov. 6, 2023

(65) Prior Publication Data
US 2024/0070447 A1 Feb. 29, 2024

Related U.S. Application Data

(60) Division of application No. 17/140,940, filed on Jan. 4, 2021, now Pat. No. 11,842,266, which is a
(Continued)

(30) Foreign Application Priority Data

Jan. 17, 2020 (KR) ........................ 10-2020-0006902

(51) Int. Cl.
*G06F 7/523* (2006.01)
*G06F 7/544* (2006.01)
*G06N 3/063* (2023.01)

(52) U.S. Cl.
CPC ............. *G06N 3/063* (2013.01); *G06F 7/523* (2013.01); *G06F 7/5443* (2013.01)

(58) Field of Classification Search
CPC ....... G06N 3/063; G06F 7/523; G06F 7/5443; G06F 15/7821; G11C 11/4063;
(Continued)

(56) References Cited

U.S. PATENT DOCUMENTS

| 5,860,076 A | * | 1/1999 | Greene | ................ G11C 7/1006 |
| | | | | 711/E12.003 |
| 10,042,639 B2 | | 8/2018 | Gopal et al. | |
| 2003/0023909 A1 | * | 1/2003 | Ikeda | ................ H03M 13/2764 |
| | | | | 714/702 |

(Continued)

FOREIGN PATENT DOCUMENTS

| KR | 1020090064394 A | 6/2009 |
| KR | 1020170060739 A | 6/2017 |

OTHER PUBLICATIONS

W. Vanderbauwhede et al., Programming Model and Low-level Language for a Course-Grained Reconfigurable Multimedia Processor, Conference Paper, ResearcGate, 2009 (Year: 2009).*
(Continued)

*Primary Examiner* — Emily E Larocque
(74) *Attorney, Agent, or Firm* — WILLIAM PARK & ASSOCIATES LTD.

(57) ABSTRACT

A processing-in-memory (PIM) device includes a plurality of multiplication/accumulation (MAC) operators and a plurality of memory banks. The MAC operators are included in each of a plurality of channels. Each of the plurality of MAC operators performs a MAC arithmetic operation using weight data of a weight matrix. The memory banks are included in each of the plurality of channels and are configured to transmit the weight data of the weight matrix to the plurality of MAC operators. The weight data arrayed in one row of the weight matrix are stored into one row of each of the plurality of memory banks.

3 Claims, 46 Drawing Sheets

Related U.S. Application Data continuation-in-part of application No. 17/090,462, filed on Nov. 5, 2020, now Pat. No. 11,537,323.

(60) Provisional application No. 62/959,641, filed on Jan. 10, 2020, provisional application No. 62/958,223, filed on Jan. 7, 2020.

(58) Field of Classification Search
CPC ....... G11C 11/408; G11C 11/409; G11C 7/10; G11C 7/1078; G11C 7/1084; G11C 8/06
See application file for complete search history.

(56) References Cited

U.S. PATENT DOCUMENTS

| | | | |
|---|---|---|---|
| 2013/0080739 A1* | 3/2013 | Kyo | G06F 12/0207 712/42 |
| 2013/0296969 A1 | 11/2013 | Swanson | |
| 2017/0315925 A1 | 11/2017 | Yeh | |
| 2019/0096453 A1 | 3/2019 | Shin et al. | |
| 2020/0193277 A1 | 6/2020 | Kwon | |
| 2020/0294575 A1 | 9/2020 | O et al. | |

OTHER PUBLICATIONS

B. Zimmer et al., A 0.32-128 TOPS, Scalable Multi-Chip-Module-Based Deep Neural Network Inference Accelerator withGround-Referenced Signaling in 16 nm, IEEE Journal of Solid-State Circuits, vol. 55, No. 4, Apr. 2020, first published Jan. 14, 2020 (Year: 2020).

* cited by examiner

PROCESSING-IN-MEMORY (PIM) DEVICE, CONTROLLER FOR CONTROLLING THE PIM DEVICE, AND PIM SYSTEM INCLUDING THE PIM DEVICE AND THE CONTROLLER

CROSS-REFERENCE TO RELATED APPLICATIONS

This is a divisional of U.S. patent application Ser. No. 17/140,940, filed Jan. 4, 2021, which is a continuation-in-part of U.S. patent application Ser. No. 17/090,462, filed Nov. 5, 2020, which claims the benefit of U.S. Provisional Application No. 62/958,223, filed on Jan. 7, 2020, and claims priority under 35 U.S.C. § 119(a) Korean Application No. 10-2020-0006902, filed on Jan. 17, 2020, which are incorporated herein by reference in their entirety. This application also claims the provisional application No. 62/959,641, filed on Jan. 10, 2020, which is incorporated herein by reference in its entirety.

BACKGROUND

1. Technical Field

Various embodiments of the present disclosure relate to processing-in-memory (PIM) devices and, more particularly, to PIM devices performing a deterministic arithmetic operation.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. One cause of this widespread interest may be due to the improved performance of processors performing arithmetic operations. To improve the performance of artificial intelligence, it may be necessary to increase the number of layers constituting a neural network of the artificial intelligence to educate the artificial intelligence. This trend has continued in recent years, which has led to an exponential increase in the amount of computations required for hardware actually performing the computations. Moreover, if artificial intelligence employs a general hardware system including a memory and a processor which are separated from each other, the performance of the artificial intelligence may be degraded due to a limitation of the amount of data communication between the memory and the processor. In order to solve this problem, a PIM device in which a processor and memory are integrated in one semiconductor chip has been used as a neural network computing device. Because the PIM device directly performs arithmetic operations in the PIM device, a data processing speed in the neural network may be improved.

SUMMARY

A processing-in-memory (PIM) device according to an embodiment of the present disclosure includes a plurality of multiplication/accumulation (MAC) operators and a plurality of memory banks. The plurality of MAC operators are included in each of a plurality of channels, and each of the plurality of MAC operators is configured to perform a MAC arithmetic operation using weight data of a weight matrix. The plurality of memory banks are included in each of the plurality of channels and are configured to transmit the weight data of the weight matrix to the plurality of MAC operators. The weight data arrayed in one row of the weight matrix are stored into one row of each of the plurality of memory banks.

A processing-in-memory (PIM) device according to an embodiment of the present disclosure includes a plurality of multiplication/accumulation (MAC) operators and a plurality of memory banks. The plurality of MAC operators are included in each of a plurality of channels, and each of the plurality of MAC operators is configured to perform a MAC arithmetic operation using weight data of a weight matrix. The plurality of memory banks are included in each of the plurality of channels and are configured to transmit the weight data of the weight matrix to the plurality of MAC operators. The weight data arrayed in at least two rows of the weight matrix are stored into one row of each of the plurality of memory banks along a direction in which a column address increases.

A controller according to an embodiment of the present disclosure includes an address generator. The address generator is configured to receive a base address and an offset signal from a host. In addition, the address generator is configured to change a column address included in the base address based on the offset signal to generate and transmit a restored address including the changed column address to the PIM device.

A processing-in-memory (PIM) system according to an embodiment of the present disclosure includes a PIM device and a controller. The PIM device includes a plurality of multiplication/accumulation (MAC) operators and a plurality of memory banks which are disposed in each of a plurality of channels. Each of the plurality of MAC operators is configured to perform a MAC arithmetic operation using weight data of a weight matrix, and the plurality of memory banks are configured to transmit the weight data of the weight matrix to the plurality of MAC operators. The controller is configured to control the PIM device. The controller includes an address generator configured to receive a base address and an offset signal from a host and configured to change a column address included in the base address based on the offset signal to generate and transmit a restored address including the changed column address to the PIM device. The weight data arrayed in one row of the weight matrix are stored into one row of each of the plurality of memory banks.

A processing-in-memory (PIM) system according to an embodiment of the present disclosure includes a PIM device and a controller. The PIM device includes a plurality of multiplication/accumulation (MAC) operators and a plurality of memory banks which are disposed in each of a plurality of channels. Each of the plurality of MAC operators is configured to perform a MAC arithmetic operation using weight data of a weight matrix, and the plurality of memory banks are configured to transmit the weight data of the weight matrix to the plurality of MAC operators. The controller is configured to control the PIM device. The controller includes an address generator configured to receive a base address and an offset signal from a host and configured to change a column address included in the base address based on the offset signal to generate and transmit a restored address including the changed column address to the PIM device. The weight data arrayed in at least two rows of the weight matrix are stored into one row of each of the plurality of memory banks along a direction in which a column address increases.

BRIEF DESCRIPTION OF THE DRAWINGS

Certain features of the disclosed technology are illustrated by various embodiments with reference to the attached drawings.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices which are capable of performing a deterministic arithmetic operation at a high speed.

Figure 1:
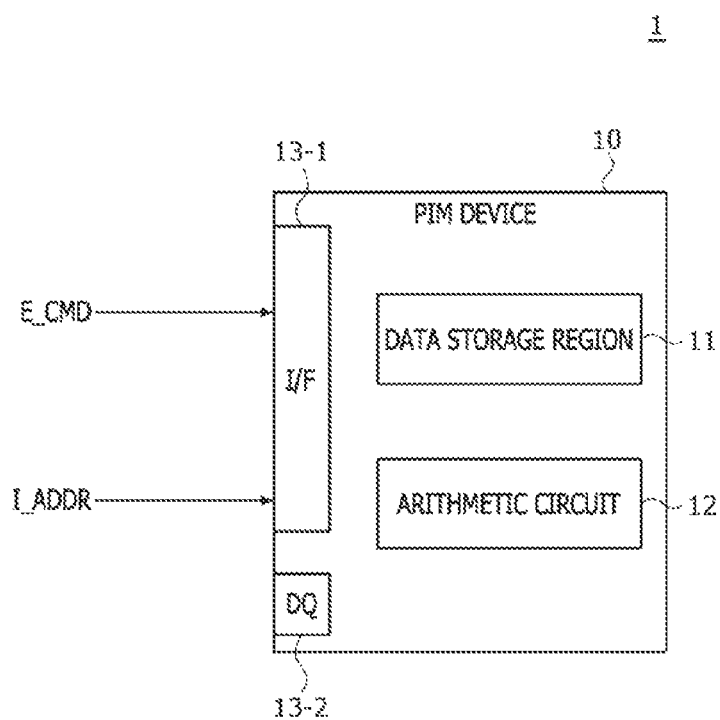
FIG. 1 is a block diagram illustrating a PIM device according to an embodiment of the present disclosure.

FIG. 1 is a block diagram illustrating a PIM device according to an embodiment of the present disclosure. As illustrated in FIG. 1, the PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2. In an embodiment, the arithmetic circuit 12 may perform additional operations, for example a bias addition operation and an active function operation, for a neural network calculation, for example, an arithmetic operation in a deep learning process. In another embodiment, the PIM device 10 may include a bias addition circuit and active function circuit separated from the arithmetic circuit 12.

The interface 13-1 of the PIM device 10 may receive an external command E_CMD and an input address I_ADDR from an external device. The external device may denote a host or a PIM controller coupled to the PIM device 10. Hereinafter, it may be assumed that the external command E_CMD transmitted to the PIM device 10 is a command requesting the MAC arithmetic operation. That is, the PIM device 10 may perform a MAC arithmetic operation in response to the external command E_CMD. The data I/O pad 13-2 of the PIM device 10 may function as a data communication terminal between a device external to the PIM device 10, for example the PIM controller or a host located outside the PIM system 1. Accordingly, data outputted from the host or the PIM controller may be inputted into the PIM device 10 through the data I/O pad 13-2. Also, data outputted from the PIM device 10 may be inputted to the host or the PIM controller through the data I/O pad 13-2.

In an embodiment, the PIM device 10 may operate in a memory mode or a MAC arithmetic mode. In the event that the PIM device 10 operates in the memory mode, the PIM device 10 may perform a data read operation or a data write operation for the data storage region 11. In the event that the PIM device 10 operates in the MAC arithmetic mode, the arithmetic circuit 12 of the PIM device 10 may receive first data and second data from the data storage region 11 to perform the MAC arithmetic operation. In the event that PIM device 10 operates in the MAC arithmetic mode, the PIM device 10 may also perform the data write operation for the data storage region 11 to execute the MAC arithmetic operation. The MAC arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
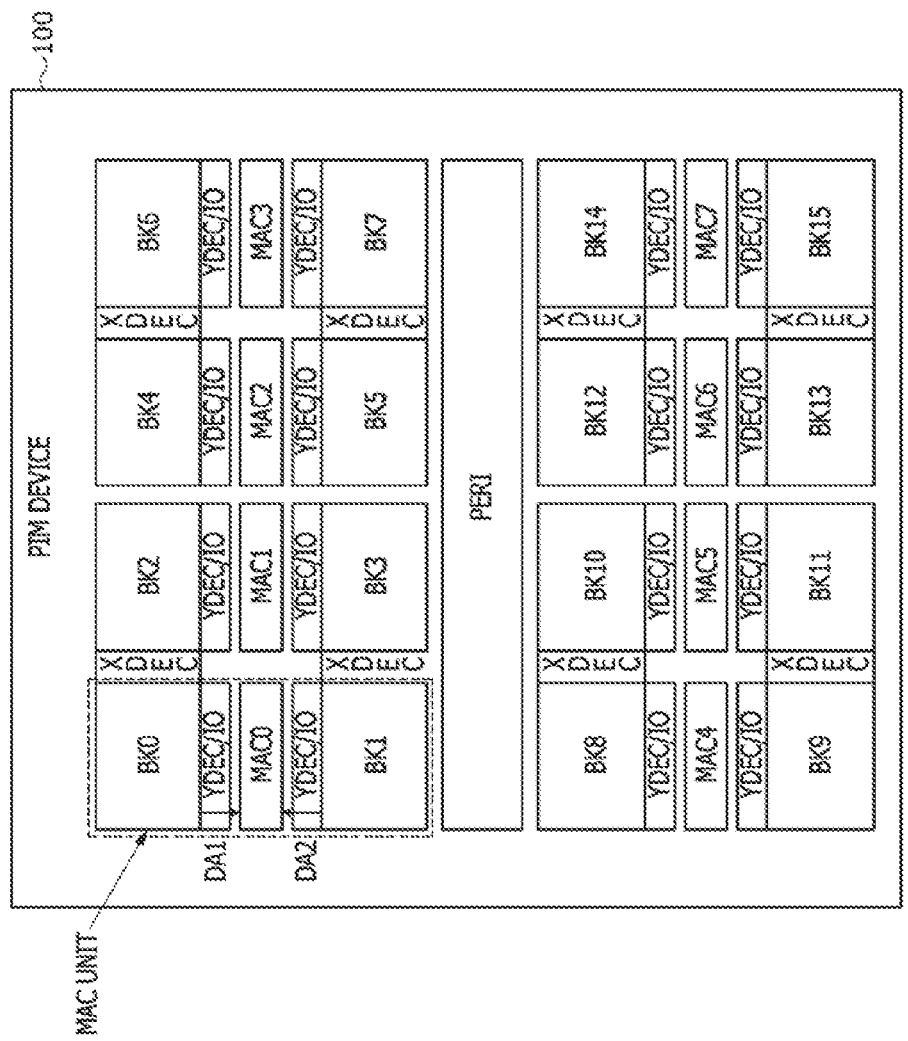
FIG. 2 is a schematic diagram illustrating an arrangement of memory banks and multiplication/accumulation (MAC) operators included in a PIM device according to a first embodiment of the present disclosure.

FIG. 2 illustrates a disposal structure indicating placement of memory banks BK0, ..., and BK15 and MAC operators MAC0, ..., and MAC7 included in a PIM device 100 according to an embodiment of the present disclosure. In an embodiment, the memory banks BK0, ..., and BK15 and the MAC operators MAC0, ..., and MAC7 may be included in the data storage region and the arithmetic circuit of the PIM device 10 of FIG. 1, respectively. Referring to FIG. 2, the PIM device 100 may include a data storage region and an arithmetic circuit. In an embodiment, the data storage region may include the memory banks BK0, ..., and BK15. Although the present embodiment illustrates an example in which the data storage region includes the memory banks BK0, ..., and BK15, the memory banks BK0, ..., and BK15 are merely examples which are suitable for the data storage region. In some embodiments, the memory banks BK0, ..., and BK15 may be a memory region corresponding to a volatile memory device, for example, a DRAM device. In an embodiment, each of the memory banks BK0, ..., and BK15 may be a component unit which is independently activated and may be configured to have the same data bus width as data I/O lines in the PIM device 100. In an embodiment, the memory banks BK0, ..., and BK15 may operate through interleaving such that an active operation of any one of the memory banks is performed in parallel while another memory bank is selected. Although the present embodiment illustrates an example in which the PIM device 100 includes the memory banks BK0, ..., and BK15, the number of the memory banks is not limited to 16 and may be different in different embodiments. Each of the memory banks BK0, ..., and BK15 may include at least one cell array which includes memory unit cells located at cross points of a plurality of rows and a plurality of columns. The memory banks BK0, ..., and BK15 may include a first group of memory banks (e.g., odd-numbered memory banks BK0, BK2, ..., and BK14) and a second group of memory banks (e.g., even-numbered memory banks BK1, BK3, ..., and BK15).

A core circuit may be disposed to be adjacent to the memory banks BK0, ..., and BK15. The core circuit may include X-decoders XDECs and Y-decoders/IO circuits YDEC/IOs. An X-decoder XDEC may also be referred to as a word line decoder or a row decoder. In an embodiment, two odd-numbered memory banks arrayed to be adjacent to each other in one row among the odd-numbered memory banks BK0, BK2, ..., and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, . . . , and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. The X-decoder XDEC may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/IOs may be disposed to be allocated to the memory banks BK0, . . . , and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum outputted from the corresponding memory bank during a read operation and a write driver for driving a write datum during a write operation for the corresponding memory bank.

In an embodiment, the arithmetic circuit may include MAC operators MAC0, . . . , and MAC7. Although the present embodiment illustrates an example in which the MAC operators MAC0, . . . , and MAC7 are employed as the arithmetic circuit, the present embodiment may be merely an example of the present disclosure. For example, in some other embodiments, processors other than the MAC operators MAC0, . . . , and MAC7 may be employed as the arithmetic circuit. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. In addition, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 outputted from the first memory bank BK0 included in the first MAC unit and second data DA2 outputted from the second memory bank BK1 included in the first MAC unit. In addition, the first MAC operator MAC0 may perform a MAC arithmetic operation of the first data DA1 and the second data DA2. In the event that the PIM device 100 performs a neural network calculation, for example, an arithmetic operation in a deep learning process, one of the first data DA1 and the second data DA2 may be weight data and the other may be vector data. A configuration of any one of the MAC operators MAC0~MAC7 will be described in more detail hereinafter.

In the PIM device 100, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 100 according to the present embodiment may operate in any one mode of a memory mode and a MAC arithmetic mode. In the memory mode, the PIM device 100 may operate to perform the same operations as general memory devices. The memory mode may include a memory read operation mode and a memory write operation mode. In the memory read operation mode, the PIM device 100 may perform a read operation for reading out data from the memory banks BK0, BK1, . . . , and BK15 to output the read data, in response to an external request. In the memory write operation mode, the PIM device 100 may perform a write operation for storing data provided by an external device into the memory banks BK0, BK1, . . . , and BK15, in response to an external request.

In the MAC arithmetic mode, the PIM device 100 may perform the MAC arithmetic operation using the MAC operators MAC0, . . . , and MAC7. Specifically, the PIM device 100 may perform the read operation of the first data DA1 for each of the odd-numbered memory banks BK0, BK2, . . . , and BK14 and the read operation of the second data DA2 for each of the even-numbered memory banks BK1, BK3, . . . , and BK15, for the MAC arithmetic operation in the MAC arithmetic mode. In addition, each of the MAC operators MAC0, . . . , and MAC7 may perform the MAC arithmetic operation of the first data DA1 and the second data DA2 which are read out of the memory banks to store a result of the MAC arithmetic operation into the memory bank or to output the result of the MAC arithmetic operation. In some cases, the PIM device 100 may perform a data write operation for storing data to be used for the MAC arithmetic operation into the memory banks before the data read operation for the MAC arithmetic operation is performed in the MAC arithmetic mode.

The operation mode of the PIM device 100 according to the present embodiment may be determined by a command which is transmitted from a host or a controller to the PIM device 100. In an embodiment, if a first external command requesting a read operation or a write operation for the memory banks BK0, BK1, . . . , and BK15 is inputted to the PIM device 100, the PIM device 100 may perform the data read operation or the data write operation in the memory mode. Meanwhile, if a second external command requesting a MAC calculation corresponding to the MAC arithmetic operation is inputted to the PIM device 100, the PIM device 100 may perform the MAC arithmetic operation.

The PIM device 100 may perform a deterministic MAC arithmetic operation. The term "deterministic MAC arithmetic operation" used in the present disclosure may be defined as the MAC arithmetic operation performed in the PIM device 100 during a predetermined fixed time. Thus, the host or the controller may always predict a point in time (or a clock) when the MAC arithmetic operation terminates in the PIM device 100 at a point in time when an external command requesting the MAC arithmetic operation is transmitted from the host or the controller to the PIM device 100. No operation for informing the host or the controller of a status of the MAC arithmetic operation is required while the PIM device 100 performs the deterministic MAC arithmetic operation. In an embodiment, a latency during which the MAC arithmetic operation is performed in the PIM device 100 may be fixed for the deterministic MAC arithmetic operation.

Figure 3:
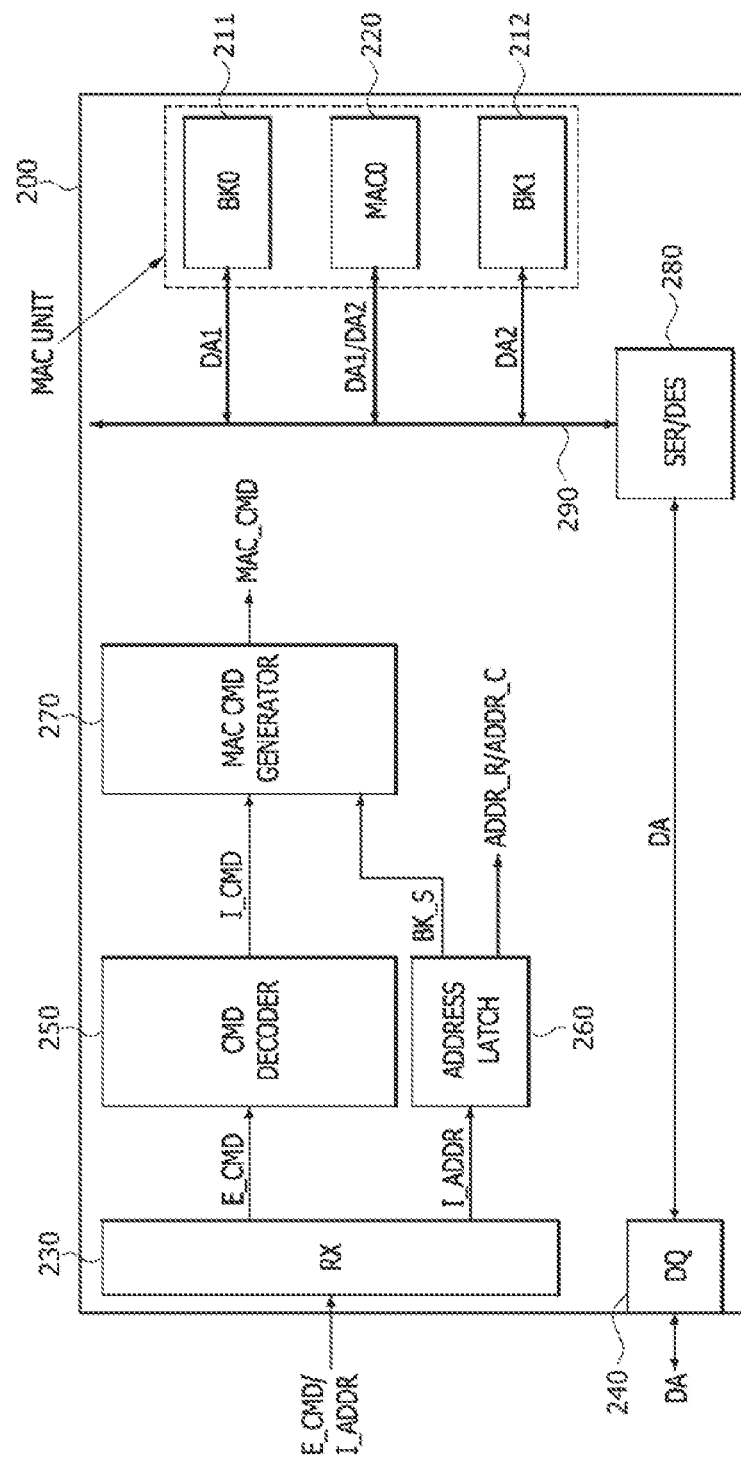
FIG. 3 is a block diagram illustrating a configuration of a PIM device according to the first embodiment of the present disclosure.
Figure 4:
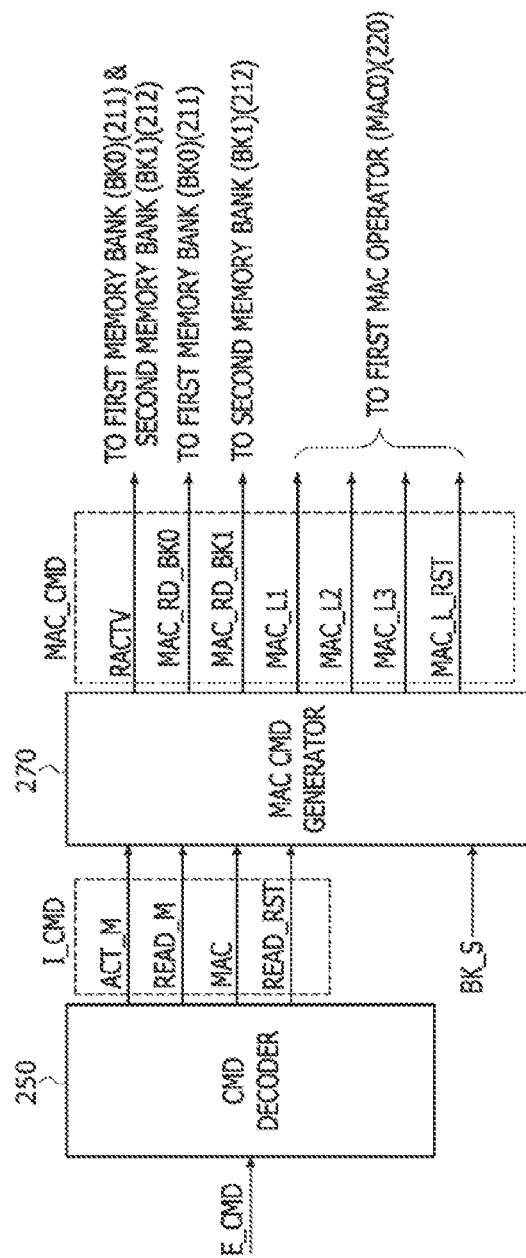
FIG. 4 illustrates internal command signals outputted from a command decoder and MAC command signals outputted from a MAC command generator in the PIM device of FIG. 3.

FIG. 3 is a block diagram illustrating a configuration of a PIM device 200 corresponding to the PIM device 100 illustrated in FIG. 3, and FIG. 4 illustrates an internal command signal I_CMD outputted from a command decoder 250 and a MAC command signal MAC_CMD outputted from a MAC command generator 270 included in the PIM device 200 of FIG. 3. FIG. 3 illustrates only the first memory bank (BK0) 211, the second memory bank (BK1) 212, and the first MAC operator (MAC0) 220 constituting the first MAC unit among the plurality of MAC units. However, FIG. 3 illustrates merely an example for simplification of the drawing. Accordingly, the following description for the first MAC unit may be equally applicable to the remaining MAC units. Referring to FIG. 3, the PIM device 200 may include a global I/O line (hereinafter, referred to as a 'GIO line') 290. The first memory bank (BK0) 211, the second memory bank (BK1) 212, and the first MAC operator (MAC0) 220 may communicate with each other through the GIO line 290. In an embodiment, the GIO line 290 may be disposed in the peripheral circuit PERI of FIG. 2.

The PIM device 200 may include a receiving driver (RX) 230, a data I/O circuit (DQ) 240, a command decoder 250, an address latch 260, a MAC command generator 270, and a serializer/deserializer (SER/DES) 280. The command decoder 250, the address latch 260, the MAC command generator 270, and the serializer/deserializer 280 may be disposed in the peripheral circuit PERI of the PIM device 100 illustrated in FIG. 2. The receiving driver 230 may receive an external command E_CMD and an input address I_ADDR from an external device. The external device may denote a host or a controller coupled to the PIM device 200. Hereinafter, it may be assumed that the external command E_CMD transmitted to the PIM device 200 is a command requesting the MAC arithmetic operation. That is, the PIM device 200 may perform the deterministic MAC arithmetic operation in response to the external command E_CMD. The data I/O circuit 240 may include an I/O pad. The data I/O circuit 240 may be coupled to data I/O line. The PIM device 200 may communicate with the external device through the data I/O circuit 240. The receiving driver 230 may separately output the external command E_CMD and the input address I_ADDR received from the external device. Data DA inputted to the PIM device 200 through the data I/O circuit 240 may be processed by the serializer/deserializer 280 and may be transmitted to the first memory bank (BK0) 211 and the second memory bank (BK1) 212 through the GIO line 290 of the PIM device 200. The data DA outputted from the first memory bank (BK0) 211, the second memory bank (BK1) 212, and the first MAC operator (MAC0) 220 through the GIO line 290 may be processed by the serializer/deserializer 280 and may be outputted to the external device through the data I/O circuit 240. The serializer/deserializer 280 may convert the data DA into parallel data if the data DA are serial data or may convert the data DA into serial data if the data DA are parallel data. For the data conversion, the serializer/deserializer 280 may include a serializer converting parallel data into serial data and a deserializer converting serial data into parallel data.

The command decoder 250 may decode the external command E_CMD outputted from the receiving driver 230 to generate and output the internal command signal I_CMD. As illustrated in FIG. 4, the internal command signal I_CMD outputted from the command decoder 250 may include first to fourth internal command signals. In an embodiment, the first internal command signal may be a memory active signal ACT_M, the second internal command signal may be a memory read signal READ_M, the third internal command signal may be a MAC arithmetic signal MAC, and the fourth internal command signal may be a result read signal READ_RST. The first to fourth internal command signals outputted from the command decoder 250 may be sequentially inputted to the MAC command generator 270.

In order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks). In an embodiment, the memory active signal ACT_M, the memory read signal READ_M, the MAC arithmetic signal MAC, and the result read signal READ_RST may have predetermined latencies, respectively. For example, the memory read signal READ_M may be generated after a first latency elapses from a point in time when the memory active signal ACT_M is generated, the MAC arithmetic signal MAC may be generated after a second latency elapses from a point in time when the memory read signal READ_M is generated, and the result read signal READ_RST may be generated after a third latency elapses from a point in time when the MAC arithmetic signal MAC is generated. No signal is generated by the command decoder 250 until a fourth latency elapses from a point in time when the result read signal READ_RST is generated. The first to fourth latencies may be predetermined and fixed. Thus, the host or the controller outputting the external command E_CMD may predict the points in time when the first to fourth internal command signals constituting the internal command signal I_CMD are generated by the command decoder 250 in advance at a point in time when the external command E_CMD is outputted from the host or the controller.

The address latch 260 may convert the input address I_ADDR outputted from the receiving driver 230 into a bank selection signal BK_S and a row/column address ADDR_R/ADDR_C to output the bank selection signal BK_S and the row/column address ADDR_R/ADDR_C. The bank selection signal BK_S may be inputted to the MAC command generator 270. The row/column address ADDR_R/ADDR_C may be transmitted to the first and second memory banks 211 and 212. One of the first and second memory banks 211 and 212 may be selected by the bank selection signal BK_S. One of rows included in the selected memory bank and one of columns included in the selected memory bank may be selected by the row/column address ADDR_R/ADDR_C. In an embodiment, a point in time when the bank selection signal BK_S is inputted to the MAC command generator 270 may be the same moment as a point in time when the row/column address ADDR_R/ADDR_C is inputted to the first and second memory banks 211 and 212. In an embodiment, the point in time when the bank selection signal BK_S is inputted to the MAC command generator 270 and the point in time when the row/column address ADDR_R/ADDR_C is inputted to the first and second memory banks 211 and 212 may be a point in time when the MAC command is generated to read out data from the first and second memory banks 211 and 212 for the MAC arithmetic operation.

The MAC command generator 270 may output the MAC command signal MAC_CMD in response to the internal command signal I_CMD outputted from the command decoder 250 and the bank selection signal BK_S outputted from the address latch 260. As illustrated in FIG. 4, the MAC command signal MAC_CMD outputted from the MAC command generator 270 may include first to seventh MAC command signals. In an embodiment, the first MAC command signal may be a MAC active signal RACTV, the second MAC command signal may be a first MAC read signal MAC_RD_BK0, the third MAC command signal may be a second MAC read signal MAC_RD_BK1, the fourth MAC command signal may be a first MAC input latch signal MAC_L1, the fifth MAC command signal may be a second MAC input latch signal MAC_L2, the sixth MAC command signal may be a MAC output latch signal MAC_L3, and the seventh MAC command signal may be a MAC result latch signal MAC_L_RST.

The MAC active signal RACTV may be generated based on the memory active signal ACT_M outputted from the command decoder 250. The first MAC read signal MAC_RD_BK0 may be generated in response to the memory read signal READ_M outputted from the command decoder 250 and the bank selection signal BK_S having a first level (e.g., a logic "low" level) outputted from the address latch 260. The first MAC input latch signal MAC_L1 may be generated at a point in time when a certain time elapses from a point in time when the first MAC read signal MAC_RD_BK0 is generated. For various embodiments, a certain time means a fixed time duration. The second MAC read signal MAC_RD_BK1 may be generated in response to the memory read signal READ_M outputted from the command decoder 250 and the bank selection signal BK_S having a second level (e.g., a logic "high" level) outputted from the address latch 260. The second MAC input latch signal MAC_L2 may be generated at a point in time when a certain time elapses from a point in time when the second MAC read signal MAC_RD_BK1 is generated. The MAC output latch signal MAC_L3 may be generated in response to the MAC arithmetic signal MAC outputted from the command decoder 250. Finally, the MAC result latch signal MAC_L_RST may be generated in response to the result read signal READ_RST outputted from the command decoder 250.

The MAC active signal RACTV outputted from the MAC command generator 270 may control an activation operation for the first and second memory banks 211 and 212. The first MAC read signal MAC_RD_BK0 outputted from the MAC command generator 270 may control a data read operation for the first memory bank 211. The second MAC read signal MAC_RD_BK1 outputted from the MAC command generator 270 may control a data read operation for the second memory bank 212. The first MAC input latch signal MAC_L1 and the second MAC input latch signal MAC_L2 outputted from the MAC command generator 270 may control an input data latch operation of the first MAC operator (MAC0) 220. The MAC output latch signal MAC_L3 outputted from the MAC command generator 270 may control an output data latch operation of the first MAC operator (MAC0) 220. The MAC result latch signal MAC_L_RST outputted from the MAC command generator 270 may control a reset operation of the first MAC operator (MAC0) 220.

As described above, in order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks), respectively. Thus, the MAC active signal RACTV, the first MAC read signal MAC_RD_BK0, the second MAC read signal MAC_RD_BK1, the first MAC input latch signal MAC_1, the second MAC input latch signal MAC_L2, the MAC output latch signal MAC_L3, and the MAC result latch signal MAC_L_RST may also be generated and outputted from the MAC command generator 270 at predetermined points in time after the external command E_CMD is inputted to the PIM device 200, respectively. That is, a time period from a point in time when the first and second memory banks 211 and 212 are activated by the MAC active signal RACTV until a point in time when the first MAC operator (MAC0) 220 is reset by the MAC result latch signal MAC_L_RST may be predetermined, and thus the PIM device 200 may perform the deterministic MAC arithmetic operation.

Figure 5:
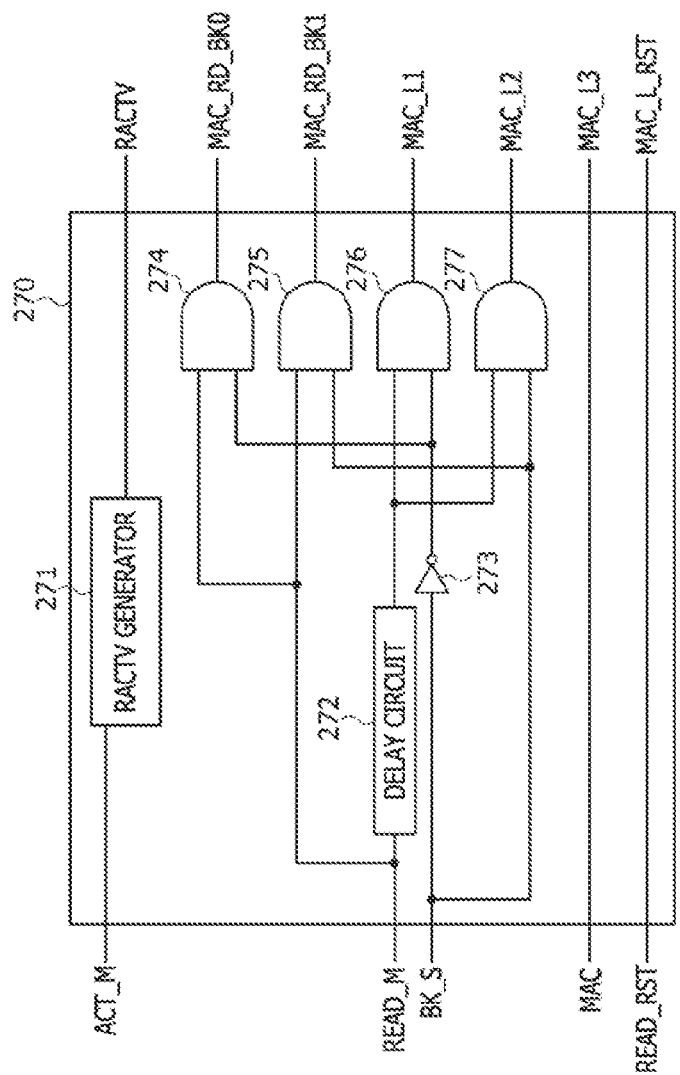
FIG. 5 illustrates an example of a configuration of a MAC command generator included in the PIM device of FIG. 3.

FIG. 5 illustrates an example of a configuration of the MAC command generator 270 included in the PIM device 200 illustrated in FIG. 3. Referring to FIG. 5, the MAC command generator 270 may sequentially receive the memory active signal ACT_M, the memory read signal READ_M, the MAC arithmetic signal MAC, and the result read signal READ_RST from the command decoder 250. In addition, the MAC command generator 270 may also receive the bank selection signal BK_S from the address latch 260. The MAC command generator 270 may output the MAC active signal RACTV, the first MAC read signal MAC_RD_BK0, the second MAC read signal MAC_RD_BK1, the first MAC input latch signal MAC_1, the second MAC input latch signal MAC_L2, the MAC output latch signal MAC_L3, and the MAC result latch signal MAC_L_RST in series with certain time intervals. For an embodiment, a certain time interval is a time interval having a fixed duration.

In an embodiment, the MAC command generator 270 may be configured to include an active signal generator 271, a delay circuit 272, an inverter 273, and first to fourth AND gates 274, 275, 276, and 277. The active signal generator 271 may receive the memory active signal ACT_M to generate and output the MAC active signal RACTV. The MAC active signal RACTV outputted from the active signal generator 271 may be transmitted to the first and second memory banks 211 and 212 to activate the first and second memory banks 211 and 212. The delay circuit 272 may receive the memory read signal READ_M and may delay the memory read signal READ_M by a delay time DELAY_T to output the delayed signal of the memory read signal READ_M. The inverter 273 may receive the bank selection signal BK_S and may invert a logic level of the bank selection signal BK_S to output the inverted signal of the bank selection signal BK_S.

The first AND gate 274 may receive the memory read signal READ_M and an output signal of the inverter 273 and may perform a logical AND operation of the memory read signal READ_M and an output signal of the inverter 273 to generate and output the first MAC read signal MAC_RD_BK0. The second AND gate 275 may receive the memory read signal READ_M and the bank selection signal BK_S and may perform a logical AND operation of the memory read signal READ_M and the bank selection signal BK_S to generate and output the second MAC read signal MAC_RD_BK1. The third AND gate 276 may receive an output signal of the delay circuit 272 and an output signal of the inverter 273 and may perform a logical AND operation of the output signals of the delay circuit 272 and the inverter 273 to generate and output the first MAC input latch signal MAC_L1. The fourth AND gate 277 may receive an output signal of the delay circuit 272 and the bank selection signal BK_S and may perform a logical AND operation of the output signal of the delay circuit 272 and the bank selection signal BK_S to generate and output the second MAC input latch signal MAC_L2.

It may be assumed that the memory read signal READ_M inputted to the MAC command generator 270 has a logic "high" level and the bank selection signal BK_S inputted to the MAC command generator 270 has a logic "low" level. A level of the bank selection signal BK_S may change from a logic "low" level into a logic "high" level after a certain time elapses. When the memory read signal READ_M has a logic "high" level and the bank selection signal BK_S has a logic "low" level, the first AND gate 274 may output the first MAC read signal MAC_RD_BK0 having a logic "high" level and the second AND gate 275 may output the second MAC read signal MAC_RD_BK1 having a logic "low" level. The first memory bank 211 may transmit the first data DA1 to the first MAC operator 220 according to a control operation based on the first MAC read signal MAC_RD_BK0 having a logic "high" level. If a level transition of the bank selection signal BK_S occurs so that both of the memory read signal READ_M and the bank selection signal BK_S have a logic "high" level, the first AND gate 274 may output the first MAC read signal MAC_RD_BK0 having a logic "low" level and the second AND gate 275 may output the second MAC read signal MAC_RD_BK1 having a logic "high" level. The second memory bank 212 may transmit the second data DA2 to the first MAC operator 220 according to a control operation based on the second MAC read signal MAC_RD_BK1 having a logic "high" level.

Due to the delay time of the delay circuit 272, the output signals of the third and fourth AND gates 276 and 277 may be generated after the first and second MAC read signals MAC_RD_BK0 and MAC_RD_BK1 are generated. Thus, after the second MAC read signal MAC_RD_BK1 is generated, the third AND gate 276 may output the first MAC input latch signal MAC_L1 having a logic "high" level. The first MAC operator 220 may latch the first data DA1 in response to the first MAC input latch signal MAC_L1 having a logic "high" level. After a certain time elapses from a point in time when the first data DA1 are latched by the first MAC operator 220, the fourth AND gate 277 may output the second MAC input latch signal MAC_L2 having a logic "high" level. The first MAC operator 220 may latch the second data DA2 in response to the second MAC input latch signal MAC_L2 having a logic "high" level. The first MAC operator 220 may start to perform the MAC arithmetic operation after the first and second data DA1 and DA2 are latched.

The MAC command generator 270 may generate the MAC output latch signal MAC_L3 in response to the MAC arithmetic signal MAC outputted from the command decoder 250. The MAC output latch signal MAC_L3 may have the same logic level as the MAC arithmetic signal MAC. For example, if the MAC arithmetic signal MAC having a logic "high" level is inputted to the MAC command generator 270, the MAC command generator 270 may generate the MAC output latch signal MAC_L3 having a logic "high" level. The MAC command generator 270 may generate the MAC result latch signal MAC_L_RST in response to the result read signal READ_RST outputted from the command decoder 250. The MAC result latch signal MAC_L_RST may have the same logic level as the result read signal READ_RST. For example, if the result read signal READ_RST having a logic "high" level is inputted to the MAC command generator 270, the MAC command generator 270 may generate the MAC result latch signal MAC_L_RST having a logic "high" level.

Figure 6:
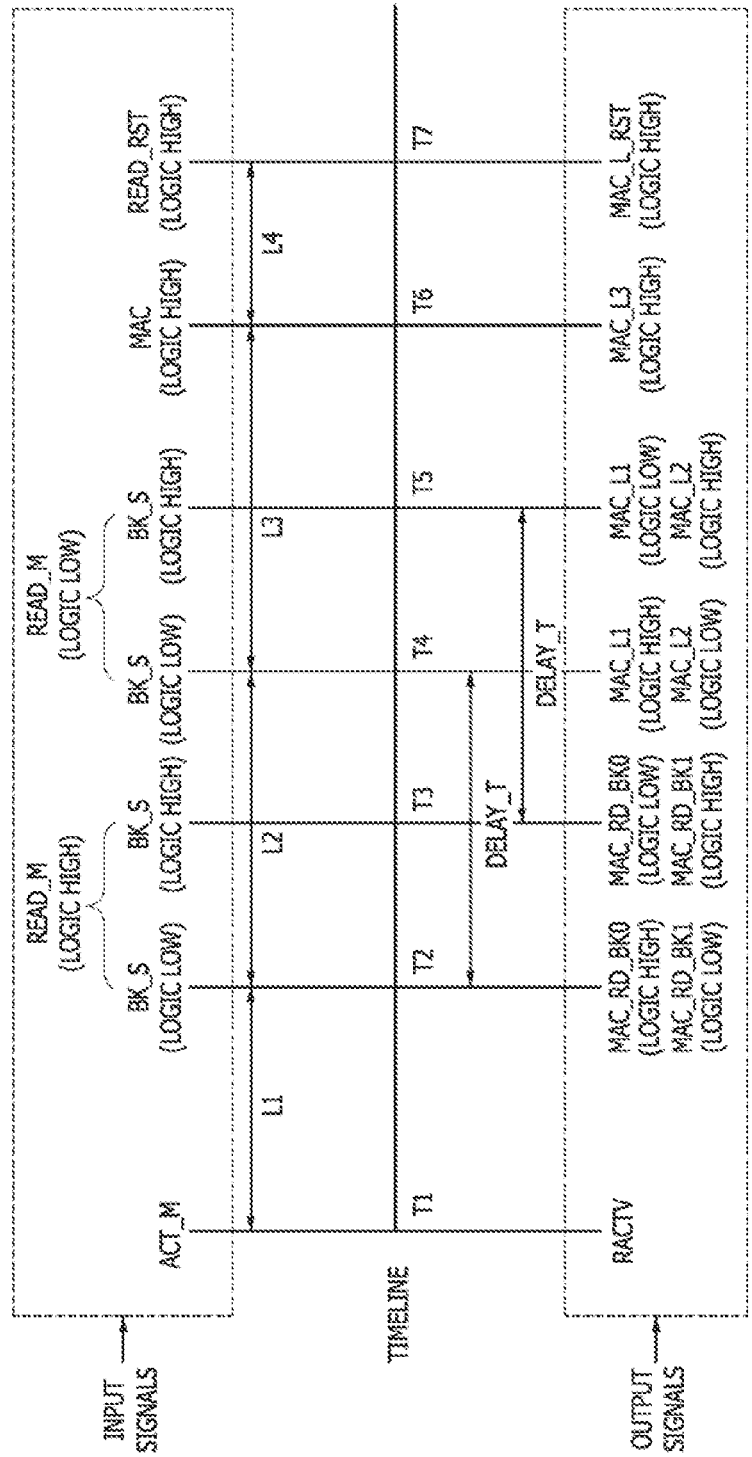
FIG. 6 illustrates input signals and output signals of the MAC command generator illustrated in FIG. 5 with a timeline.

FIG. 6 illustrates input signals and output signals of the MAC command generator 270 illustrated in FIG. 5 along a timeline. In FIG. 6, signals transmitted from the command decoder 250 to the MAC command generator 270 are illustrated in an upper dotted line box, and signals outputted from the MAC command generator 270 are illustrated in a lower dotted line box. Referring to FIGS. 5 and 6 at a first point in time "T1" of the timeline, the memory active signal ACT_M may be inputted to the MAC command generator 270 and the MAC command generator 270 may output the MAC active signal RACTV. At a second point in time "T2" when a certain time, for example, a first latency L1 elapses from the first point in time "T1", the memory read signal READ_M having a logic "high" level and the bank selection signal BK_S having a logic "low" level may be inputted to the MAC command generator 270. In response to the memory read signal READ_M having a logic "high" level and the bank selection signal BK_S having a logic "low" level, the MAC command generator 270 may output the first MAC read signal MAC_RD_BK0 having a logic "high" level and the second MAC read signal MAC_RD_BK1 having a logic "low" level in response to the memory read signal READ_M having a logic "high" level and the bank selection signal BK_S having a logic "low" level, as described with reference to FIG. 5. At a third point in time "T3" when a certain time elapses from the second point in time "T2", a logic level of the bank selection signal BK_S may change from a logic "low" level into a logic "high" level. In such a case, the MAC command generator 270 may output the first MAC read signal MAC_RD_BK0 having a logic "low" level and the second MAC read signal MAC_RD_BK1 having a logic "high" level, as described with reference to FIG. 5.

At a fourth point in time "T4" when the delay time DELAY_T elapses from the second point in time "T2", the MAC command generator 270 may output the first MAC input latch signal MAC_L1 having a logic "high" level and the second MAC input latch signal MAC_L2 having a logic "low" level. The delay time DELAY_T may be set by the delay circuit 272. The delay time DELAY_T may bet to be different according a logic design scheme of the delay circuit 272 and may be fixed once the logic design scheme of the delay circuit 272 is determined. In an embodiment, the delay time DELAY_T may be set to be equal to or greater than a second latency L2. At a fifth point in time "T5" when a certain time elapses from the fourth point in time "T4", the MAC command generator 270 may output the first MAC input latch signal MAC_L1 having a logic "low" level and the second MAC input latch signal MAC_L2 having a logic "high" level. The fifth point in time "T5" may be a moment when the delay time DELAY_T elapses from the third point in time "T3".

At a sixth point in time "T6" when a certain time, for example, a third latency L3 elapses from the fourth point in time "T4", the MAC arithmetic signal MAC having a logic "high" level may be inputted to the MAC command generator 270. In response to the MAC arithmetic signal MAC having a logic "high" level, the MAC command generator 270 may output the MAC output latch signal MAC_L3 having a logic "high" level, as described with reference to FIG. 5. Subsequently, at a seventh point in time "T7" when a certain time, for example, a fourth latency L4 elapses from the sixth point in time "T6", the result read signal READ_RST having a logic "high" level may be inputted to the MAC command generator 270. In response to the result read signal READ_RST having a logic "high" level, the MAC command generator 270 may output the MAC result latch signal MAC_L_RST having a logic "high" level, as described with reference to FIG. 5.

In order to perform the deterministic MAC arithmetic operation, moments when the internal command signals ACT_M, READ_M, MAC, and READ_RST generated by the command decoder 250 are inputted to the MAC command generator 270 may be fixed and moments when the MAC command signals RACTV, MAC_RD_BK0, MAC_RD_BK1, MAC_L1, MAC_L2, MAC_L3, and MAC_L_RST are outputted from the MAC command generator 270 in response to the internal command signals ACT_M READ_M MAC, and READ_RST may also be fixed. Thus, all of the first latency L1 between the first point in time "T1" and the second point in time "T2", the second latency L2 between the second point in time "T2" and the fourth point in time "T4", the third latency L3 between the fourth point in time "T4" and the sixth point in time "T6", and the fourth latency L4 between the sixth point in time "T6" and the seventh point in time "T7" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks BK0 and BK1 based on the first and second MAC read signals MAC_RD_BK0 and MAC_RD_BK1 and to input the first and second data DA1 and DA2 into the first MAC operator (MAC0) 220. The third latency L3 may be defined as a time it takes to latch the first and second data DA1 and DA2 in the first MAC operator (MAC0) 220 based on the first and second MAC input latch signals MAC_L1 and MAC_L2 and it takes the first MAC operator (MAC0) 220 to perform the MAC arithmetic operation of the first and second data. The fourth latency L4 may be defined as a time it takes to latch the output data in the first MAC operator (MAC0) 220 based on the MAC output latch signal MAC_L3.

Figure 7:
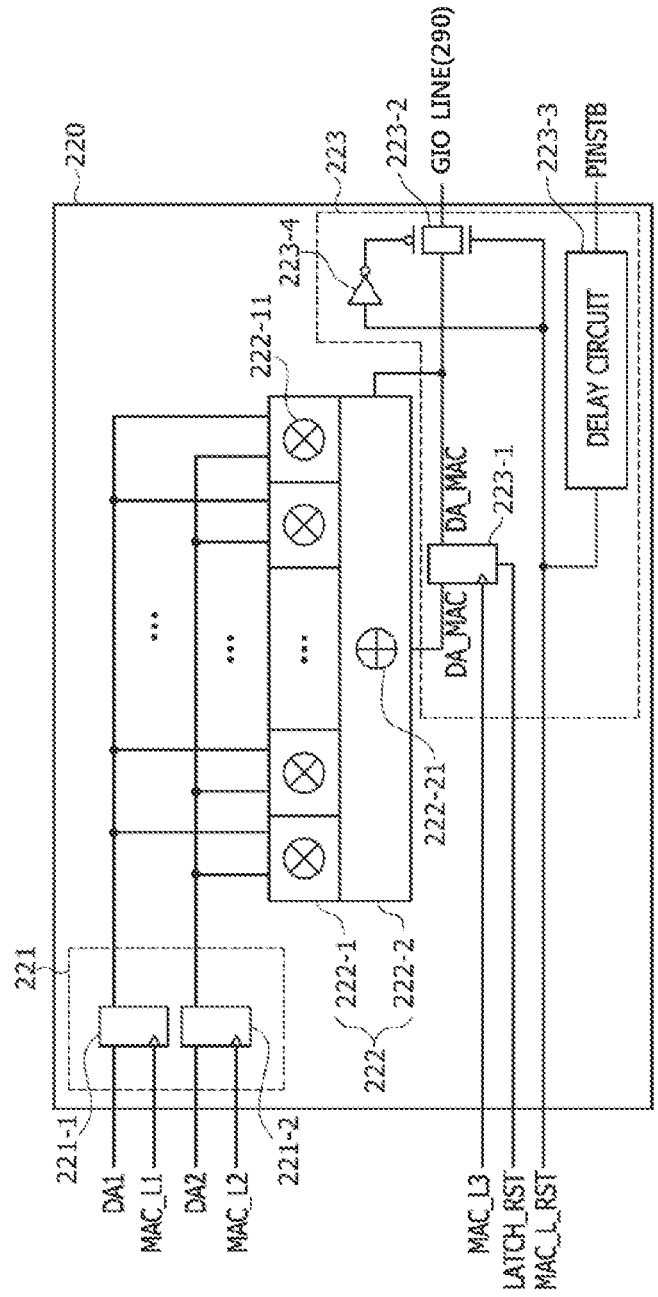
FIG. 7 illustrates an example of a configuration of a MAC operator included in the PIM device of FIG. 3.
Figure 8:
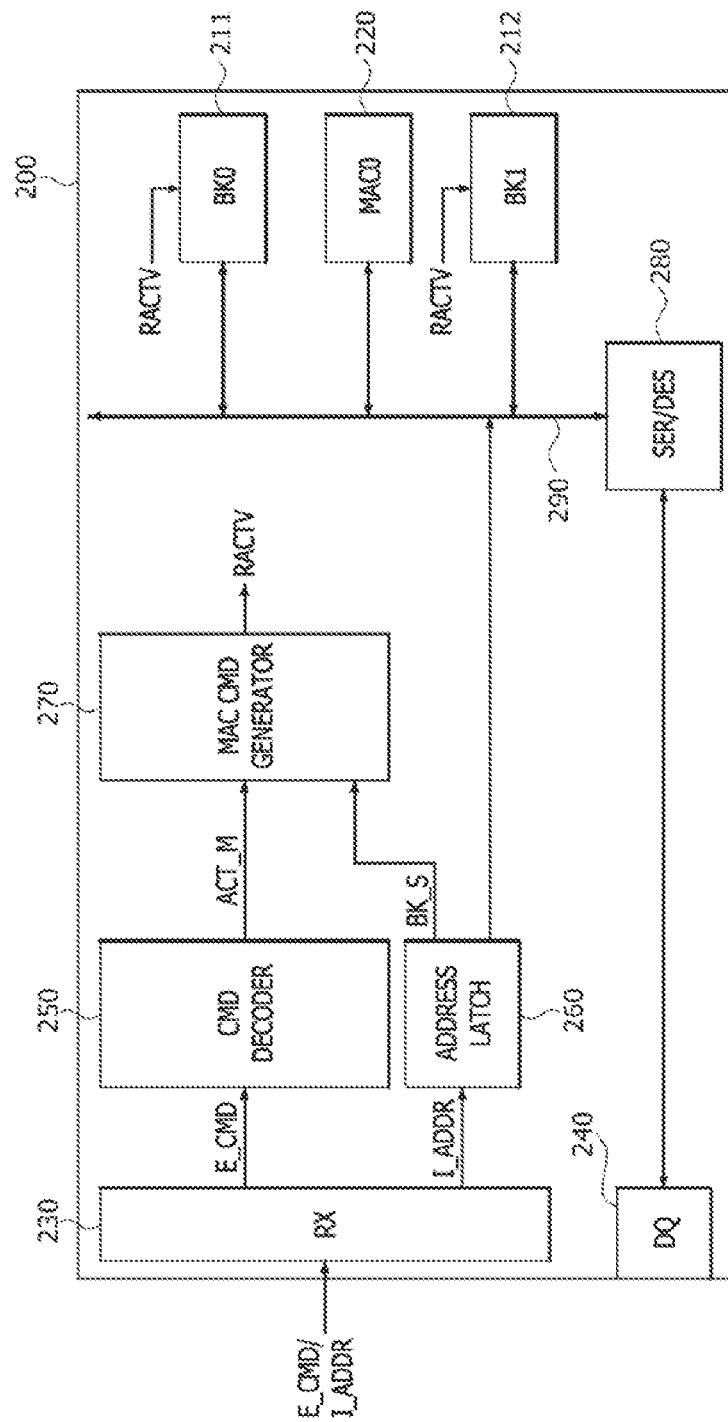
FIGS. 8 to 14 are block diagrams illustrating operations of the PIM device illustrated in FIG. 3.

FIG. 7 illustrates an example of a configuration of the first MAC operator (MAC0) 220 included in the PIM device 200 illustrated in FIG. 3. Referring to FIG. 7, the first MAC operator (MAC0) 220 may be configured to include a data input circuit 221, a MAC circuit 222, and a data output circuit 223. The data input circuit 221 may be configured to include a first input latch 221-1 and a second input latch 221-2. The MAC circuit 222 may be configured to include a multiplication logic circuit 222-1 and an addition logic circuit 222-2. The data output circuit 223 may be configured to include an output latch 223-1, a transfer gate 223-2, a delay circuit 223-3, and an inverter 223-4. In an embodiment, the first input latch 221-1, the second input latch 221-2, and the output latch 223-1 may be realized using flip-flops.

The data input circuit 221 of the first MAC operator (MAC0) 220 may be synchronized with the first and second MAC input latch signals MAC_L1 and MAC_L2 to receive and output the first and second data DA1 and DA2 inputted through the GIO line 290 to the MAC circuit 222. Specifically, the first data DA1 may be transmitted from the first memory bank BK0 (211 of FIG. 3) to the first input latch 221-1 of the data input circuit 221 through the GIO line 290, in response to the first MAC read signal MAC_RD_BK0 having a logic "high" level outputted from the MAC command generator (270 of FIG. 3). The second data DA2 may be transmitted from the second memory bank BK1 (212 of FIG. 2) to the second input latch 221-2 of the data input circuit 221 through the GIO line 290, in response to the second MAC read signal MAC_RD_BK1 having a logic "high" level outputted from the MAC command generator 270. The first input latch 221-1 may output the first data DA1 to the MAC circuit 222 in synchronization with the first MAC input latch signal MAC_L1 having a logic "high" level outputted from the MAC command generator 270 (270 of FIG. 3). The second input latch 221-2 may output the second data DA2 to the MAC circuit 222 in synchronization with the second MAC input latch signal MAC_L2 having a logic "high" level outputted from the MAC command generator (270 of FIG. 3). As described with reference to FIG. 5, the second MAC input latch signal MAC_L2 may be generated at a moment (corresponding to the fifth point in time "T5" of FIG. 6) when a certain time elapses from a moment (corresponding to the fourth point in time "T4" of FIG. 6) when the first MAC input latch signal MAC_L1 is generated. Thus, after the first data DA1 is inputted to the MAC circuit 222, the second data DA2 may then be inputted to the MAC circuit 222.

The MAC circuit 222 may perform a multiplying calculation and an accumulative adding calculation for the first and second data DA1 and DA2. The multiplication logic circuit 222-1 of the MAC circuit 222 may include a plurality of multipliers 222-11. Each of the plurality of multipliers 222-11 may perform a multiplying calculation of the first data DA1 outputted from the first input latch 221-1 and the second data DA2 outputted from the second input latch 221-2 and may output the result of the multiplying calculation. Bit values constituting the first data DA1 may be separately inputted to the multipliers 222-11. Similarly, bit values constituting the second data DA2 may also be separately inputted to the multipliers 222-11. For example, if each of the first and second data DA1 and DA2 is comprised of an 'N'-bit binary stream and the number of the multipliers 222-11 is 'M', the first data DA1 having 'N/M' bits and the second data DA2 having 'N/M' bits may be inputted to each of the multipliers 222-11. That is, each of the multipliers 222-11 may be configured to perform a multiplying calculation of first 'N/M'-bit data and second 'N/M'-bit data. Multiplication result data outputted from each of the multipliers 222-11 may have '2N/M' bits.

The addition logic circuit 222-2 of the MAC circuit 222 may include a plurality of adders 222-21. Although not shown in the drawings, the plurality of adders 222-21 may be disposed to provide a tree structure including a plurality of stages. Each of the adders 222-21 disposed at a first stage may receive two sets of multiplication result data from two of the multipliers 222-11 included in the multiplication logic circuit 222-1 and may perform an adding calculation of the two sets of multiplication result data to output addition result data. Each of the adders 222-21 disposed at a second stage may receive two sets of addition result data from two of the adders 222-21 disposed at the first stage and may perform an adding calculation of the two sets of addition result data to output addition result data. The adders 222-21 disposed at a last stage may receive two sets of addition result data from two adders 222-21 disposed at the previous stage and may perform an adding calculation of the two sets of addition result data to output the addition result data. The adders 222-21 constituting the addition logic circuit 222-2 may include an adder for performing an accumulative adding calculation of the addition result data outputted from the adder 222-21 disposed at the last stage and previous MAC result data stored in the output latch 223-1 of the data output circuit 223.

The data output circuit 223 may output MAC result data DA_MAC outputted from the MAC circuit 222 to the GIO line 290. Specifically, the output latch 223-1 of the data output circuit 223 may latch the MAC result data DA_MAC outputted from the MAC circuit 222 and may output the latched data of the MAC result data DA_MAC in synchronization with the MAC output latch signal MAC_L3 having a logic "high" level outputted from the MAC command generator (270 of FIG. 3). The MAC result data DA_MAC outputted from the output latch 223-1 may be fed back to the MAC circuit 222 for the accumulative adding calculation. In addition, the MAC result data DA_MAC may be inputted to the transfer gate 223-2, and the transfer gate 223-2 may output the MAC result data DA_MAC to the GIO line 290. The output latch 223-1 may be initialized if a latch reset signal LATCH_RST is inputted to the output latch 223-1. In such a case, all of data latched by the output latch 223-1 may be removed. In an embodiment, the latch reset signal LATCH_RST may be activated by generation of the MAC result latch signal MAC_L_RST having a logic "high" level and may be inputted to the output latch 223-1.

The MAC result latch signal MAC_L_RST outputted from the MAC command generator 270 may be inputted to the transfer gate 223-2, the delay circuit 223-3, and the inverter 223-4. The inverter 223-4 may inversely buffer the MAC result latch signal MAC_L_RST to output the inversely buffered signal of the MAC result latch signal MAC_L_RST to the transfer gate 223-2. The transfer gate 223-2 may transfer the MAC result data DA_MAC from the output latch 223-1 to the GIO line 290 in response to the MAC result latch signal MAC_L_RST having a logic "high" level. The delay circuit 223-3 may delay the MAC result latch signal MAC_L_RST by a certain time to generate and output a latch control signal PINSTB.

FIGS. 8 to 14 are block diagrams illustrating operations of the PIM device 200 illustrated in FIG. 3. In FIGS. 8 to 14, the same reference numerals or the same reference symbols as used in FIG. 3 denote the same elements. First, referring to FIG. 8, if the external command E_CMD requesting the MAC arithmetic operation and the input address I_ADDR are transmitted from an external device to the receiving driver 230, the receiving driver 230 may output the external command E_CMD and the input address I_ADDR to the command decoder 250 and the address latch 260, respectively. The command decoder 250 may decode the external command E_CMD to generate and transmit the memory active signal ACT_M to the MAC command generator 270. The address latch 260 receiving the input address I_ADDR may generate and transmit the bank selection signal BK_S to the MAC command generator 270. The MAC command generator 270 may generate and output the MAC active signal RACTV in response to the memory active signal ACT_M and the bank selection signal BK_S. The MAC active signal RACTV may be transmitted to the first memory bank (BK0) 211 and the second memory bank (BK1) 212. The first memory bank (BK0) 211 and the second memory bank (BK1) 212 may be activated by the MAC active signal RACTV.

Figure 9:
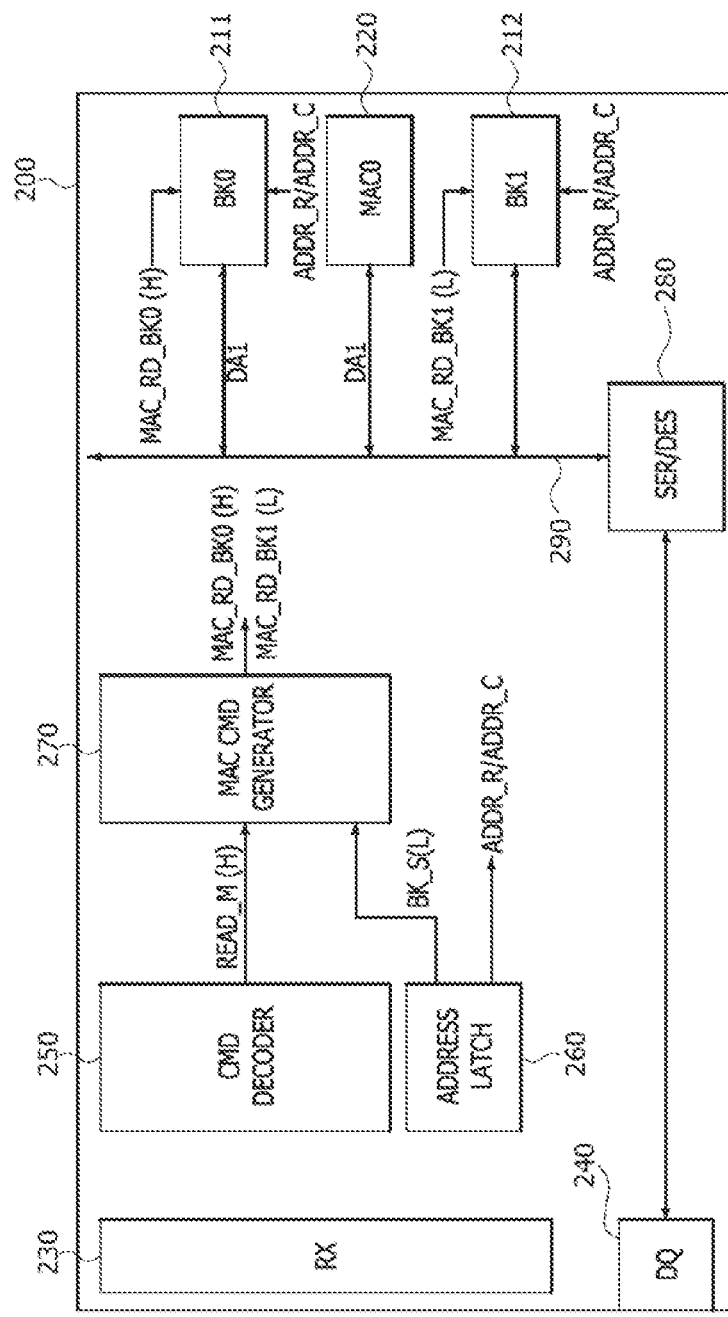

Next, referring to FIG. 9, the command decoder 250 may generate and output the memory read signal READ_M having a logic "high(H)" level to the MAC command generator 270. In addition, the address latch 260 may generate and output the bank selection signal BK_S having a logic "low(L)" level to the MAC command generator 270. In response to the memory read signal READ_M having a logic "high(H)" level and the bank selection signal BK_S having a logic "low(L)" level, the MAC command generator 270 may generate and output the first MAC read signal MAC_RD_BK0 having a logic "high(H)" level and the second MAC read signal MAC_RD_BK1 having a logic "low(L)" level, as described with reference to FIG. 4. The first MAC read signal MAC_RD_BK0 having a logic "high (H)" level, together with the row/column address ADDR_R/ADDR_C, may be transmitted to the first memory bank (BK0) 211. The second MAC read signal MAC_RD_BK1 having a logic "low(L)" level, together with the row/column address ADDR_R/ADDR_C, may be transmitted to the second memory bank (BK1) 212. The first data DA1 may be read out of the first memory bank (BK0) 211 by the first MAC read signal MAC_RD_BK0 having a logic "high(H)" level and may be transmitted to the first MAC operator (MAC0) 220 through the GIO line 290.

Figure 10:
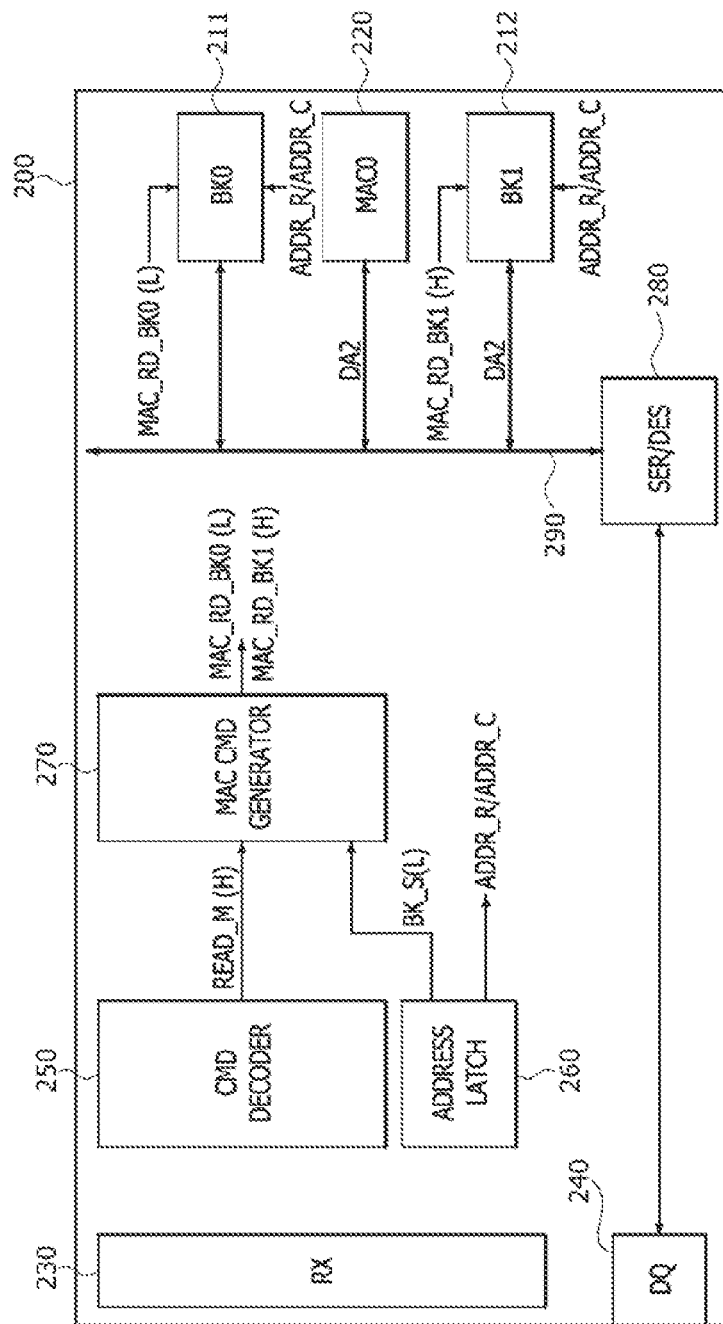

Next, referring to FIG. 10, a logic level of the bank selection signal BK_S may change from a logic "low(L)" level into a logic "high(H)" level while the memory read signal READ_M maintains a logic "high(H)" level. In such a case, as described with reference to FIG. 5, the MAC command generator 270 may generate and output the first MAC read signal MAC_RD_BK0 having a logic "low(L)" level and the second MAC read signal MAC_RD_BK1 having a logic "high(H)" level. The first MAC read signal MAC_RD_BK0 having a logic "low(L)" level, together with the row/column address ADDR_R/ADDR_C, may be transmitted to the first memory bank (BK0) 211. The second MAC read signal MAC_RD_BK1 having a logic "high(H)" level, together with the row/column address ADDR_R/ADDR_C, may be transmitted to the second memory bank (BK1) 212. The second data DA2 may be read out of the second memory bank (BK1) 212 by the second MAC read signal MAC_RD_BK1 having a logic "high(H)" level and may be transmitted to the first MAC operator (MAC0) 220 through the GIO line 290.

Figure 11:
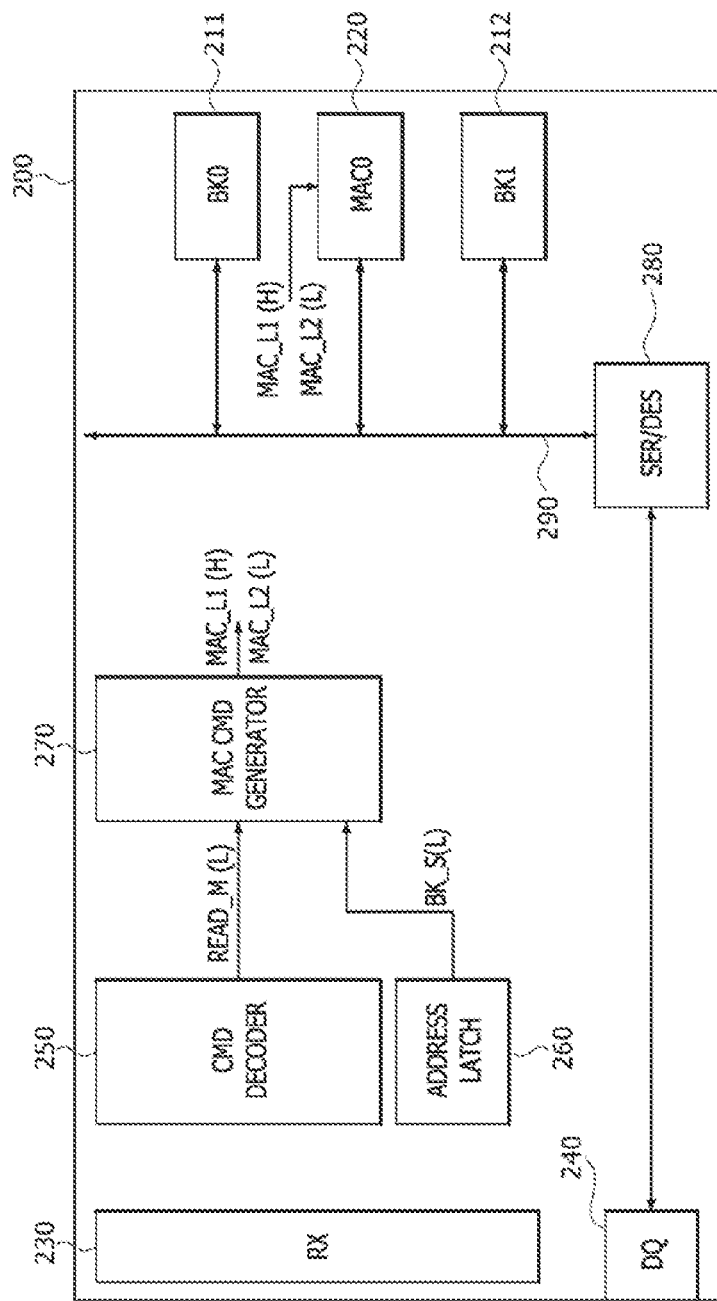

Next, referring to FIG. 11, a logic level of the memory read signal READ_M transmitted from the command decoder 250 to the MAC command generator 270 may change from a logic "high(H)" level into a logic "low(L)" level. In addition, a logic level of the bank selection signal BK_S transmitted from the address latch 260 to the MAC command generator 270 may change from a logic "high(H)" level into a logic "low(L)" level. In such a case, the MAC command generator 270 may generate and output the first MAC input latch signal MAC_L1 having a logic "high(H)" level and the second MAC input latch signal MAC_L2 having a logic "low(L)" level. A point in time when the first MAC input latch signal MAC_L1 having a logic "high(H)" level and the second MAC input latch signal MAC_L2 having a logic "low(L)" level are outputted from the MAC command generator 270 may be determined by a delay time of the delay circuit (271 of FIG. 4), as described with reference to FIG. 5. The first MAC input latch signal MAC_L1 having a logic "high(H)" level and the second MAC input latch signal MAC_L2 having a logic "low(L)" level outputted from the MAC command generator 270 may be transmitted to the first MAC operator (MAC0) 220. As described with reference to FIG. 7, the first MAC operator (MAC0) 220 may perform a latch operation of the first data DA1.

Figure 12:
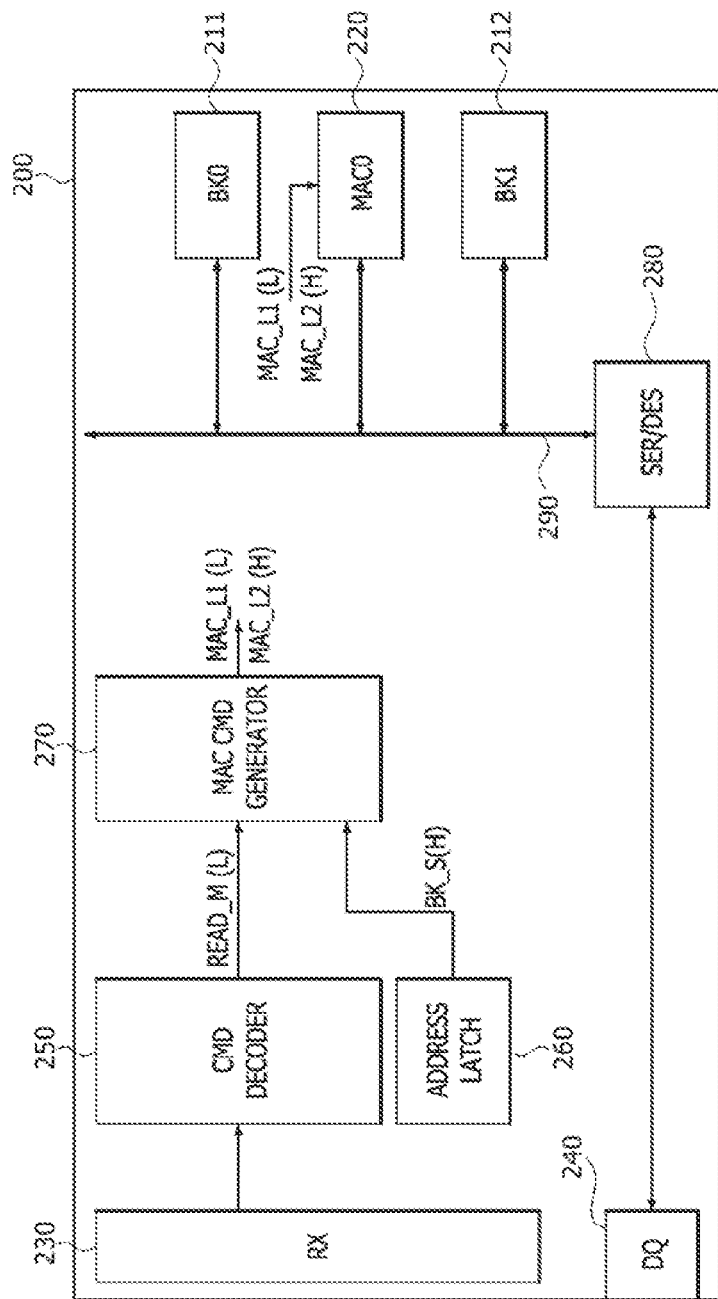

Next, referring to FIG. 12, a logic level of the bank selection signal BK_S transmitted from the address latch 260 to the MAC command generator 270 may change from a logic "low(L)" level into a logic "high(H)" level while the memory read signal READ_M maintains a logic "low(L)" level. In such a case, the MAC command generator 270 may generate and output the first MAC input latch signal MAC_L1 having a logic "low(L)" level and the second MAC input latch signal MAC_L2 having a logic "high(H)" level. A point in time when the first MAC input latch signal MAC_L1 having a logic "low(L)" level and the second MAC input latch signal MAC_L2 having a logic "high(H)" level are outputted from the MAC command generator 270 may be determined by a delay time of the delay circuit (271 of FIG. 5), as described with reference to FIG. 5. The first MAC input latch signal MAC_L1 having a logic "low(L)" level and the second MAC input latch signal MAC_L2 having a logic "high(H)" level outputted from the MAC command generator 270 may be transmitted to the first MAC operator (MAC0) 220. As described with reference to FIG. 7, the first MAC operator (MAC0) 220 may perform a latch operation of the second data DA2. After the latch operations of the first and second data DA1 and DA2 terminate, the first MAC operator (MAC0) 220 may perform the MAC arithmetic operation and may generate the MAC result data DA_MAC. The MAC result data DA_MAC generated by the first MAC operator (MAC0) 220 may be inputted to the output latch 223-1 included in the first MAC operator (MAC0) 220.

Figure 13:
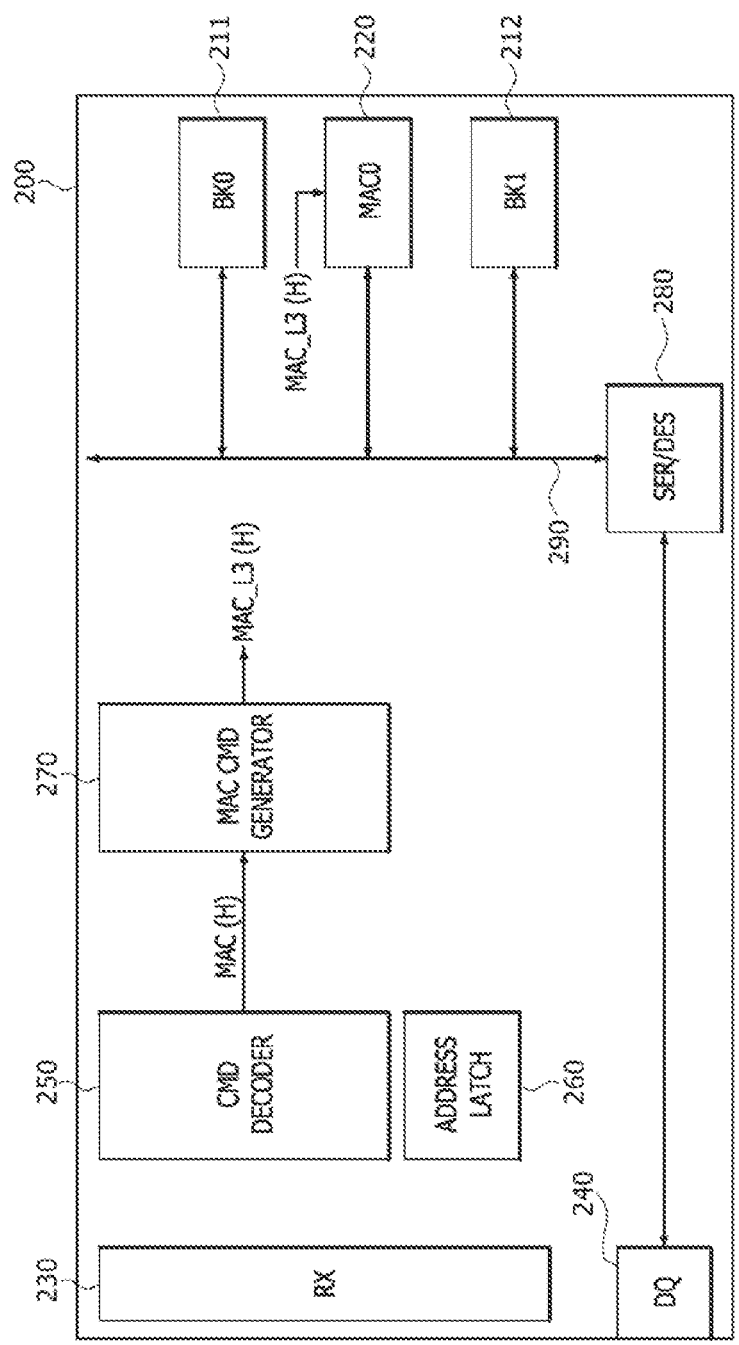

Next, referring to FIG. 13, the command decoder 250 may output and transmit the MAC arithmetic signal MAC having a logic "high(H)" level to the MAC command generator 270. The MAC command generator 270 may generate and output the MAC output latch signal MAC_L3 having a logic "high" level in response to the MAC arithmetic signal MAC having a logic "high(H)" level. The MAC output latch signal MAC_L3 having a logic "high" level may be transmitted to the first MAC operator (MAC0) 220. As described with reference to FIG. 7, the output latch (223-1 of FIG. 7) of the first MAC operator (MAC0) 220 may be synchronized with the MAC output latch signal MAC_L3 having a logic "high" level to transfer the MAC result data DA_MAC outputted from the MAC circuit 222 of the first MAC operator (MAC0) 220 to the transfer gate (233-2 of FIG. 7) of the first MAC operator (MAC0) 220. The MAC result data DA_MAC outputted from the output latch (223-1 of FIG. 7) may be fed back to the addition logic circuit (222-2 of FIG. 7) for the accumulative adding calculation.

Figure 14:
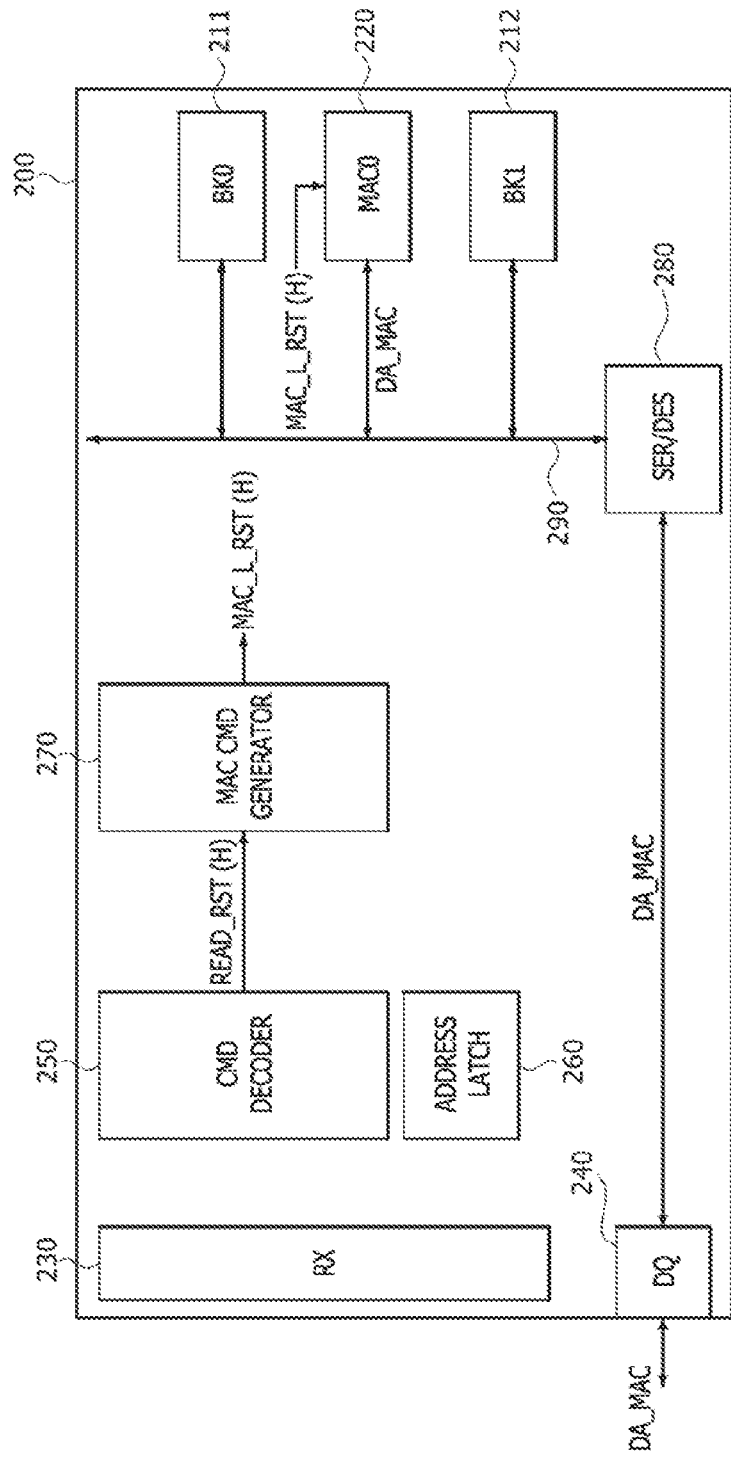

Next, referring to FIG. 14, the command decoder 250 may output and transmit the result read signal READ_RST having a logic "high(H)" level to the MAC command generator 270. The MAC command generator 270 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 220. As described with reference to FIG. 7, the first MAC operator (MAC0) 220 may output the MAC result data DA_MAC to the GIO line 290 in response to the MAC result latch signal MAC_L_RST having a logic "high" level and may also reset the output latch (223-1 of FIG. 6) included in the first MAC operator (MAC0) 220 in response to the MAC result latch signal MAC_L_RST having a logic "high" level. The MAC result data DA_MAC transmitted to the GIO line 290 may be outputted to an external device through the serializer/deserializer 280 and the data I/O circuit 240.

Figure 15:
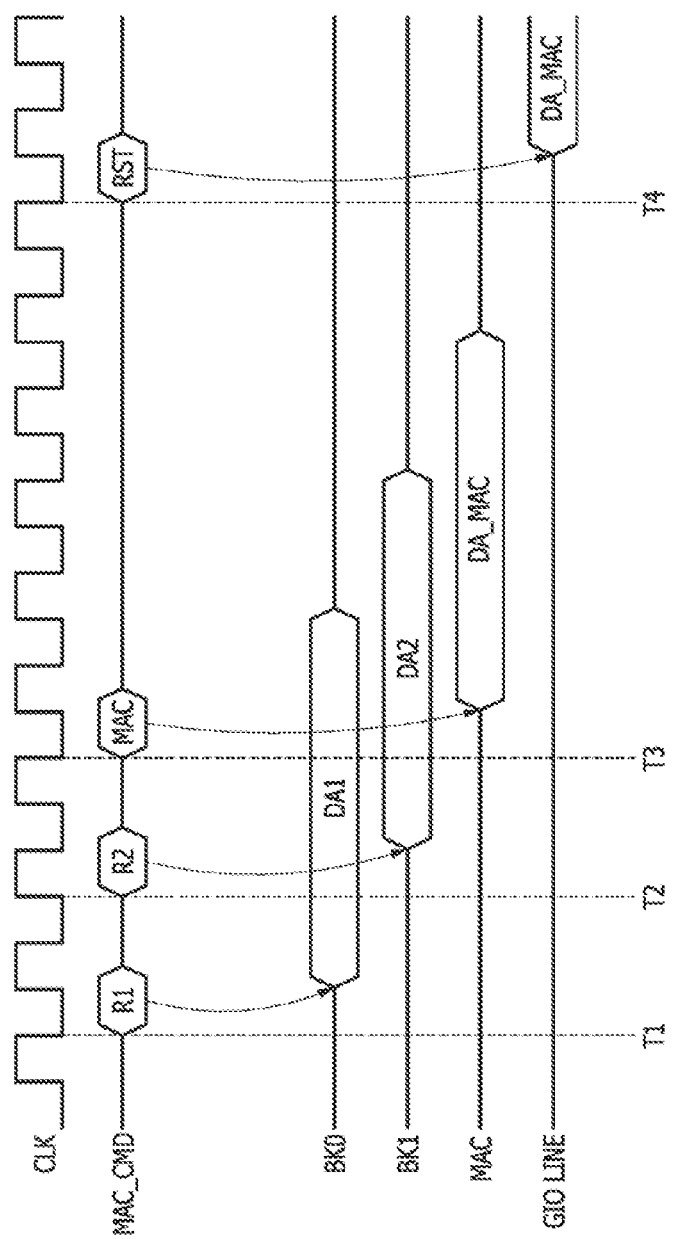
FIG. 15 is a timing diagram illustrating an operation of the PIM device illustrated in FIG. 3.

FIG. 15 is a timing diagram illustrating an operation of the PIM device 200 illustrate in FIG. 3. Referring to FIG. 15, at a first point in time "T1", the MAC command generator 270 may be synchronized with a falling edge of a clock signal CLK to generate and output the first MAC read signal MAC_RD_BK0 (R1) having a logic "high(H)" level. The first memory bank (BK0) 211 may be selected by the first MAC read signal MAC_RD_BK0 (R1) having a logic "high(H)" level so that the first data DA1 are read out of the first memory bank (BK0) 211. At a second point in time "T2", the MAC command generator 270 may be synchronized with a falling edge of the clock signal CLK to generate and output the second MAC read signal MAC_RD_BK1 (R2) having a logic "high(H)" level. The second memory bank (BK1) 212 may be selected by the second MAC read signal MAC_RD_BK1 (R2) having a logic "high(H)" level so that the second data DA2 are read out of the second memory bank (BK1) 212. At a third point in time "T3", the MAC command generator 270 may be synchronized with a falling edge of the clock signal CLK to generate and output the MAC arithmetic signal MAC having a logic "high(H)" level. The first MAC operator (MAC0) 220 may perform the multiplying calculations and the adding calculations of the first and second data DA1 and DA2 to generate the MAC result data DA_MAC, in response to the MAC arithmetic signal MAC having a logic "high(H)" level. At a fourth point in time "T4", the MAC command generator 270 may be synchronized with a falling edge of the clock signal CLK to generate and output the MAC result latch signal MAC_L_RST (RST) having a logic "high" level. The MAC result data DA_MAC generated by the first MAC operator (MAC0) 220 may be transmitted to the GIO line 290 by the MAC result latch signal MAC_L_RST (RST) having a logic "high" level.

Figure 16:
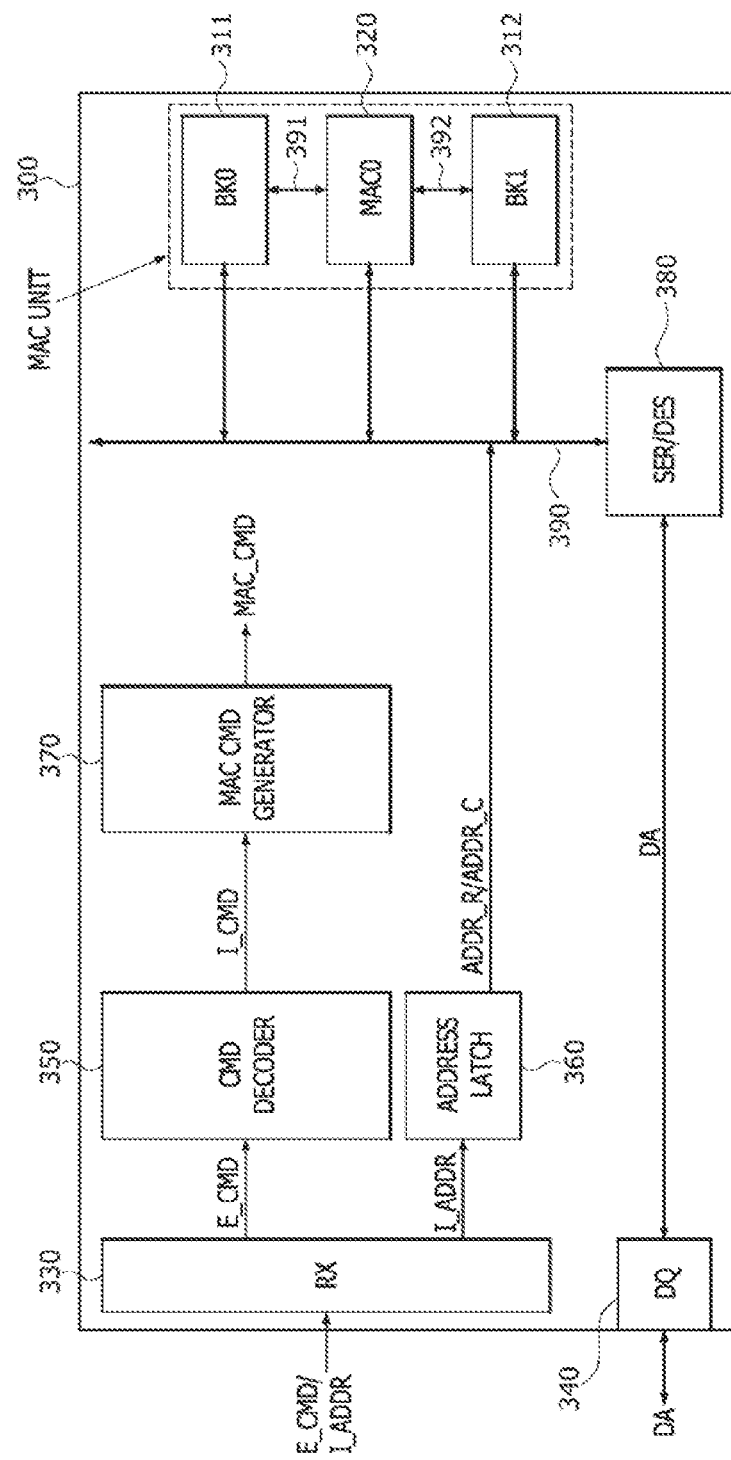
FIG. 16 is a block diagram illustrating another configuration of a PIM device according to the first embodiment of the present disclosure.
Figure 17:
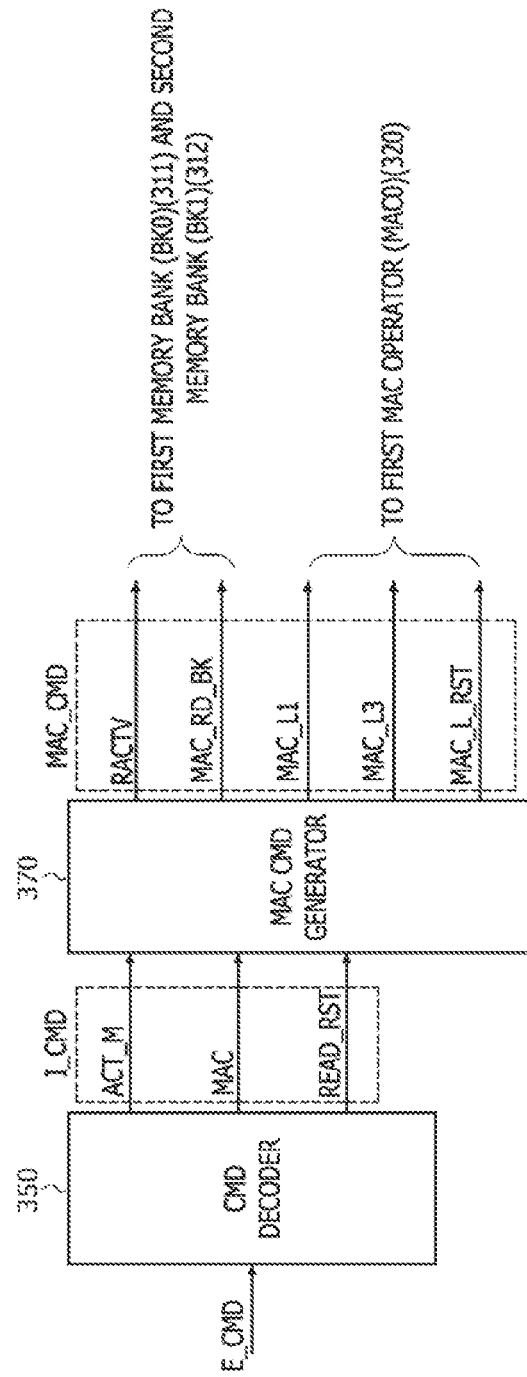
FIG. 17 illustrates internal command signals outputted from a command decoder and MAC command signals outputted from a MAC command generator in the PIM device of FIG. 16.

FIG. 16 is a block diagram illustrating another configuration of a PIM device 300 according to an embodiment of the present disclosure, and FIG. 17 illustrates an internal command signal I_CMD outputted from a command decoder 350 of the PIM device 300 and a MAC command signal MAC_CMD outputted from a MAC command generator 370 of the PIM device 300. FIG. 16 illustrates only a first memory bank (BK0) 311, a second memory bank (BK1) 312, and a first MAC operator (MAC0) 320 constituting a first MAC unit among the plurality of MAC units. However, FIG. 16 illustrates merely an example for simplification of the drawing. Accordingly, the following description for the first MAC unit may be equally applicable to the remaining MAC units.

Referring to FIG. 16, the PIM device 300 may be configured to include the first memory bank (BK0) 311, the second memory bank (BK1) 312, and the first MAC operator (MAC0) 320. The PIM device 300 according to the present embodiment may include a GIO line 390, a first bank input/output (BIO) line 391, and a second BIO line 392 acting as data transmission lines. Data communication of the first memory bank (BK0) 311, the second memory bank (BK1) 312, and the first MAC operator (MAC0) 320 may be achieved through the GIO line 390. Only the data transmission between the first memory bank (BK0) 311 and the first MAC operator (MAC0) 320 may be achieved through the first BIO line 391, and only the data transmission between the second memory bank (BK1) 312 and the first MAC operator (MAC0) 320 may be achieved through the second BIO line 392. Thus, the first MAC operator (MAC0) 320 may directly receive first data and second data from the first and second memory banks (BK0 and BK1) 311 and 312 through the first BIO line 391 and the second BIO line 392 without using the GIO line 390.

The PIM device 300 may further include a receiving driver (RX) 330, a data I/O circuit (DQ) 340, the command decoder 350, an address latch 360, the MAC command generator 370, and a serializer/deserializer (SER/DES) 380. The command decoder 350, the address latch 360, the MAC command generator 370, and the serializer/deserializer 380 may be disposed in the peripheral circuit PERI of the PIM device 100 illustrated in FIG. 2. The receiving driver 330 may receive an external command E_CMD and an input address I_ADDR from an external device. The external device may denote a host or a controller coupled to the PIM device 300. Hereinafter, it may be assumed that the external command E_CMD transmitted to the PIM device 300 is a command requesting the MAC arithmetic operation. That is, the PIM device 300 may perform the deterministic MAC arithmetic operation in response to the external command E_CMD. The data I/O circuit 340 may include a data I/O pad. The data I/O pad may be coupled with an data I/O line. The PIM device 300 communicates with the external device through the data I/O circuit 340.

The receiving driver 330 may separately output the external command E_CMD and the input address I_ADDR received from the external device. Data DA inputted to the PIM device 300 through the data I/O circuit 340 may be processed by the serializer/deserializer 380 and may be transmitted to the first memory bank (BK0) 311 and the second memory bank (BK1) 312 through the GIO line 390 of the PIM device 300. The data DA outputted from the first memory bank (BK0) 311, the second memory bank (BK1) 312, and the first MAC operator (MAC0) 320 through the GIO line 390 may be processed by the serializer/deserializer 380 and may be outputted to the external device through the data I/O circuit 340. The serializer/deserializer 380 may convert the data DA into parallel data if the data DA are serial data or may convert the data DA into serial data if the data DA are parallel data. For the data conversion, the serializer/deserializer 380 may include a serializer for converting parallel data into serial data and a deserializer for converting serial data into parallel data.

The command decoder 350 may decode the external command E_CMD outputted from the receiving driver 330 to generate and output the internal command signal I_CMD. As illustrated in FIG. 17, the internal command signal I_CMD outputted from the command decoder 350 may include first to third internal command signals. In an embodiment, the first internal command signal may be a memory active signal ACT_M, the second internal command signal may be a MAC arithmetic signal MAC, and the third internal command signal may be a result read signal READ_RST. The first to third internal command signals outputted from the command decoder 350 may be sequentially inputted to the MAC command generator 370.

In order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks). In an embodiment, the memory active signal ACT_M, the MAC arithmetic signal MAC, and the result read signal READ_RST may have predetermined latencies, respectively. For example, the MAC arithmetic signal MAC may be generated after a first latency elapses from a point in time when the memory active signal ACT_M is generated, and the result read signal READ_RST may be generated after a third latency elapses from a point in time when the MAC arithmetic signal MAC is generated. No signal is generated by the command decoder 350 until a fourth latency elapses from a point in time when the result read signal READ_RST is generated. The first to fourth latencies may be predetermined and fixed. Thus, the host or the controller outputting the external command E_CMD may predict the points in time when the first to third internal command signals constituting the internal command signal I_CMD are generated by the command decoder 350 in advance at a point in time when the external command E_CMD is outputted from the host or the controller. That is, the host or the controller may predict a point in time (or a clock) when the MAC arithmetic operation terminates in the PIM device 300 after the external command E_CMD requesting the MAC arithmetic operation is transmitted from the host or the controller to the PIM device 300, even without receiving any signals from the PIM device 300.

The address latch 360 may convert the input address I_ADDR outputted from the receiving driver 330 into a row/column address ADDR_R/ADDR_C to output the row/column address ADDR_R/ADDR_C. The row/column address ADDR_R/ADDR_C outputted from the address latch 360 may be transmitted to the first and second memory banks 311 and 312. According to the present embodiment, the first data and the second data to be used for the MAC arithmetic operation may be simultaneously read out of the first and second memory banks (BK0 and BK1) 311 and 312, respectively. Thus, it may be unnecessary to generate a bank selection signal for selecting any one of the first and second memory banks 311 and 312. In an embodiment, a point in time when the row/column address ADDR_R/ADDR_C is inputted to the first and second memory banks 311 and 312 may be a point in time when a MAC command (i.e., the MAC arithmetic signal MAC) requesting a data read operation for the first and second memory banks 311 and 312 for the MAC arithmetic operation is generated.

The MAC command generator 370 may output the MAC command signal MAC_CMD in response to the internal command signal I_CMD outputted from the command decoder 350. As illustrated in FIG. 16, the MAC command signal MAC_CMD outputted from the MAC command generator 370 may include first to fifth MAC command signals. In an embodiment, the first MAC command signal may be a MAC active signal RACTV, the second MAC command signal may be a MAC read signal MAC_RD_BK, the third MAC command signal may be a MAC input latch signal MAC_1, the fourth MAC command signal may be a MAC output latch signal MAC_L3, and the fifth MAC command signal may be a MAC result latch signal MAC_L_RST.

The MAC active signal RACTV may be generated based on the memory active signal ACT_M outputted from the command decoder 350. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 350. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 350.

The MAC active signal RACTV outputted from the MAC command generator 370 may control an activation operation for the first and second memory banks 311 and 312. The MAC read signal MAC_RD_BK outputted from the MAC command generator 370 may control a data read operation for the first and second memory banks 311 and 312. The MAC input latch signal MAC_L1 outputted from the MAC command generator 370 may control an input data latch operation of the first MAC operator (MAC0) 320. The MAC output latch signal MAC_L3 outputted from the MAC command generator 370 may control an output data latch operation of the first MAC operator (MAC0) 320. The MAC result latch signal MAC_L_RST outputted from the MAC command generator 370 may control an output operation of MAC result data of the first MAC operator (MAC0) 320 and a reset operation of the first MAC operator (MAC0) 320.

As described above, in order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks), respectively. Thus, the MAC active signal RACTV, the MAC read signal MAC_RD_BK, the MAC input latch signal MAC_1, the MAC output latch signal MAC_L3, and the MAC result latch signal MAC_L_RST may also be generated and outputted from the MAC command generator 370 at predetermined points in time after the external command E_CMD is inputted to the PIM device 300, respectively. That is, a time period from a point in time when the first and second memory banks 311 and 312 are activated by the MAC active signal RACTV until a point in time when the first MAC operator (MAC0) 320 is reset by the MAC result latch signal MAC_L_RST may be predetermined.

Figure 18:
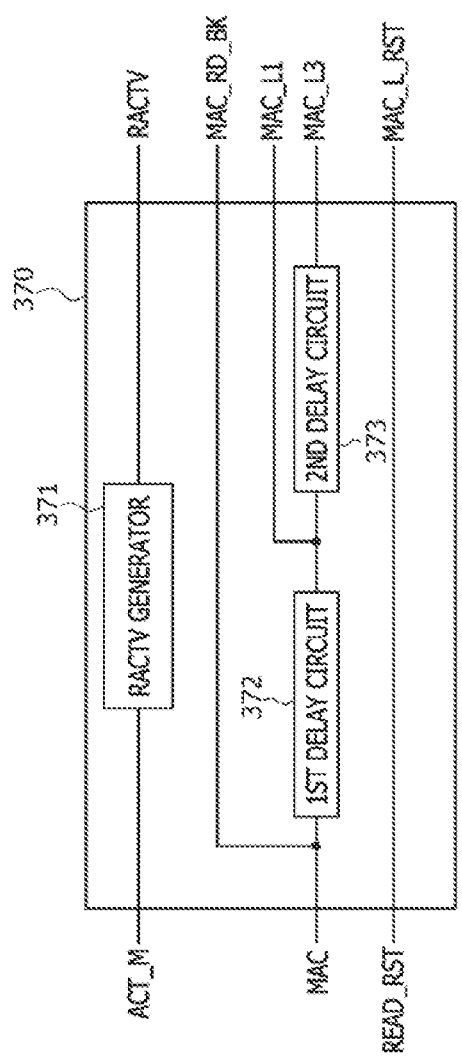
FIG. 18 illustrates an example of a configuration of a MAC command generator included in the PIM device of FIG. 16.

FIG. 18 illustrates an example of a configuration of the MAC command generator 370 included in the PIM device 300 illustrated in FIG. 16. Referring to FIG. 18, the MAC command generator 370 may sequentially receive the memory active signal ACT_M, the MAC arithmetic signal MAC, and the result read signal READ_RST from the command decoder 350. In addition, the MAC command generator 370 may sequentially generate and output the MAC active signal RACTV, the MAC read signal MAC_RD_BK, the MAC input latch signal MAC_1, the MAC output latch signal MAC_L3, and the MAC result latch signal MAC_L_RST. The MAC active signal RACTV, the MAC read signal MAC_RD_BK, the MAC input latch signal MAC_1, the MAC output latch signal MAC_L3, and the MAC result latch signal MAC_L_RST may be outputted in series with certain time intervals.

In an embodiment, the MAC command generator 370 may be configured to include an active signal generator 371, a first delay circuit 372, and a second delay circuit 373. The active signal generator 371 may receive the memory active signal ACT_M to generate and output the MAC active signal RACTV. The MAC active signal RACTV outputted from the active signal generator 371 may be transmitted to the first and second memory banks 311 and 312 to activate the first and second memory banks 311 and 312. The MAC command generator 370 may receive the MAC arithmetic signal MAC outputted from the command decoder 350 to output the MAC arithmetic signal MAC as the MAC read signal MAC_RD_BK. The first delay circuit 372 may receive the MAC arithmetic signal MAC and may delay the MAC arithmetic signal MAC by a first delay time DELAY_T1 to generate and output the MAC input latch signal MAC_L1. The second delay circuit 373 may receive an output signal of the first delay circuit 372 and may delay the output signal of the first delay circuit 372 by a second delay time DELAY_T2 to generate and output the MAC output latch signal MAC_L3. The MAC command generator 370 may generate the MAC result latch signal MAC_L_RST in response to the result read signal READ_RST outputted from the command decoder 350.

The MAC command generator 370 may generate and output the MAC active signal RACTV in response to the memory active signal ACT_M outputted from the command decoder 350. Subsequently, the MAC command generator 370 may generate and output the MAC read signal MAC_RD_BK in response to the MAC arithmetic signal MAC outputted from the command decoder 350. The MAC arithmetic signal MAC may be inputted to the first delay circuit 372. The MAC command generator 370 may delay the MAC arithmetic signal MAC by a certain time determined by the first delay circuit 372 to generate and output an output signal of the first delay circuit 372 as the MAC input latch signal MAC_1. The output signal of the first delay circuit 372 may be inputted to the second delay circuit 373. The MAC command generator 370 may delay the MAC input latch signal MAC_L1 by a certain time determined by the second delay circuit 373 to generate and output an output signal of the second delay circuit 373 as the MAC output latch signal MAC_L3. Subsequently, the MAC command generator 370 may generate and output the MAC result latch signal MAC_L_RST in response to the result read signal READ_RST outputted from the command decoder 350.

Figure 19:
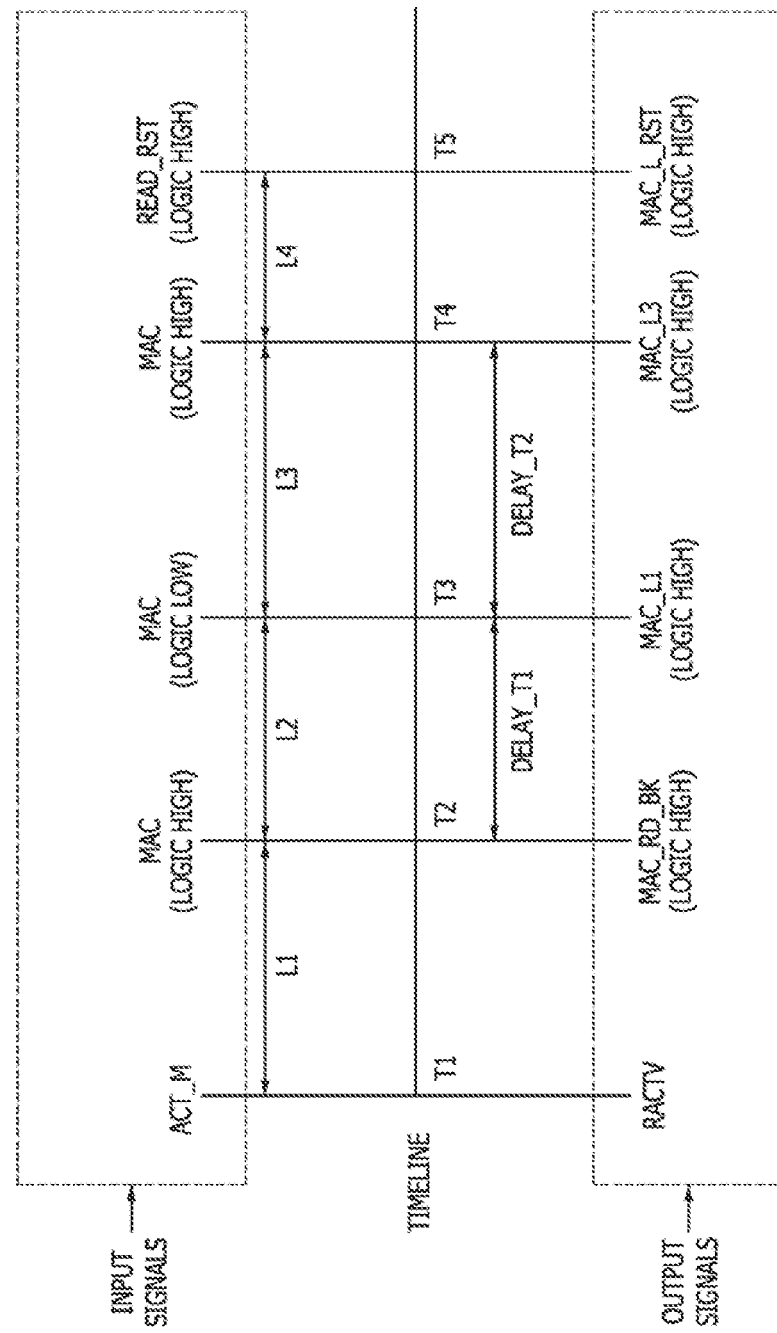
FIG. 19 illustrates input signals and output signals of the MAC command generator illustrated in FIG. 18 with a timeline.

FIG. 19 illustrates input signals and output signals of the MAC command generator 370 illustrated in FIG. 18 with a timeline. In FIG. 19, signals transmitted from the command decoder 350 to the MAC command generator 370 are illustrated in an upper dotted line box, and signals outputted from the MAC command generator 370 are illustrated in a lower dotted line box. Referring to FIGS. 18 and 19, at a first point in time "T1" of the timeline, the memory active signal ACT_M may be inputted to the MAC command generator 370 and the MAC command generator 370 may output the MAC active signal RACTV. At a second point in time "T2" when a certain time, for example, a first latency L1 elapses from the first point in time "T1", the MAC arithmetic signal MAC having a logic "high" level may be inputted to the MAC command generator 370. In response to the MAC arithmetic signal MAC having a logic "high" level, the MAC command generator 370 may output the MAC read signal MAC_RD_BK having a logic "high" level. At a third point in time "T3" when a certain time elapses from the second point in time "T2", a logic level of the MAC arithmetic signal MAC may change from a logic "high" level into a logic "low" level.

At the third point in time "T3" when the first delay time DELAY_T1 elapses from the second point in time "T2", the MAC command generator 370 may output the MAC input latch signal MAC_L1 having a logic "high" level. The first delay time DELAY_T1 may correspond to a delay time determined by the first delay circuit 372 illustrated in FIG. 18. The first delay time DELAY_T1 may be set to be different according to a logic design scheme of the first delay circuit 372. In an embodiment, the first delay time DELAY_T1 may be set to be equal to or greater than a second latency L2. At a fourth point in time "T4" when a certain time elapses from the third point in time "T3", the MAC command generator 370 may output the MAC output latch signal MAC_L3 having a logic "high" level. The fourth point in time "T4" may be a moment when the second delay time DELAY_T2 elapses from the third point in time "T3". The second delay time DELAY_T2 may correspond to a delay time determined by the second delay circuit 373 illustrated in FIG. 18. The second delay time DELAY_T2 may be set to be different according to a logic design scheme of the second delay circuit 373. In an embodiment, the second delay time DELAY_T2 may be set to be equal to or greater than a third latency L3. At a fifth point in time "T5" when a certain time, for example, a fourth L4 elapses from the fourth point in time "T4", the result read signal READ_RST having a logic "high" level may be inputted to the MAC command generator 370. In response to the result read signal READ_RST having a logic "high" level, the MAC command generator 370 may output the MAC result latch signal MAC_L_RST having a logic "high" level, as described with reference to FIG. 18.

In order to perform the deterministic MAC arithmetic operation, moments when the internal command signals ACT_M, MAC, and READ_RST generated by the command decoder 350 are inputted to the MAC command generator 370 may be fixed and moments when the MAC command signals RACTV, MAC_RD_BK, MAC_L1, MAC_L3, and MAC_L_RST are outputted from the MAC command generator 370 in response to the internal command signals ACT_M, MAC, and READ_RST may also be fixed. Thus, all of the first latency L1 between the first point in time "T1" and the second point in time "T2", the second latency L2 between the second point in time "T2" and the third point in time "T3", the third latency L3 between the third point in time "T3" and the fourth point in time "T4", and the fourth latency L4 between the fourth point in time "T4" and the fifth point in time "T5" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks (BK0 and BK1) 311 and 312 based on the MAC read signals MAC_RD_BK and to input the first and second data DA1 and DA2 into the first MAC operator (MAC0) 320. The third latency L3 may be defined as a time it takes to latch the first and second data DA1 and DA2 in the first MAC operator (MAC0) 320 based on the MAC input latch signals MAC_L1 and it takes the first MAC operator (MAC0) 320 to perform the MAC arithmetic operation of the first and second data. The fourth latency L4 may be defined as a time it takes to latch the output data in the first MAC operator (MAC0) 320 based on the MAC output latch signal MAC_L3.

Figure 20:
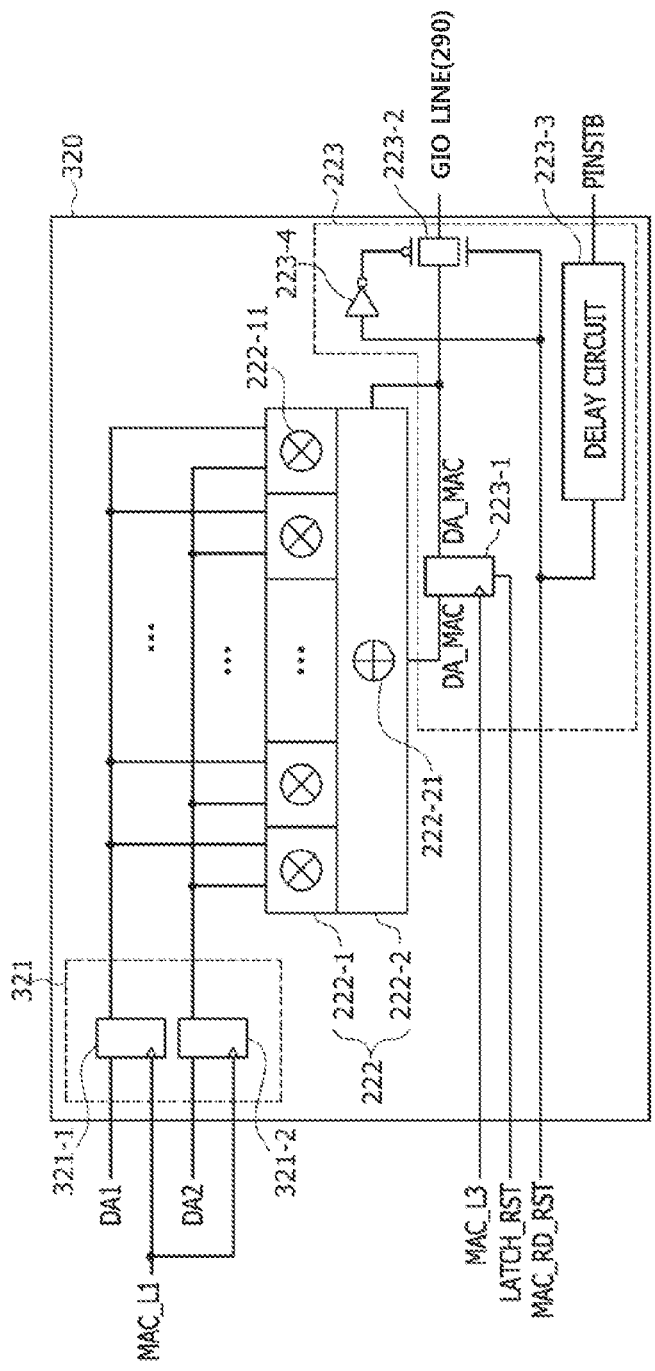
FIG. 20 illustrates an example of a configuration of a MAC operator included in the PIM device of FIG. 16.
Figure 21:
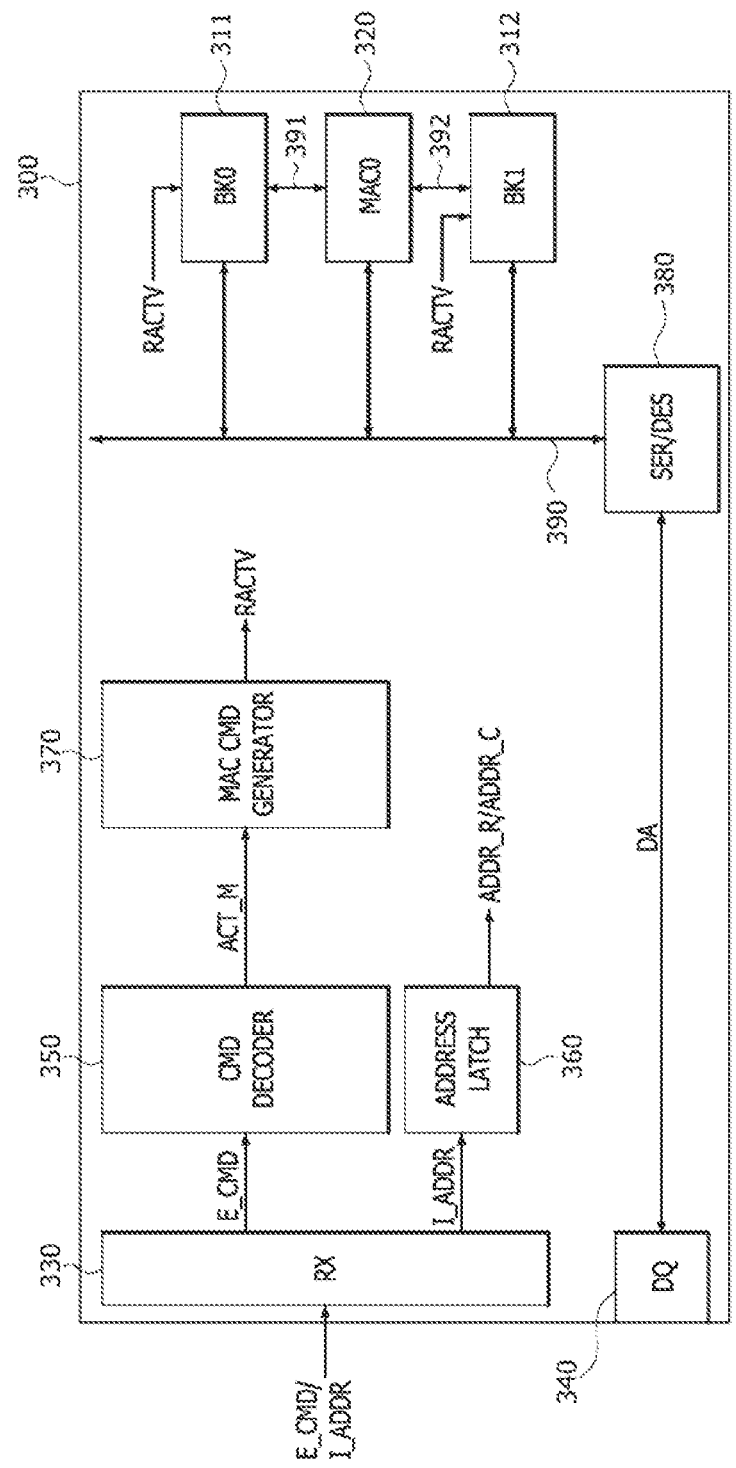
FIGS. 21 to 25 are block diagrams illustrating operations of the PIM device illustrated in FIG. 16.

FIG. 20 illustrates an example of a configuration of the first MAC operator (MAC0) 320 included in the PIM device 300 of FIG. 16. The first MAC operator (MAC0) 320 included in the PIM device 300 may have the same configuration as the first MAC operator (MAC0) 220 described with reference to FIG. 7 except for a signal applied to clock terminals of first and second input latches 321-1 and 321-2 constituting a data input circuit 321. Thus, in FIG. 20, the same reference numerals or the same reference symbols as used in FIG. 7 denote the same elements, and descriptions of the same elements as set forth with reference to FIG. 7 will be omitted hereinafter.

Describing in detail the differences between the first MAC operator (MAC0) 220 and the first MAC operator (MAC0) 320, in case of the first MAC operator (MAC0) 220 illustrated in FIG. 7, the first input latch (221-1 of FIG. 7) and the second input latch (221-2 of FIG. 7) of the data input circuit (221 of FIG. 7) may be synchronized with the first and second MAC input latch signals MAC_L1 and MAC_L2, respectively, sequentially generated with a certain time interval to output the first data DA1 and the second data DA2. In contrast, in case of the first MAC operator (MAC0) 320, the MAC input latch signal MAC_L1 may be inputted to both of the clock terminals of the first and second input latches 321-1 and 321-2 constituting a data input circuit 321. Thus, both of the first and second input latches 321-1 and 321-2 may be synchronized with the MAC input latch signal MAC_L1 to output the first data DA1 and the second data DA2, respectively. Accordingly, the first MAC operator (MAC0) 320 may transmit the first and second data DA1 and DA2 to the MAC circuit 222 in parallel without any time interval between the first and second data DA1 and DA2. As a result, the MAC arithmetic operation of the MAC circuit 222 may be quickly performed without any delay of data input time.

FIGS. 21 to 25 are block diagrams illustrating operations of the PIM device 300 illustrated in FIG. 16. In FIGS. 21 to 25, the same reference numerals or the same reference symbols as used in FIG. 16 denote the same elements. First, referring to FIG. 21, if the external command E_CMD requesting the MAC arithmetic operation and the input address I_ADDR are transmitted from an external device to the receiving driver 330, the receiving driver 330 may output the external command E_CMD and the input address I_ADDR to the command decoder 350 and the address latch 360, respectively. The command decoder 350 may decode the external command E_CMD to generate and transmit the memory active signal ACT_M to the MAC command generator 370. The MAC command generator 370 may generate and output the MAC active signal RACTV in response to the memory active signal ACT_M. The MAC active signal RACTV may be transmitted to the first memory bank (BK0) 311 and the second memory bank (BK1) 312. Both of the first memory bank (BK0) 311 and the second memory bank (BK1) 312 may be activated by the MAC active signal RACTV.

Figure 22:
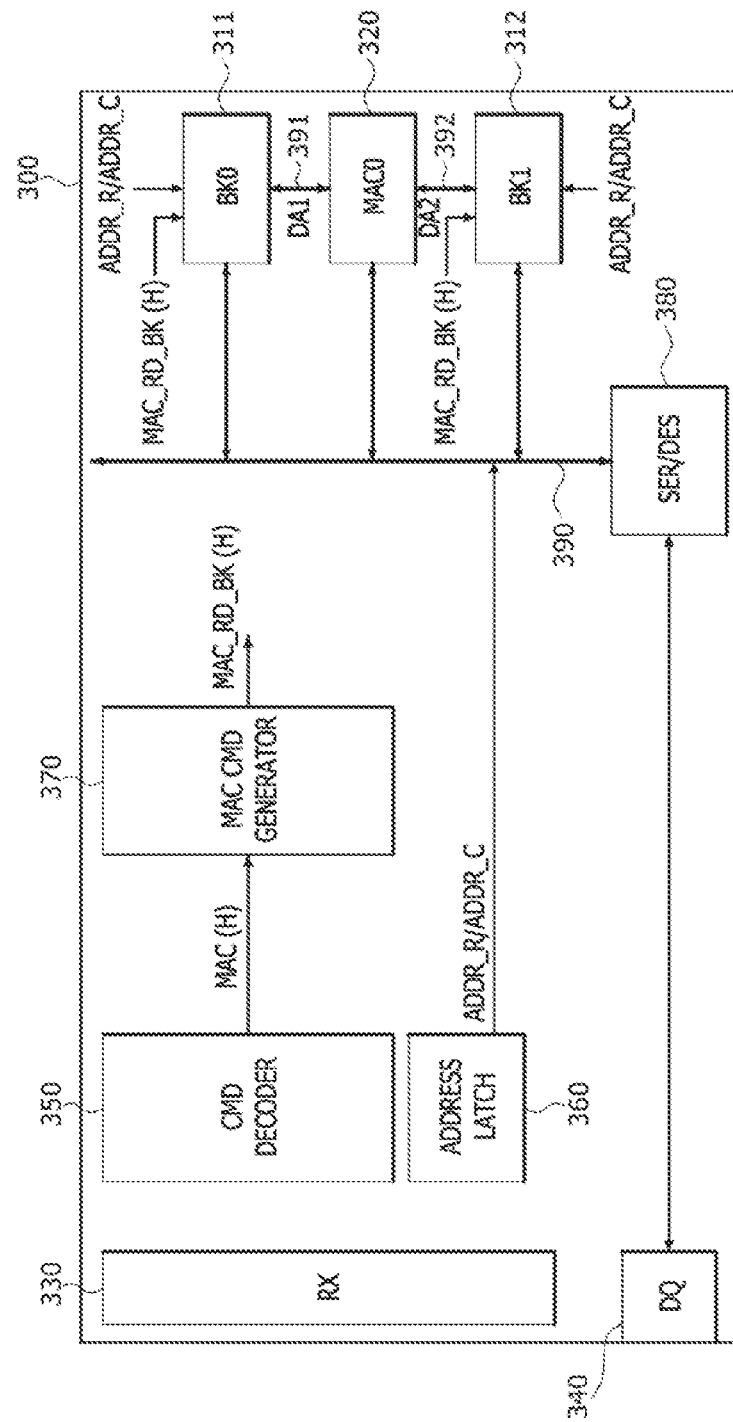

Next, referring to FIG. 22, the command decoder 350 may generate and output the MAC arithmetic signal MAC having a logic "high(H)" level to the MAC command generator 370. In response to the MAC arithmetic signal MAC having a logic "high(H)" level, the MAC command generator 370 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 311 and the second memory bank (BK1) 312. The first data DA1 may be read out of the first memory bank (BK0) 311 by the MAC read signal MAC_RD_BK having a logic "high(H)" level and may be transmitted to the first MAC operator (MAC0) 320 through the first BIO line 391. In addition, the second data DA2 may be read out of the second memory bank (BK1) 312 by the MAC read signal MAC_RD_BK having a logic "high(H)" level and may be transmitted to the first MAC operator (MAC0) 320 through the second BIO line 392.

Figure 23:
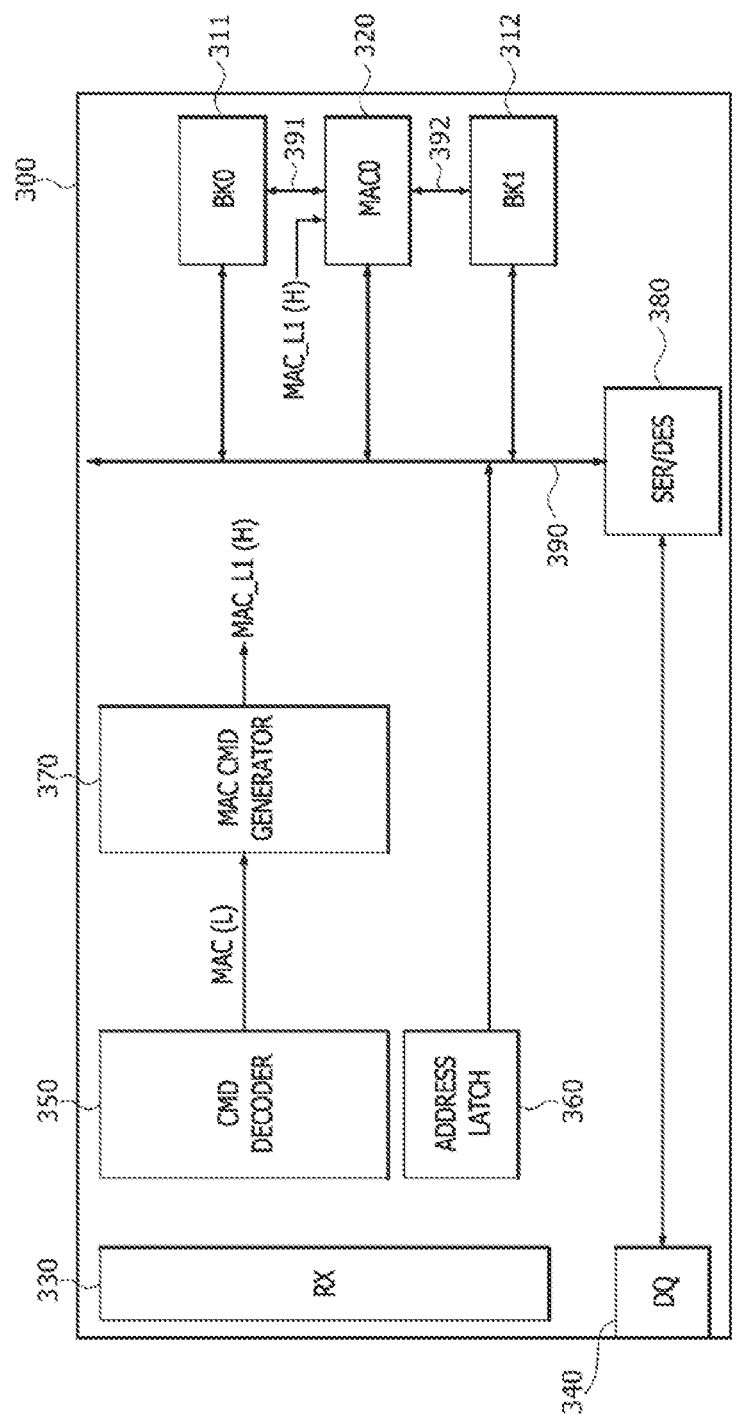

Next, referring to FIG. 23, a logic level of the MAC arithmetic signal MAC outputted from the command decoder 350 may change from a logic "high(H)" level into a logic "low(L)" level at a point in time when the first delay time DELAY_T1 determined by the first delay circuit (372 of FIG. 18) elapses from a point in time when the MAC read signal MAC_RD_BK is outputted from the MAC command generator 370. The MAC command generator 370 may generate and output the MAC input latch signal MAC_L1 having a logic "high(H)" level in response to the MAC arithmetic signal MAC having a logic "low(L)" level. The MAC input latch signal MAC_L1 having a logic "high(H)" level may be transmitted to the first MAC operator (MAC0) 320. The first MAC operator (MAC0) 320 may be synchronized with the MAC input latch signal MAC_L1 having a logic "high(H)" level to perform a latch operation of the first and second data DA1 and DA2 outputted from the first and second memory banks (BK0 and BK1) 311 and 312. If the latch operation of the first and second data DA1 and DA2 terminates, the first MAC operator (MAC0) 320 may perform the MAC arithmetic operation and may generate the MAC result data DA_MAC. The MAC result data DA_MAC generated by the first MAC operator (MAC0) 320 may be inputted to the output latch (223-1 of FIG. 20) included in the first MAC operator (MAC0) 320.

Figure 24:
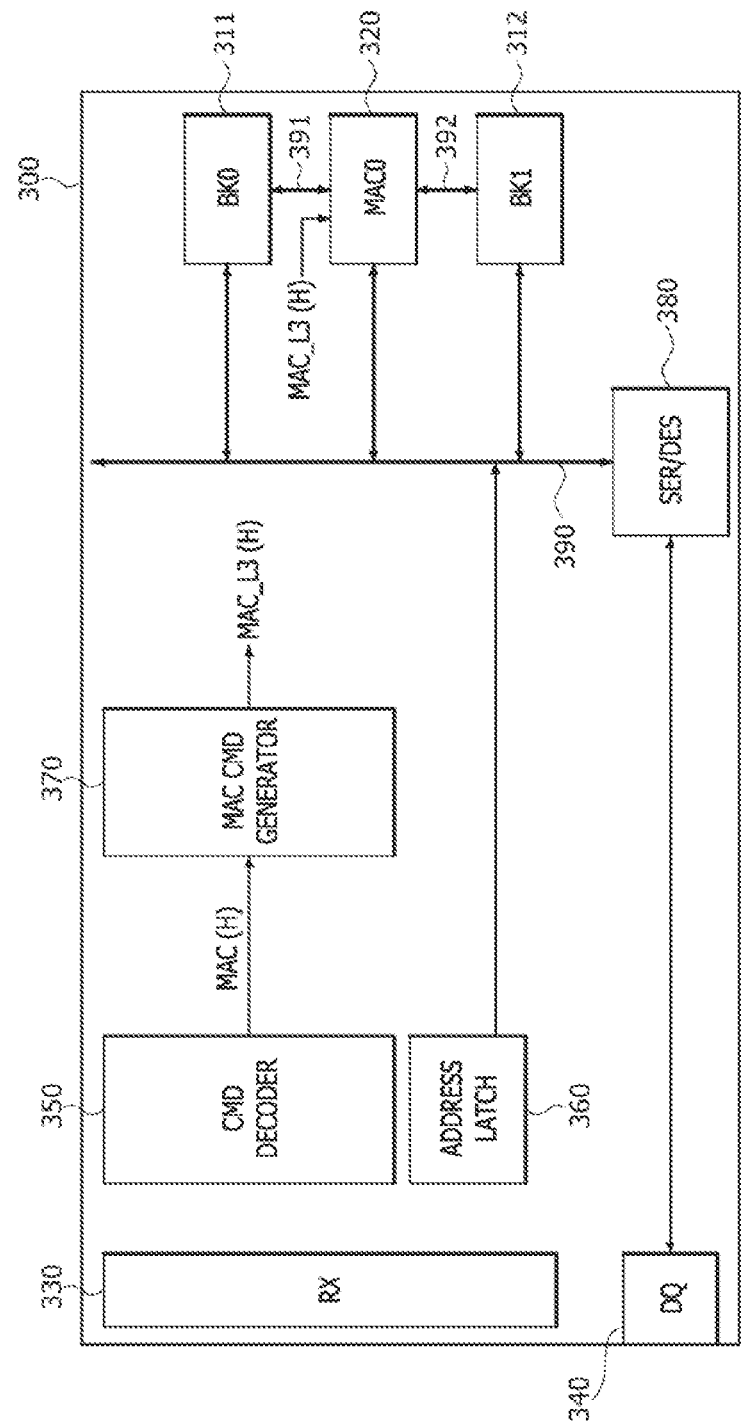

Next, referring to FIG. 24, a logic level of the MAC arithmetic signal MAC outputted from the command decoder 350 may change from a logic "low(L)" level into a logic "high(H)" level at a point in time when the second delay time DELAY_T2 determined by the second delay circuit (373 of FIG. 18) elapses from a point in time when the MAC input latch signal MAC_L1 having a logic "high (H)" level is outputted from the MAC command generator 370. The MAC command generator 370 may generate and output the MAC output latch signal MAC_L3 having a logic "high(H)" level in response to the MAC arithmetic signal MAC having a logic "high(H)" level. The MAC output latch signal MAC_L3 having a logic "high(H)" level may be transmitted to the first MAC operator (MAC0) 320. The output latch (223-1 of FIG. 20) included in the first MAC operator (MAC0) 320 may be synchronized with the MAC output latch signal MAC_L3 having a logic "high(H)" level to transfer the MAC result data DA_MAC generated by the MAC circuit (222 of FIG. 20) to the transfer gate (223-2 of FIG. 20) included in the first MAC operator (MAC0) 320. The MAC result data DA_MAC outputted from the output latch (223-1 of FIG. 20) may be fed back to the addition logic circuit (222-2 of FIG. 20) for the accumulative adding calculation executed by the MAC circuit (222 of FIG. 20).

Figure 25:
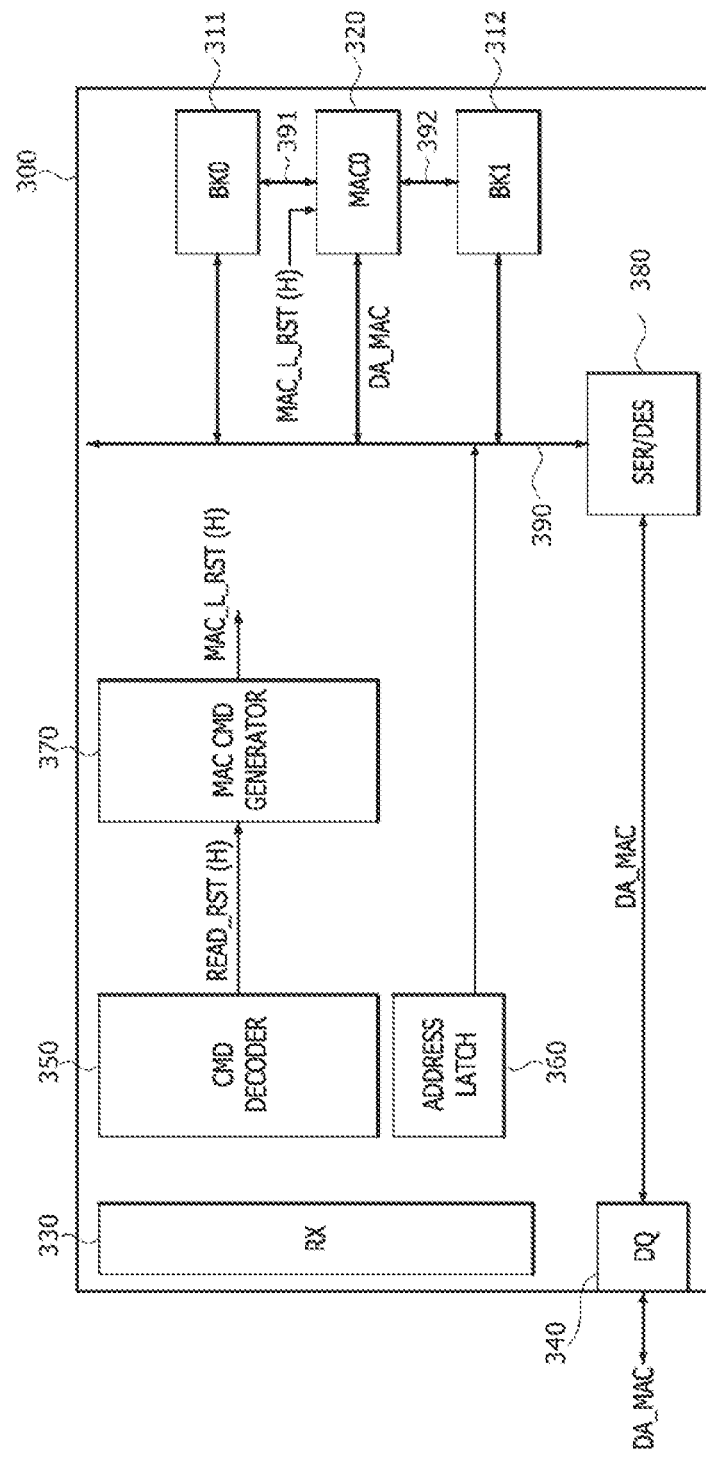

Next, referring to FIG. 25, the command decoder 350 may output and transmit the result read signal READ_RST having a logic "high(H)" level to the MAC command generator 370. The MAC command generator 370 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 320. As described with reference to FIG. 20, the first MAC operator (MAC0) 320 may output the MAC result data DA_MAC to the GIO line 390 in response to the MAC result latch signal MAC_L_RST having a logic "high" level and may also reset the output latch (223-1 of FIG. 20) included in the first MAC operator (MAC0) 320 in response to the MAC result latch signal MAC_L_RST having a logic "high" level. The MAC result data DA_MAC transmitted to the GIO line 390 may be outputted to an external device through the serializer/deserializer 380 and the data I/O line 340. Although not shown in the drawings, the MAC result data DA_MAC outputted from the first MAC operator (MAC0) 320 may be written into the first memory bank (BK0) 311 through the first BIO line 391 without using the GIO line 390 or may be written into the second memory bank (BK1) 312 through the second BIO line 392 without using the GIO line 390.

Figure 26:
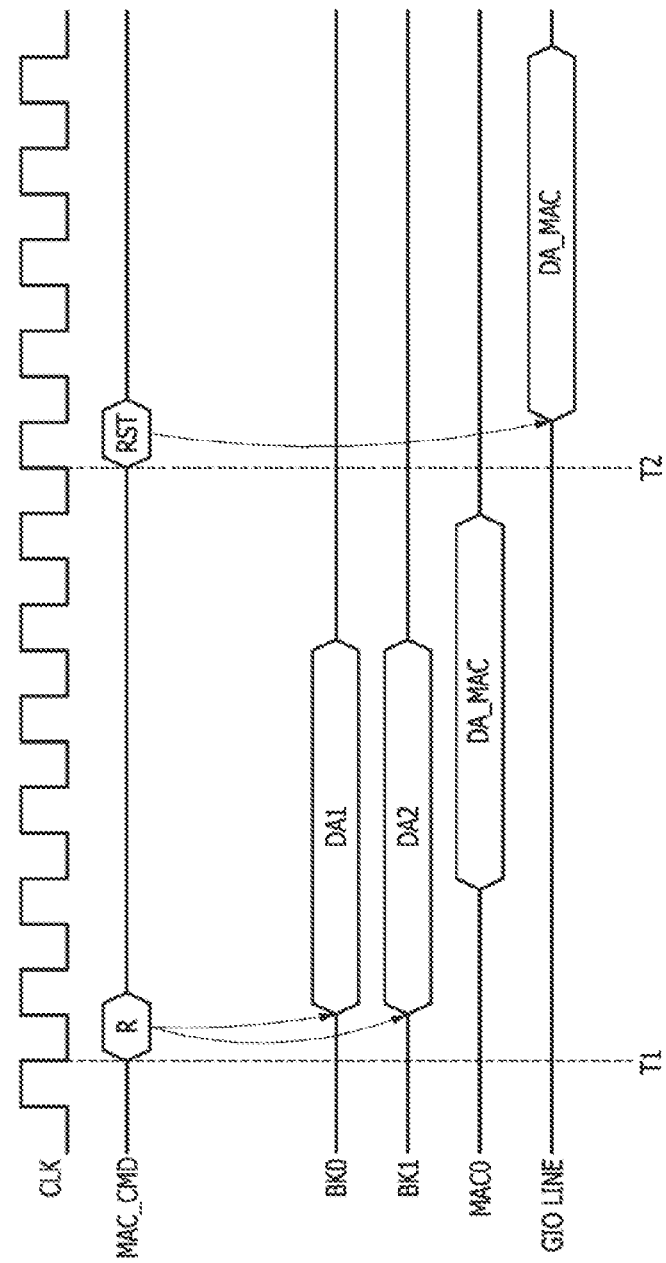
FIG. 26 is a timing diagram an operation of the PIM device illustrated in FIG. 16.

FIG. 26 is a timing diagram illustrating an operation of the PIM device 300 illustrated in FIG. 16. Referring to FIG. 26, at a first point in time "T1", the MAC command generator 370 may be synchronized with a falling edge of a clock signal CLK to generate and output the MAC read signal MAC_RD_BK (R) having a logic "high(H)" level. The first and second memory banks (BK0 and BK1) 311 and 312 may be selected by the MAC read signal MAC_RD_BK (R) having a logic "high(H)" level so that the first data DA1 and the second data DA2 are read out of the first and second memory banks (BK0 and BK1) 311 and 312. If a certain time elapses from a point in time when first data DA1 and the second data DA2 are read out, the first MAC operator (MAC0) 320 may perform the MAC arithmetic operation of the first and second data DA1 and DA2 to generate the MAC result data DA_MAC. At a second point in time "T2", the MAC command generator 370 may be synchronized with a falling edge of the clock signal CLK to generate and output the MAC result latch signal MAC_L_RST (RST) having a logic "high" level. The MAC result data DA_MAC may be transmitted to the GIO line 390 by the MAC result latch signal MAC_L_RST (RST) having a logic "high" level.

Figure 27:
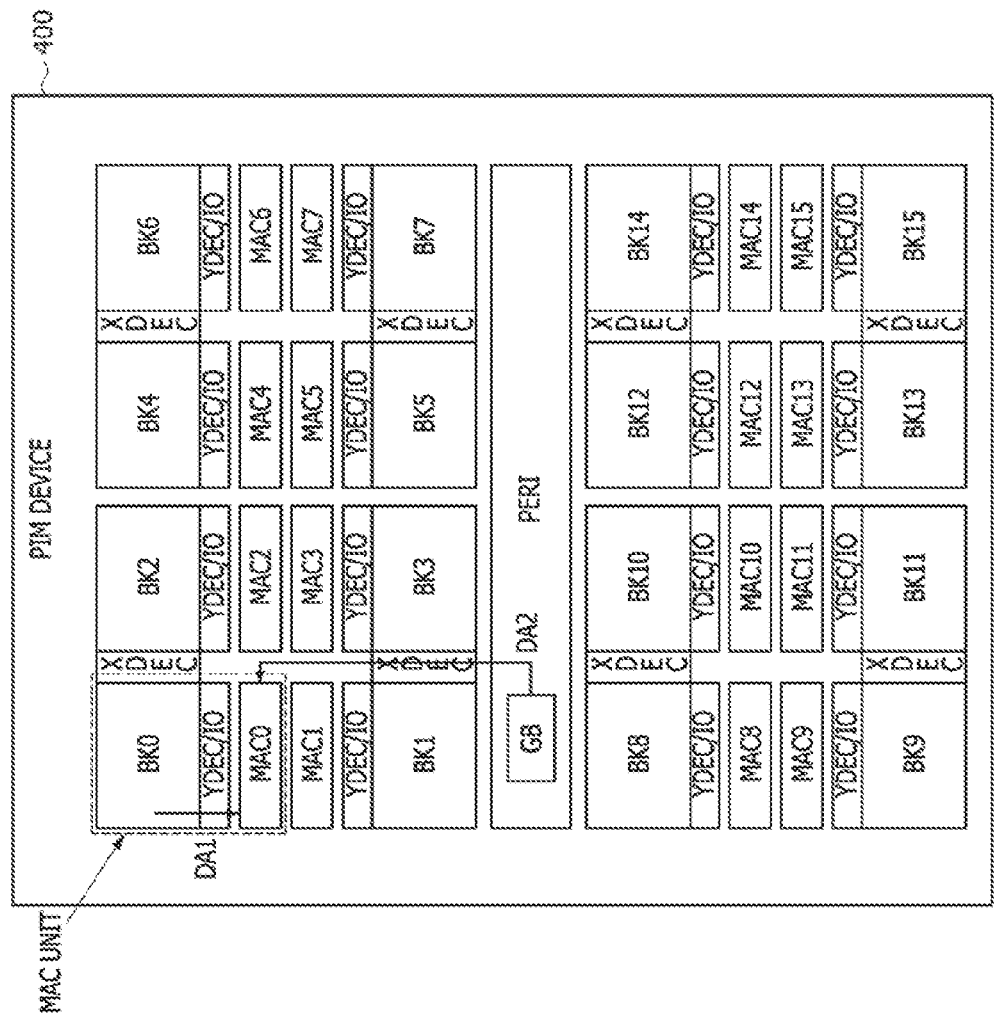
FIG. 27 is a schematic diagram illustrating an arrangement of memory banks and multiplication/accumulation (MAC) operators included in a PIM device according to a second embodiment of the present disclosure.

FIG. 27 illustrates a disposal structure indicating placement of memory banks and MAC operators included in a PIM device 400 according to another embodiment of the present disclosure. Referring to FIG. 27, the PIM device 400 may include memory devices such as a plurality of memory banks (e.g., first to sixteenth memory banks BK0, . . . , and BK15), processing devices such as a plurality of MAC operators (e.g., first to sixteenth MAC operators MAC0, . . . , and MAC15), and a global buffer GB. A core circuit may be disposed to be adjacent to the memory banks BK0, . . . , and BK15. The core circuit may include X-decoders XDECs and Y-decoders/IO circuits YDEC/IOs. The memory banks BK0, . . . , and BK15 and the core circuit may have the same configuration as described with reference to FIG. 2. Thus, descriptions of the memory banks BK0, . . . , and BK15 and the core circuit will be omitted hereinafter. The MAC operators MAC0, . . . , and MAC15 may be disposed to be allocated to the memory banks BK0, . . . , and BK15, respectively. That is, in the PIM device 400, two or more memory banks do not share one MAC operator with each other. Thus, the number of the MAC operators MAC0, . . . , and MAC15 included in the PIM device 400 may be equal to the number of the memory banks BK0, . . . , and BK15 included in the PIM device 400. One of the memory banks BK0, . . . , and BK15 together with one of the MAC operators MAC0, . . . , and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC arithmetic operation from the respective memory bank.

The PIM device 400 may further include a peripheral circuit PERI. The peripheral circuit PERI may be disposed in a region other than an area in which the memory banks BK0, BK1, . . . , and BK15; the MAC operators MAC0, . . . , and MAC15; and the core circuit are disposed. The peripheral circuit PERI may be configured to include a control circuit relating to a command/address signal, a control circuit relating to input/output of data, and a power supply circuit. The peripheral circuit PERI of the PIM device 400 may have substantially the same configuration as the peripheral circuit PERI of the PIM device 100 illustrated in FIG. 2. A difference between the peripheral circuit PERI of the PIM device 400 and the peripheral circuit PERI of the PIM device 100 is that the global buffer GB is disposed in the peripheral circuit PERI of the PIM device 400. The global buffer GB may receive second data DA2 to be used for the MAC operation from an external device and may store the second data DA2. The global buffer GB may output the second data DA2 to each of the MAC operators MAC0, . . . , and MAC15 through a GIO line. In the event that the PIM device 400 performs neural network calculation, for example, an arithmetic operation in a deep learning process, the first data DA1 may be weight data and the second data DA2 may be vector data.

The PIM device 400 according to the present embodiment may operate in a memory mode or a MAC arithmetic mode. In the memory mode, the PIM device 400 may operate to perform the same operations as general memory devices. The memory mode may include a memory read operation mode and a memory write operation mode. In the memory read operation mode, the PIM device 400 may perform a read operation for reading out data from the memory banks BK0, BK1, . . . , and BK15 to output the read data, in response to an external request. In the memory write operation mode, the PIM device 400 may perform a write operation for storing data provided by an external device into the memory banks BK0, BK1, . . . , and BK15, in response to an external request. In the MAC arithmetic mode, the PIM device 400 may perform the MAC arithmetic operation using the MAC operators MAC0, . . . , and MAC15. In the PIM device 400, the MAC arithmetic operation may be performed in a deterministic way, and the deterministic MAC arithmetic operation of the PIM device 400 will be described more fully hereinafter. Specifically, the PIM device 400 may perform the read operation of the first data DA1 for each of the memory banks BK0, . . . , and BK15 and the read operation of the second data DA2 for the global buffer GB, for the MAC arithmetic operation in the MAC arithmetic mode. In addition, each of the MAC operators MAC0, . . . , and MAC15 may perform the MAC arithmetic operation of the first data DA1 and the second data DA2 to store a result of the MAC arithmetic operation into the memory bank or to output the result of the MAC arithmetic operation to an external device. In some cases, the PIM device 400 may perform a data write operation for storing data to be used for the MAC arithmetic operation into the memory banks before the data read operation for the MAC arithmetic operation is performed in the MAC arithmetic mode.

The operation mode of the PIM device 400 according to the present embodiment may be determined by a command which is transmitted from a host or a controller to the PIM device 400. In an embodiment, if a first external command requesting a read operation or a write operation for the memory banks BK0, BK1, . . . , and BK15 is transmitted from the host or the controller to the PIM device 400, the PIM device 400 may perform the data read operation or the data write operation in the memory mode. Alternatively, if a second external command requesting the MAC arithmetic operation is transmitted from the host or the controller to the PIM device 400, the PIM device 400 may perform the data read operation and the MAC arithmetic operation.

The PIM device 400 may perform the deterministic MAC arithmetic operation. Thus, the host or the controller may always predict a point in time (or a clock) when the MAC arithmetic operation terminates in the PIM device 400 from a point in time when an external command requesting the MAC arithmetic operation is transmitted from the host or the controller to the PIM device 400. Because the timing is predictable, no operation for informing the host or the controller of a status of the MAC arithmetic operation is required while the PIM device 400 performs the deterministic MAC arithmetic operation. In an embodiment, a latency during which the MAC arithmetic operation is performed in the PIM device 400 may be set to a fixed value for the deterministic MAC arithmetic operation.

Figure 28:
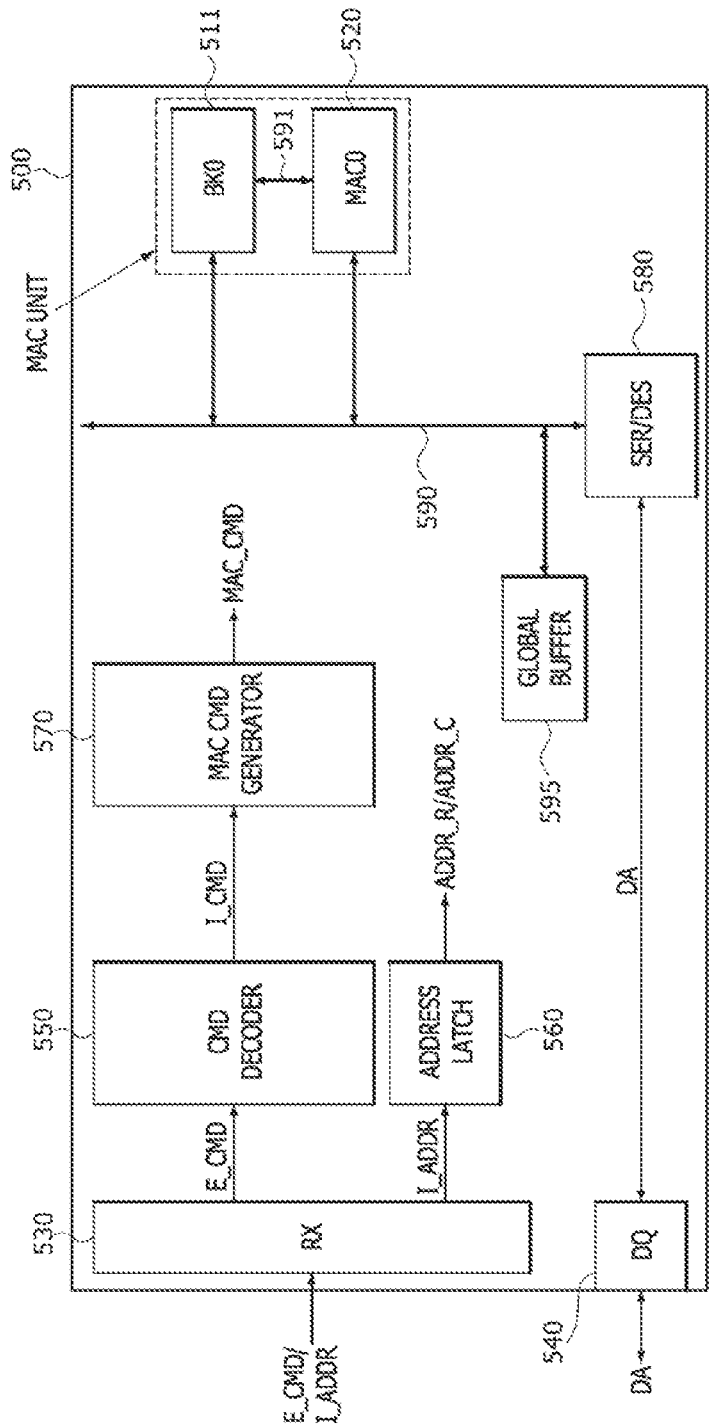
FIG. 28 is a block diagram illustrating a configuration of a PIM device according to the second embodiment of the present disclosure.

FIG. 28 is a block diagram illustrating an example of a detailed configuration of a PIM device 500 corresponding to the PIM device 400 illustrated in FIG. 27. FIG. 28 illustrates only a first memory bank (BK0) 511 and a first MAC operator (MAC0) 520 constituting a first MAC unit among a plurality of MAC units. However, FIG. 28 illustrates merely an example for simplification of the drawing. Accordingly, the following description for the first MAC unit may be equally applicable to the remaining MAC units. Referring to FIG. 28, the PIM device 500 may be configured to include the first memory bank (BK0) 511 and the first MAC operator (MAC0) 520 constituting the first MAC unit as well as a global buffer 595. The PIM device 500 may further include a GIO line 590 and a BIO line 591 used as data transmission lines. The first memory bank (BK0) 511 and the first MAC operator (MAC0) 520 may communicate with the global buffer 595 through the GIO line 590. Only the data transmission between the first memory bank (BK0) 511 and the first MAC operator (MAC0) 520 may be achieved through the BIO line 591. The BIO line 591 is dedicated specifically for data transmission between the first memory bank (BK0) 511 and the first MAC operator (MAC0) 520. Thus, the first MAC operator (MAC0) 520 may receive the first data DA1 to be used for the MAC arithmetic operation from the first memory bank (BK0) 511 through the BIO line 591 and may receive the second data DA2 to be used for the MAC arithmetic operation from the global buffer 595 through the GIO line 590.

The PIM device 500 may include a receiving driver (RX) 530, a data I/O circuit (DQ) 540, a command decoder 550, an address latch 560, a MAC command generator 570, and a serializer/deserializer (SER/DES) 580. The command decoder 550, the address latch 560, the MAC command generator 570, and the serializer/deserializer 580 may be disposed in the peripheral circuit PERI of the PIM device 400 illustrated in FIG. 27. The receiving driver 530 may receive an external command E_CMD and an input address I_ADDR from an external device. The external device may denote a host or a controller coupled to the PIM device 500. Hereinafter, it may be assumed that the external command E_CMD transmitted to the PIM device 500 is a command requesting the MAC arithmetic operation. That is, the PIM device 500 may perform the deterministic MAC arithmetic operation in response to the external command E_CMD. The data I/O circuit 540 may provide a means through which the PIM device 500 communicates with the external device.

The receiving driver 530 may separately output the external command E_CMD and the input address I_ADDR received from the external device. Data DA inputted to the PIM device 500 through the data I/O circuit 540 may be processed by the serializer/deserializer 580 and may be transmitted to the first memory bank (BK0) 511 and the global buffer 595 through the GIO line 590 of the PIM device 500. The data DA outputted from the first memory bank (BK0) 511 and the first MAC operator (MAC0) 520 through the GIO line 590 may be processed by the serializer/deserializer 580 and may be outputted to the external device through the data I/O circuit 540. The serializer/deserializer 580 may convert the data DA into parallel data if the data DA are serial data or may convert the data DA into serial data if the data DA are parallel data. For the data conversion, the serializer/deserializer 580 may include a serializer converting parallel data into serial data and a deserializer converting serial data into parallel data.

The command decoder 550 may decode the external command E_CMD outputted from the receiving driver 530 to generate and output the internal command signal I_CMD. The internal command signal I_CMD outputted from the command decoder 550 may be the same as the internal command signal I_CMD described with reference to FIG. 17. That is, the internal command signal I_CMD may include a first internal command signal corresponding to the memory active signal ACT_M, a second internal command signal corresponding to the MAC arithmetic signal MAC, and a third internal command signal corresponding to the result read signal READ_RST. The first to third internal command signals outputted from the command decoder 550 may be sequentially inputted to the MAC command generator 570. As described with reference to FIG. 17, the memory active signal ACT_M, the MAC arithmetic signal MAC, and the result read signal READ_RST outputted from the command decoder 550 may be sequentially generated at predetermined points in time (or clocks) in order to perform the deterministic MAC arithmetic operation of the PIM device 500. Thus, the host or the controller outputting the external command E_CMD may predict the points in time when the first to third internal command signals constituting the internal command signal I_CMD are generated by the command decoder 550 in advance at a point in time when the external command E_CMD is outputted from the host or the controller. That is, the host or the controller may predict a point in time (or a clock) when the MAC arithmetic operation terminates in the PIM device 500 after the external command E_CMD requesting the MAC arithmetic operation is transmitted from the host or the controller to the PIM device 500, even without receiving any signals from the PIM device 500.

The address latch 560 may convert the input address I_ADDR outputted from the receiving driver 530 into a row/column address ADDR_R/ADDR_C to output the row/column address ADDR_R/ADDR_C. The row/column address ADDR_R/ADDR_C outputted from the address latch 560 may be transmitted to the first memory bank (BK0) 511. According to the present embodiment, the first data and the second data to be used for the MAC arithmetic operation may be simultaneously read out of the first memory bank (BK0) 511 and the global buffer 595, respectively. Thus, it may be unnecessary to generate a bank selection signal for selecting the first memory bank 511. A point in time when the row/column address ADDR_R/ADDR_C is inputted to the first memory bank 511 may be a point in time when a MAC command (i.e., the MAC arithmetic signal MAC) requesting a data read operation for the first memory bank 511 for the MAC arithmetic operation is generated.

The MAC command generator 570 may output the MAC command signal MAC_CMD in response to the internal command signal I_CMD outputted from the command decoder 550. The MAC command signal MAC_CMD outputted from the MAC command generator 570 may be the same as the MAC command signal MAC_CMD described with reference to FIG. 17. That is, the MAC command signal MAC_CMD outputted from the MAC command generator 570 may include the MAC active signal RACTV corresponding to the first MAC command signal, the MAC read signal MAC_RD_BK corresponding to the second MAC command signal, the MAC input latch signal MAC_L1 corresponding to the third MAC command signal, the MAC output latch signal MAC_L3 corresponding to the fourth MAC command signal, and the MAC result latch signal MAC_L_RST corresponding to the fifth MAC command signal.

The MAC active signal RACTV may be generated based on the memory active signal ACT_M outputted from the command decoder 550. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 550. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 550.

The MAC active signal RACTV outputted from the MAC command generator 570 may control an activation operation for the first memory bank 511. The MAC read signal MAC_RD_BK outputted from the MAC command generator 570 may control a data read operation for the first memory bank 511 and the global buffer 595. The MAC input latch signal MAC_L1 outputted from the MAC command generator 570 may control an input data latch operation of the first MAC operator (MAC0) 520. The MAC output latch signal MAC_L3 outputted from the MAC command generator 570 may control an output data latch operation of the first MAC operator (MAC0) 520. The MAC result latch signal MAC_L_RST outputted from the MAC command generator 570 may control an output operation of MAC result data of the first MAC operator (MAC0) 520 and a reset operation of the first MAC operator (MAC0) 520.

As described above, in order to perform the deterministic MAC arithmetic operation of the PIM device 500, the memory active signal ACT_M, the MAC arithmetic signal MAC, and the result read signal READ_RST outputted from the command decoder 550 may be sequentially generated at predetermined points in time (or clocks), respectively. Thus, the MAC active signal RACTV, the MAC read signal MAC_RD_BK, the MAC input latch signal MAC_1, the MAC output latch signal MAC_L3, and the MAC result latch signal MAC_L_RST may also be generated and outputted from the MAC command generator 570 at predetermined points in time after the external command E_CMD is inputted to the PIM device 500, respectively. That is, a time period from a point in time when the first and second memory banks 511 is activated by the MAC active signal RACTV until a point in time when the first MAC operator (MAC0) 520 is reset by the MAC result latch signal MAC_L_RST may be predetermined.

The MAC command generator 570 of the PIM device 500 according to the present embodiment may have the same configuration as described with reference to FIG. 18. In addition, the input signals and the output signals of the MAC command generator 570 may be inputted to and outputted from the MAC command generator 570 at the same points in time as described with reference to FIG. 19. As described with reference to FIGS. 18 and 19, the MAC command generator 570 may sequentially receive the memory active signal ACT_M, the MAC arithmetic signal MAC, and the result read signal READ_RST from the command decoder 550. In addition, the MAC command generator 570 may sequentially generate and output the MAC active signal RACTV, the MAC read signal MAC_RD_BK, the MAC input latch signal MAC_1, the MAC output latch signal MAC_L3, and the MAC result latch signal MAC_L_RST. The MAC active signal RACTV, the MAC read signal MAC_RD_BK, the MAC input latch signal MAC_1, the MAC output latch signal MAC_L3, and the MAC result latch signal MAC_L_RST may be outputted from the MAC command generator 570 in series with certain time intervals.

The MAC command generator 570 may generate and output the MAC active signal RACTV in response to the memory active signal ACT_M outputted from the command decoder 550. Subsequently, the MAC command generator 570 may generate and output the MAC read signal MAC_RD_BK in response to the MAC arithmetic signal MAC outputted from the command decoder 550. The MAC command generator 570 may delay the MAC arithmetic signal MAC by a certain time determined by the first delay circuit (372 of FIG. 18) to generate and output the MAC input latch signal MAC_L1. The MAC command generator 570 may delay the MAC input latch signal MAC_L1 by a certain time determined by the second delay circuit (373 of FIG. 18) to generate and output the MAC output latch signal MAC_L3. Subsequently, the MAC command generator 570 may generate and output the MAC result latch signal MAC_L_RST in response to the result read signal READ_RST outputted from the command decoder 550.

Figure 29:
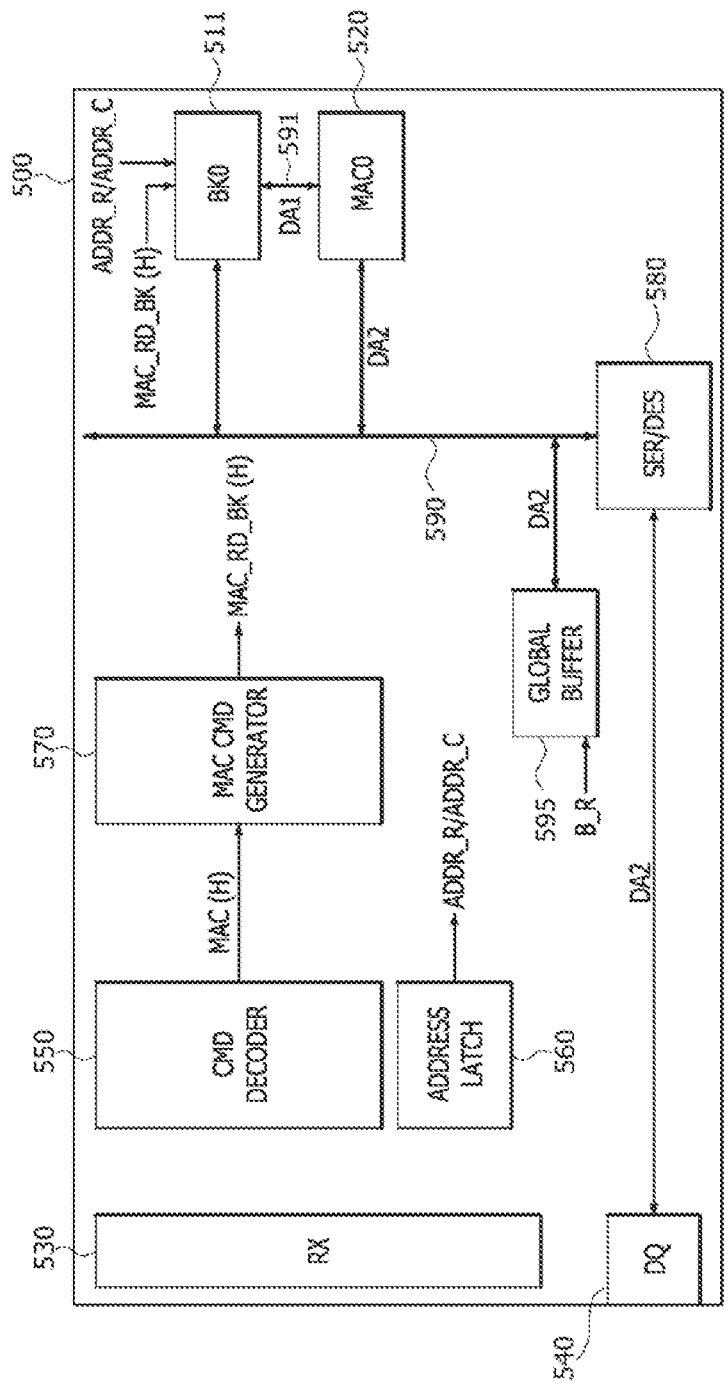
FIG. 29 is a block diagram illustrating an operation of the PIM device illustrated in FIG. 28.

FIG. 29 is a block diagram illustrating an operation of the PIM device 500 illustrated in FIG. 28. In FIG. 29, the same reference numerals or the same reference symbols as used in FIG. 16 denote the same elements. The operation of the PIM device 500 according to the present embodiment may be similar to the operation of the PIM device 300 described with reference to FIG. 16 except a transmission process of the first and second data DA1 and DA2 inputted to the first MAC operator (MAC0) 520. Thus, the operation of the PIM device 500 executed before the first and second data DA1 and DA2 are transmitted to the first MAC operator (MAC0) 520 may be the same as the operation of the PIM device 300 described with reference to FIG. 21. As illustrated in FIG. 29, when the MAC arithmetic signal MAC having a logic "high(H)" level is transmitted from the command decoder 550 to the MAC command generator 570, the MAC command generator 570 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 511. In such a case, a global buffer read signal B_R may also be transmitted to the global buffer 595. The first data DA1 may be read out of the first memory bank (BK0) 511 by the MAC read signal MAC_RD_BK having a logic "high(H)" level and may be transmitted to the first MAC operator (MAC0) 520 through the BIO line 591. In addition, the second data DA2 may be read out of the global buffer 595 by the global buffer read signal B_R and may be transmitted to the first MAC operator (MAC0) 520 through the GIO line 590. The operation of the PIM device 500 executed after the first and second data DA1 and DA2 are transmitted to the first MAC operator (MAC0) 520 may be the same as the operation of the PIM device 300 described with reference to FIGS. 23 to 25.

Figure 30:
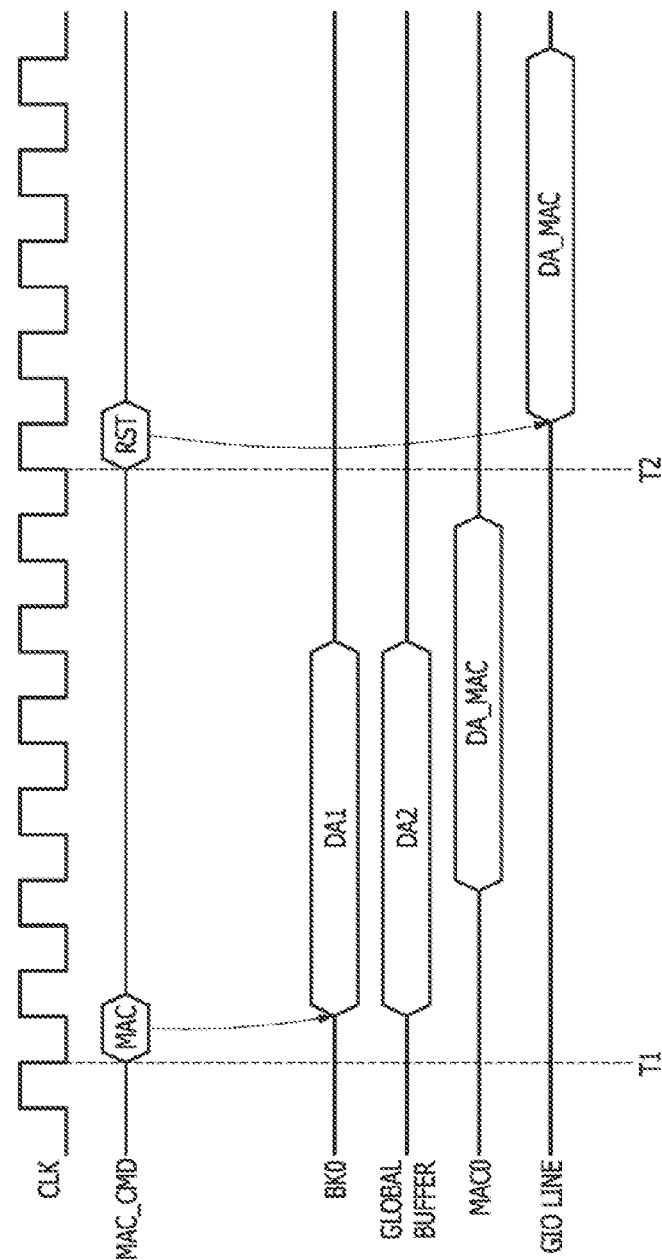
FIG. 30 is a timing diagram illustrating an operation of the PIM device illustrated in FIG. 28.

FIG. 30 is a timing diagram illustrating an operation of the PIM device 500 illustrate in FIG. 28. Referring to FIG. 30, at a first point in time "T1", the MAC command generator 570 may be synchronized with a falling edge of a clock signal CLK to generate and output the MAC read signal MAC_RD_BK (R) having a logic "high(H)" level. The first memory bank (BK0) 511 may be selected by the MAC read signal MAC_RD_BK (R) having a logic "high(H)" level so that the first data DA1 are read out of the first memory bank (BK0) 511. In addition, the second data DA2 may be read out of the global buffer 595. If a certain time elapses from a point in time when the first and second data DA1 and DA2 are read out of the first memory bank (BK0) 511 and the global buffer 595, the first MAC operator (MAC0) 520 may perform the MAC arithmetic operation of the first and second data DA1 and DA2 to generate the MAC result data DA_MAC. At a second point in time "T2", the MAC command generator 570 may be synchronized with a falling edge of the clock signal CLK to generate and output the MAC result latch signal MAC_L_RST (RST). The MAC result data DA_MAC may be transmitted to an external device through the GIO line 590 or to the first memory bank (BK0) 511 through the BIO line 591, by the MAC result latch signal MAC_L_RST (RST).

Figure 31:
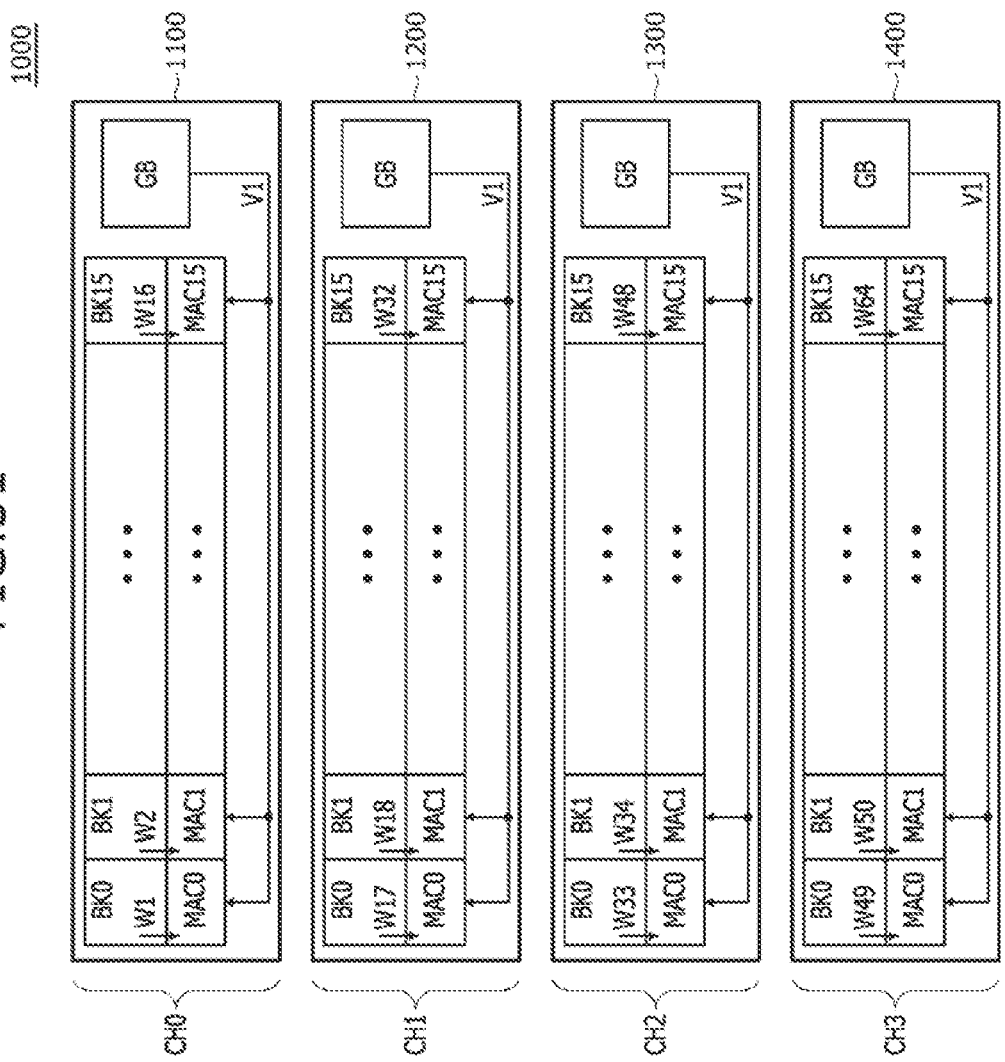
FIG. 31 illustrates a configuration of a PIM device according to an embodiment of the present disclosure.

FIG. 31 is a block diagram illustrating a configuration of a PIM device 1000 according to an embodiment of the present disclosure. Referring to FIG. 31, the PIM device 1000 may have four channels (i.e., first to fourth channels CH0, CH1, CH2, and CH3). Although the present embodiment illustrates a case that the number of channels included in the PIM device 1000 is four, the present embodiment may be merely an example of the present disclosure. Thus, the number of channels included in the PIM device 1000 may be less or greater than four in some other embodiments. The channels CH0, . . . , and CH3 may be coupled to channel PIM regions (e.g., first to fourth channel PIM regions 1100, 1200, 1300, and 1400), respectively. The first channel CH0 may be coupled to the first channel PIM region 1100 to provide an independent interfacing means, and the second channel CH1 may be coupled to the second channel PIM region 1200 to provide an independent interfacing means. Similarly, the third channel CH2 may be coupled to the third channel PIM region 1300 to provide an independent interfacing means, and the fourth channel CH3 may be coupled to the fourth channel PIM region 1400 to provide an independent interfacing means. Hereinafter, the term 'channel' may be regarded as having the same meaning as the term 'channel PIM region' related thereto.

Each of the first to fourth channel PIM regions 1100~1400 (i.e., 1100, 1200, 1300, and 1400) may include a plurality of memory banks, a plurality of MAC operators, and a global buffer GB. Hereinafter, it may be assumed that each of the first to fourth channel PIM regions 1100~1400 includes sixteen memory banks (i.e., first to sixteenth memory banks BK0~BK15) and sixteen MAC operators (i.e., first to sixteenth MAC operators MAC0~MAC15). In each of the first to fourth channel PIM regions 1100~1400, the first to sixteenth memory banks BK0~BK15 may be matched one-to-one with the first to sixteenth MAC operators MAC0~MAC15, respectively. That is, in each of the first to fourth channel PIM regions 1100~1400, the first memory bank BK0 may be matched with the first MAC operator MAC0, and the second memory bank BK1 may be matched with the second MAC operator MAC1. Similarly, the sixteenth memory bank BK15 may be matched with the sixteenth MAC operator MAC15.

In each of the channels CH0~CH3, each of the first to sixteenth MAC operators MAC0~MAC15 may receive weight data necessary for the MAC arithmetic operation from the memory bank matched therewith. Specifically, in the first channel CH0, the first to sixteenth MAC operators MAC0~MAC15 may receive first to sixteenth weight data W1~W16 from the first to sixteenth memory banks MAC0~MAC15, respectively. In addition, in the second channel CH1, the first to sixteenth MAC operators MAC0~MAC15 may receive $17^{th}$ to $32^{nd}$ weight data W17~W32 from the first to sixteenth memory banks MAC0~MAC15, respectively. Moreover, in the third channel CH2, the first to sixteenth MAC operators MAC0~MAC15 may receive $33^{rd}$ to $48^{th}$ weight data W33~W48 from the first to sixteenth memory banks MAC0~MAC15, respectively. Furthermore, in the fourth channel CH3, the first to sixteenth MAC operators MAC0~MAC15 may receive $49^{th}$ to $64^{th}$ weight data W49~W64 from the first to sixteenth memory banks MAC0~MAC15, respectively. In each of the channels CH0~CH3, transmitting the weight data from each of the memory banks to the corresponding MAC operator may be executed by a MAC read control signal and a column address.

In each of the channels CH0~CH3, the global buffer GB may supply vector data V1 necessary for the MAC arithmetic operation to each of the first to sixteenth MAC operators MAC0~MAC15. In the present embodiment, the global buffer GB may be disposed in each of the channels CH0~CH3. However, in some other embodiments, all of the channels CH0~CH3 may share one common global buffer with each other. In such a case, the one common global buffer may supply the vector data V1 to all of the MAC operators MAC0~MAC15 included in the channels CH0~CH3.

In each of the channels CH0~CH3, the sixteen weight data (e.g., W1~16, W17~W32, W33~W48, or W49~W64) transmitted from the memory banks BK0~BK15 to the MAC operators MAC0~MAC15 may have different values from each other. In contrast, in each of the channels CH0~CH3, the vector data V1 transmitted from the global buffer GB to all of the MAC operators MAC0~MAC15 may have the same value. That is, the global buffer GB may supply one set of the vector data V1 to all of the MAC operators MAC0~MAC15.

In each of the channels CH0~CH3, each of the MAC operators MAC0~MAC15 may perform the arithmetic operation of the weight data received from the corresponding memory bank and the vector data received from the global buffer GB. In each of the channels CH0~CH3, the first to sixteenth MAC operators MAC0~MAC15 may perform the MAC arithmetic operations in response to the same MAC command and address. In each of the channels CH0~CH3, The MAC arithmetic operations performed by the first to sixteenth MAC operators MAC0~MAC15 may be executed independently. In an embodiment, all of the MAC arithmetic operations performed by the MAC operators MAC0~MAC15 included in all of the channels CH0~CH3 may be simultaneously executed.

Figure 32:
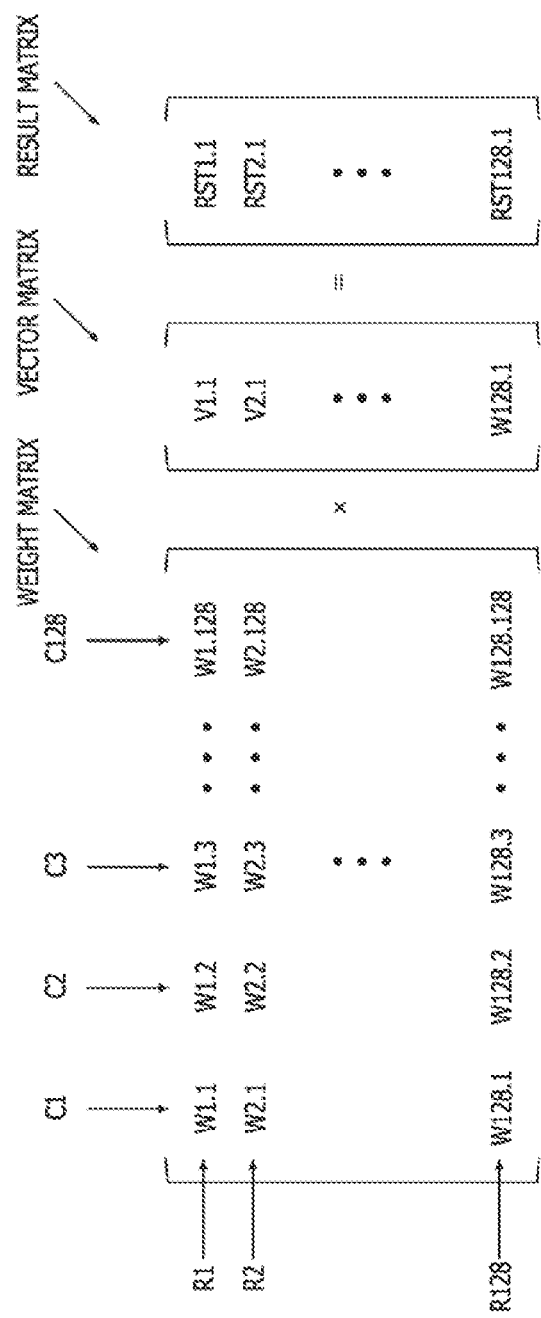
FIG. 32 illustrates a MAC arithmetic operation performed in the PIM device illustrated in FIG. 31.

FIG. 32 illustrates the MAC arithmetic operation performed in the PIM device 1000 illustrated in FIG. 31. Referring to FIG. 32, the PIM device 1000 may perform the MAC arithmetic operation that generates a result matrix which is obtained by performing a matrix multiplying calculation of a weight matrix and a vector matrix. The weight matrix may have 'M'-number of rows and 'N'-number of columns. Each of the vector matrix and the result matrix may have 'N'-number of rows and one column. The number 'M' of rows included in the weight matrix may be set to be different according to the embodiments, and it may be assumed that the number 'M' of rows included in the weight matrix is 128 in the following description. Similarly, the number 'N' of columns included in the weight matrix may also be set to be different according to the embodiments, and it may be assumed that the number 'N' of columns included in the weight matrix is 128 in the following description. Thus, the weight matrix may have 128 rows (i.e., first to $128^{th}$ rows R1~R128) and 128 columns (i.e., first to $128^{th}$ columns C1~C128) and may have '128×128'-number of elements W1.1~W128.128 corresponding to '128×128'-number of weight data.

All of the elements W1.1~W128.128 in the weight matrix may be stored into the memory banks BK0~BK15 of the channel PIM regions 1100~1400 included in the PIM device 1000. In such a case, performance of the MAC arithmetic operation of the PIM device 1000 may vary according to a way that all of the elements W1.1~W128.128 constituting the weight matrix are stored into the memory banks BK0~BK15. In the PIM device 1000, all of the elements W1.1~W128.128 constituting the weight matrix may be allocated to the channels CH0~CH3 and the memory banks BK0~BK15 in a way that parallelism is applicable to both the channels CH0~CH3 and the memory banks BK0~BK15. Thus, the performance of the MAC arithmetic operation may be improved as compared with a way in which the parallelism is applicable to only one of the channels and the memory banks.

Specifically, in the PIM device 1000, the weight data W1.1~W128.128 in the weight matrix may be stored into the memory banks in units of rows. All of the weight data arrayed in one of the first to $128^{th}$ rows R1~R128 included in the weight matrix may be stored into one of the banks. That is, the weight data arrayed in one of the rows of the weight matrix are not dispersedly stored into at least two memory banks and are not dispersedly stored into at least two memory banks either. In one of the channels, the weight data arrayed in 16 rows of the weight matrix may be sequentially stored from the first memory banks BK0 to the sixteenth memory bank BK15. This data storage way may be equally applicable to each of the remaining channels. The way of storing the data into the memory banks will be described in more detail hereinafter with reference to the drawings.

Figure 33:
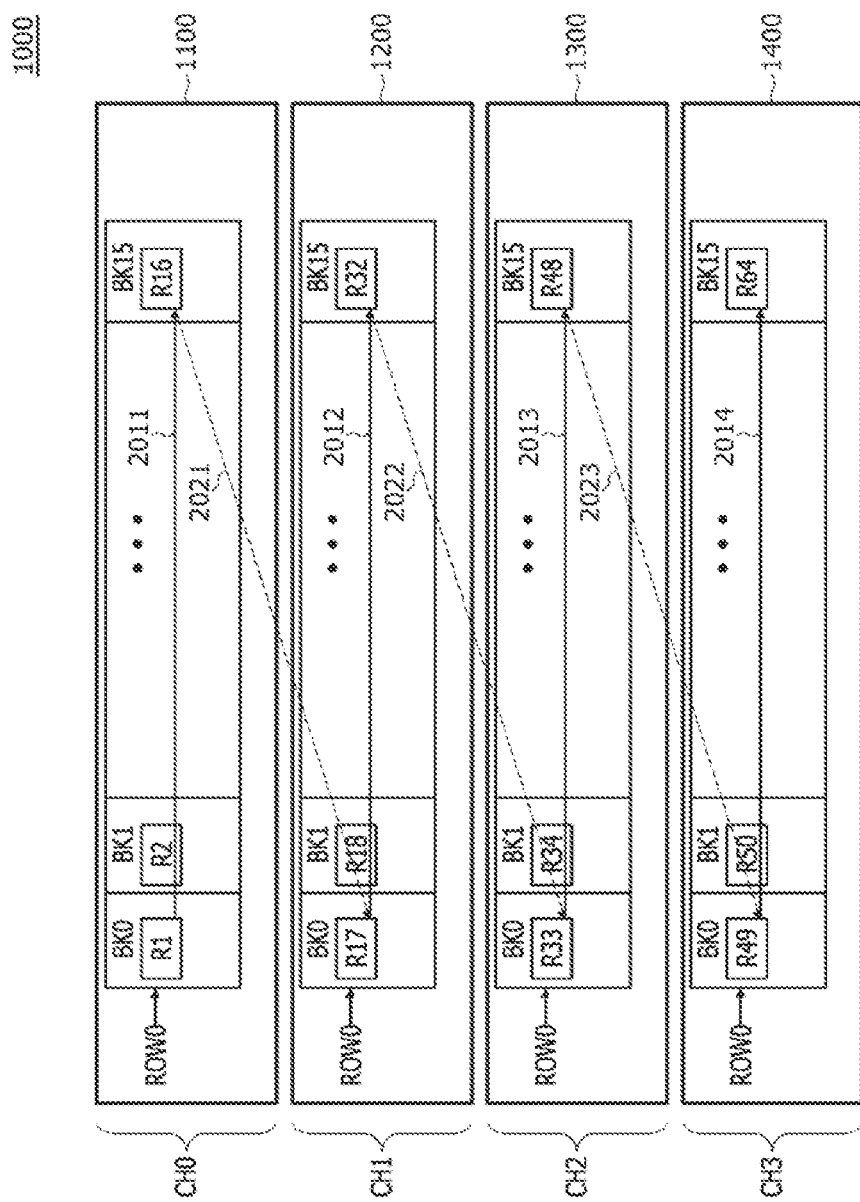
FIGS. 33 and 34 illustrate an example of a process for storing weight data of a weight matrix illustrated in FIG. 32 in the PIM device of FIG. 31.
Figure 34:
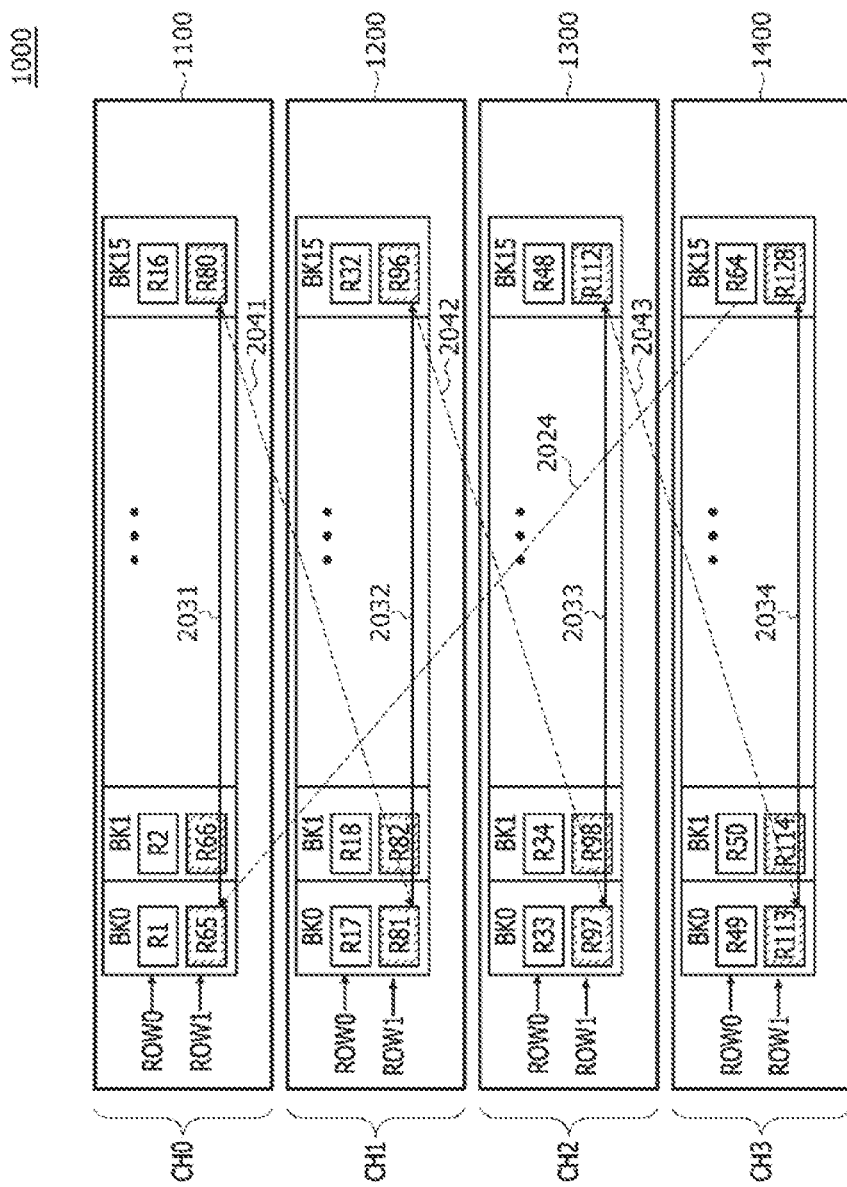

FIGS. 33 and 34 illustrate an example of a process for storing the weight data W1.1~W128.128 of the weight matrix illustrated in FIG. 32 into the memory banks BK0~BK15 included in the PIM device 1000 of FIG. 31. According to a data storage process proposed by the present embodiment, the weight data in one row of the weight matrix may be stored into one row of one of the memory banks included in one of the channels. Because the total number of the memory banks included in the first to fourth channels CH0~CH3 is 64, the weight data arrayed in 64 rows among the 128 rows of the weight matrix may be stored into first rows ROW0 of the 64 memory banks. Thus, the weight data arrayed in the first to $64^{th}$ rows of the weight matrix and the weight data arrayed in the $65^{th}$ to $128^{th}$ rows of the weight matrix may be stored into two different rows of the 64 memory banks, separately. For example, the weight data arrayed in the first to $64^{th}$ rows R1~R64 of the weight matrix may be stored in the first rows ROW0 of the 64 memory banks disposed in the first to fourth channels CH0~CH3, and the weight data arrayed in the $65^{th}$ to $128^{th}$ rows R65~R128 of the weight matrix may be stored in the second rows ROW1 of the 64 memory banks disposed in the first to fourth channels CH0~CH3. In each of the memory banks BK0~BK15, the first row ROW0 and the second row ROW1 may be located to be adjacent to each other and may be respectively selected by a first row address and a second row address.

First, referring to FIG. 33, the weight data arrayed in the first to sixteenth rows R1~R16 among the first to $128^{th}$ rows R1~R128 of the weight matrix may be stored into the first to sixteenth memory banks BK0~BK15 in the first channel CH0 along a direction indicated by a solid line arrow 2011. The weight data arrayed in the first to sixteenth rows R1~R16 of the weight matrix may be stored into the first rows ROW0 of the first to sixteenth memory banks BK0~BK15 disposed in the first channel CH0. Thus, the weight data W1.1~W1.128 arrayed in the first row R1 of the weight matrix may be stored into the first row ROW0 of the first memory bank BK0 in the first channel CH0. In addition, the weight data W2.1~W2.128 arrayed in the second row R2 of the weight matrix may be stored into the first row ROW0 of the second memory bank BK1 in the first channel CH0. Similarly, the weight data W16.1~W16.128 arrayed in the sixteenth row R16 of the weight matrix may be stored into the first row ROW0 of the sixteenth memory bank BK15 in the first channel CH0.

After the weight data in the first to sixteenth rows R1~R16 of the weight matrix are stored into respective ones of the first to sixteenth memory banks BK0~BK15 disposed in the first channel CH0, a storage region of the weight data arrayed in the next 16 rows of the weight matrix may move to the first to sixteenth memory banks BK0~BK15 disposed in the second channel CH1 corresponding to the next channel, as indicated by a dotted line arrow 2021. That is, the weight data arrayed in the $17^{th}$ to $32^{nd}$ rows R17~R32 of the weight matrix may be stored into the first to sixteenth memory banks BK0~BK15 in the second channel CH1 along a direction indicated by a solid line arrow 2012. Specifically, the weight data W17.1~W17.128 arrayed in the $17^{th}$ row R17 of the weight matrix may be stored into the first row ROW0 of the first memory bank BK0 in the second channel CH1. In addition, the weight data W18.1~W18.128 arrayed in the $18^{th}$ row R18 of the weight matrix may be stored into the first row ROW0 of the second memory bank BK1 in the second channel CH1. Similarly, the weight data W32.1~W32.128 arrayed in the $32^{nd}$ row R32 of the weight matrix may be stored into the first row ROW0 of the sixteenth memory bank BK15 in the second channel CH1.

After the weight data in the $17^{th}$ to $32^{nd}$ rows R17~R32 of the weight matrix are stored into respective ones of the first to sixteenth memory banks BK0~BK15 disposed in the second channel CH1, a storage region of the weight data arrayed in the next 16 rows of the weight matrix may move to the first to sixteenth memory banks BK0~BK15 disposed in the third channel CH2 corresponding to the next channel, as indicated by a dotted line arrow 2022. That is, the weight data arrayed in the $33^{rd}$ to $48^{th}$ rows R33~R48 of the weight matrix may be stored into the first to sixteenth memory banks BK0~BK15 in the third channel CH2 along a direction indicated by a solid line arrow 2013. Specifically, the weight data W33.1~W33.128 arrayed in the $33^{rd}$ row R33 of the weight matrix may be stored into the first row ROW0 of the first memory bank BK0 in the third channel CH2. In addition, the weight data W34.1~W34.128 arrayed in the $34^{th}$ row R34 of the weight matrix may be stored into the first row ROW0 of the second memory bank BK1 in the third channel CH2. Similarly, the weight data W48.1~W48.128 arrayed in the $48^{th}$ row R48 of the weight matrix may be stored into the first row ROW0 of the sixteenth memory bank BK15 in the third channel CH2.

After the weight data in the $33^{rd}$ to $48^{th}$ rows R33~R48 of the weight matrix are stored into respective ones of the first to sixteenth memory banks BK0~BK15 disposed in the third channel CH2, a storage region of the weight data arrayed in the next 16 rows of the weight matrix may move to the first to sixteenth memory banks BK0~BK15 disposed in the fourth channel CH3 corresponding to the next channel, as indicated by a dotted line arrow 2023. That is, the weight data arrayed in the $49^{th}$ to $64^{th}$ rows R49~R64 of the weight matrix may be stored into the first to sixteenth memory banks BK0~BK15 in the fourth channel CH3 along a direction indicated by a solid line arrow 2014. Specifically, the weight data W49.1~W49.128 arrayed in the $49^{th}$ row R49 of the weight matrix may be stored into the first row ROW0 of the first memory bank BK0 in the fourth channel CH3. In addition, the weight data W50.1~W50.128 arrayed in the $50^{th}$ row R50 of the weight matrix may be stored into the first row ROW0 of the second memory bank BK1 in the fourth channel CH3. Similarly, the weight data W64.1~W64.128 arrayed in the $64^{th}$ row R64 of the weight matrix may be stored into the first row ROW0 of the sixteenth memory bank BK15 in the fourth channel CH3.

Next, referring to FIG. 34, after the weight data W1.1~W64.128 arrayed in the first to $64^{th}$ rows R1~R64 of the weight matrix are stored into the first rows ROW0 of the first to sixteenth memory banks BK0~BK15 in the first to fourth channels CH0~CH3, the weight data W65.1~W128.128 arrayed in the next 64 rows R65~R128 of the weight matrix may be stored into the second rows ROW1 of the first to sixteenth memory banks BK0~BK15 in the first to fourth channels CH0~CH3. That is, if the weight data W64.1~W64.128 arrayed in the $64^{th}$ row R64 of the weight matrix are stored into the first row ROW0 of the sixteenth memory bank BK15 in the fourth channel CH3, a storage region of the weight data W65.1~W65.128 arrayed in the $65^{th}$ row R65 corresponding to the next row of the weight matrix may move to the first memory bank BK0 in the first channel CH0, as indicated by a dotted line arrow 2024.

Accordingly, the weight data W65.1~W80.128 arrayed in the $65^{th}$ to $80^{th}$ rows R65~R80 of the weight matrix may be stored into respective ones of the second rows ROW1 of the first to sixteenth memory banks BK0~BK15 in the first channel CH0, along a direction indicated by a solid line arrow 2031. Specifically, the weight data W65.1~W65.128 arrayed in the $65^{th}$ row R65 of the weight matrix may be stored into the second row ROW1 of the first memory bank BK0 in the first channel CH0. In addition, the weight data W66.1~W66.128 arrayed in the $66^{th}$ row R66 of the weight matrix may be stored into the second row ROW1 of the second memory bank BK1 in the first channel CH0. Similarly, the weight data W80.1~W80.128 arrayed in the $80^{th}$ row R80 of the weight matrix may be stored into the second row ROW1 of the sixteenth memory bank BK15 in the first channel CH0.

Next, a storage region of the weight data arrayed in the next 16 rows of the weight matrix may move to the first to the sixteenth memory banks BK0~BK15 in the second channel CH1 corresponding to the next channel, as indicated by a dotted line arrow 2041. That is, the weight data arrayed in the $81^{st}$ to $96^{th}$ rows R81~R96 of the weight matrix may be stored into respective ones the second rows ROW1 of the first to sixteenth memory banks BK0~BK15 in the second channel CH1, along a direction indicated by a solid line arrow 2032. Specifically, the weight data W81.1~W81.128 arrayed in the $81^{st}$ row R81 of the weight matrix may be stored into the second row ROW1 of the first memory bank BK0 in the second channel CH1. In addition, the weight data W82.1~W82.128 arrayed in the $82^{th}$ row R82 of the weight matrix may be stored into the second row ROW1 of the second memory bank BK1 in the second channel CH1. Similarly, the weight data W96.1~W96.128 arrayed in the $96^{th}$ row R96 of the weight matrix may be stored into the second row ROW1 of the sixteenth memory bank BK15 in the second channel CH1.

Next, a storage region of the weight data arrayed in the next 16 rows of the weight matrix may move to the first to the sixteenth memory banks BK0~BK15 in the third channel CH2 corresponding to the next channel, as indicated by a dotted line arrow 2042. That is, the weight data arrayed in the $97^{th}$ to $112^{th}$ rows R97~R112 of the weight matrix may be stored into respective ones the second rows ROW1 of the first to sixteenth memory banks BK0~BK15 in the third channel CH2, along a direction indicated by a solid line arrow 2033. Specifically, the weight data W97.1~W97.128 arrayed in the $97^{th}$ row R97 of the weight matrix may be stored into the second row ROW1 of the first memory bank BK0 in the third channel CH2. In addition, the weight data W98.1~W98.128 arrayed in the $98^{th}$ row R98 of the weight matrix may be stored into the second row ROW1 of the second memory bank BK1 in the third channel CH2. Similarly, the weight data W112.1~W112.128 arrayed in the $112^{th}$ row R12 of the weight matrix may be stored into the second row ROW1 of the sixteenth memory bank BK15 in the third channel CH2.

Next, a storage region of the weight data arrayed in the next 16 rows of the weight matrix may move to the first to the sixteenth memory banks BK0~BK15 in the fourth channel CH3 corresponding to the next channel, as indicated by a dotted line arrow 2043. That is, the weight data arrayed in the $113^{th}$ to $128^{th}$ rows R113~R128 of the weight matrix may be stored into respective ones the second rows ROW1 of the first to sixteenth memory banks BK0~BK15 in the fourth channel CH3, along a direction indicated by a solid line arrow 2034. Specifically, the weight data W113.1~W113.128 arrayed in the $113^{th}$ row R113 of the weight matrix may be stored into the second row ROW1 of the first memory bank BK0 in the fourth channel CH3. In addition, the weight data W114.1~W114.128 arrayed in the $114^{th}$ row R114 of the weight matrix may be stored into the second row ROW1 of the second memory bank BK1 in the fourth channel CH3. Similarly, the weight data W128.1~W128.128 arrayed in the $128^{th}$ row R128 of the weight matrix may be stored into the second row ROW1 of the sixteenth memory bank BK15 in the fourth channel CH3.

As such, the weight data arrayed in one among the rows of the weight matrix may be stored in any one of the first and second rows included in one of the memory banks BK0~BK15 disposed in the channels CH0~CH3. For example, the weight data W1.1~W1.128 arrayed in the first row R1 of the weight matrix may be stored into the first row ROW0 of the first memory bank BK0 in the first channel CH0 may store, and the weight data W65.1~W65.128 arrayed in the $65^{th}$ row R65 of the weight matrix may be stored into the second row ROW1 of the first memory bank BK0 in the first channel CH0. The number of rows in each of the memory banks BK0~BK15 disposed in each channel may vary according to a size of the weight matrix, the number of the memory banks, and the number of the channels.

In an embodiment, when the weight matrix has 'M'-number of rows and 'N'-number of columns, the number of the channels is 'CHN', and the number of the memory banks in each of the channels is 'BKN', the number of rows disposed in each channel to evenly store all of the weight data into all of the channels may be calculated by a formula of 'M/(BKN×CHN)' (where, "M", "N", "BKN", and "CHN" may be natural numbers which are equal to or greater than two). In such a case, the weight data arrayed in the first to $(BKN×CHN)^{th}$ rows among the first to $M^{th}$ rows of the weight matrix may be stored in the first rows ROW0 of all of the memory banks disposed in all of the channels, and the weight data arrayed in the $(BKN×CHN+1)^{th}$ to $(2×BKN×CHN)^{th}$ rows among the first to $M^{th}$ rows of the weight matrix may be stored in the second rows ROW1 of all of the memory banks disposed in all of the channels.

In an embodiment, when the number 'M' of the rows in the weight matrix and the number 'N' of the columns in the weight matrix are '512', the number 'BKN' of the memory banks in each channel is '16', and the number 'CHN' of the channels is '8', the number of the rows of each of the memory banks disposed in each channel to evenly store all of the weight data into all of the channels may be '4'. In such a case, the weight data arrayed in the first to $128^{th}$ rows among the first to $512^{th}$ rows of the weight matrix may be stored in the first rows of all of the memory banks disposed in the all of the first to eighth channels, and the weight data arrayed in the $129^{th}$ to $256^{th}$ rows among the first to $512^{th}$ rows of the weight matrix may be stored in the second rows of all of the memory banks disposed in all of the first to eighth channels. In addition, the weight data arrayed in the $257^{th}$ to $384^{th}$ rows among the first to $512^{th}$ rows of the weight matrix may be stored in the third rows of all of the memory banks disposed in the all of the first to eighth channels, and the weight data arrayed in the $385^{th}$ to $512^{th}$ rows among the first to 512th rows of the weight matrix may be stored in the fourth rows of all of the memory banks disposed in all of the first to eighth channels.

Figure 35:
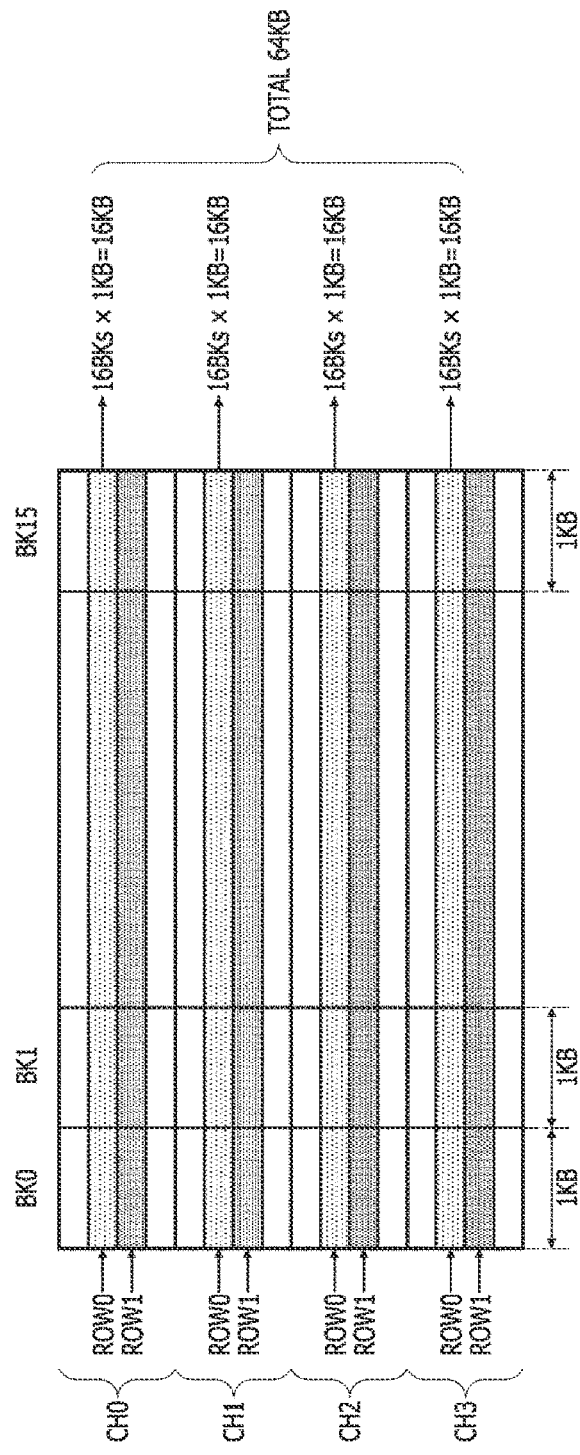
FIGS. 35 and 36 illustrate a memory allocation process for storing weight data illustrated in FIG. 32 in the PIM device of FIG. 31.
Figure 36:
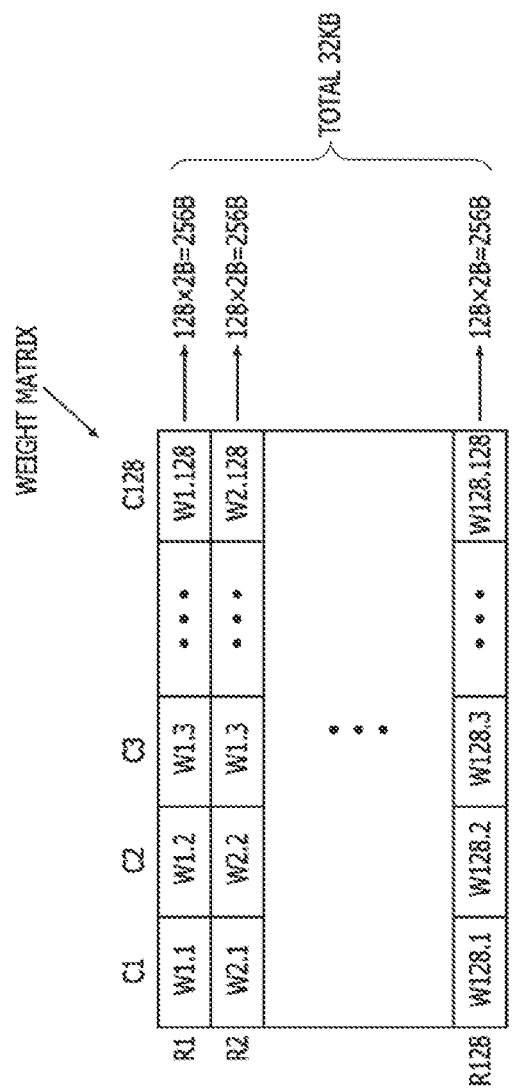

FIGS. 35 and 36 illustrate a memory allocation process for storing the weight data W1.1~W128.128 illustrated in FIG. 32 in units of rows into the PIM device 1000 of FIG. 31. FIG. 35 is a schematic diagram illustrating the first to fourth channels CH0~CH3 in the PIM device 1000 and the memory banks BK0~BK15 disposed in each of the channels CH0~CH3, and FIG. 36 illustrates a schematic diagram corresponding to the weight matrix illustrated in FIG. 32.

Referring to FIGS. 35 and 36, because the PIM device 1000 includes four channels (i.e., the first to fourth channels CH0~CH3) and sixteen memory banks (i.e., the first to sixteenth memory banks BK0~BK15) in each channel, the number of the memory banks in one row (e.g., the first row ROW0 or the second row ROW1) of all of the channels may be '64'. Hereinafter, the term 'a single memory bank BK' may be understood as meaning one among the 64 memory banks BK0~BK15 disposed in all of the first to fourth channels CH0~CH3. In the present embodiment, it may be assumed that one row in the single memory bank BK has a 1 KB memory size. Because each of the channels CH0~CH3 includes 16 memory banks BK0~BK15, the first row ROW0 in each channel may have a 16 KB memory size. In addition, because the number of the channels is '4', one row in all of the channels may have a 64 KB memory size.

The weight data W1.1~W128.128 in the weight matrix may be stored into the memory banks in units of rows of the weight matrix. Thus, a 128 KB memory capacity has to be allocated to store all of the weight data in the weight matrix because the total number of the rows R1~R128 in the weight matrix is '128'. That is, as described above, because the one row in all of the channels CH0~CH3 has a 64 KB memory size, two rows (i.e., the first row ROW0 and the second row ROW1) in all of the channels has to be allocated for a 128 KB memory capacity.

Meanwhile, each of the rows (R1~R128) in the weight matrix has first to $128^{th}$ weight data, and each of the first to $128^{th}$ weight data has a 2-byte size (i.e., a 2B size). Thus, the first to $128^{th}$ weight data in each row of the weight matrix may occupy a 256-byte memory size in the single memory bank. In addition, because the weight matrix has 128 rows (i.e., the first to $128^{th}$ rows R1~R128), a 32 KB memory size may be used to store all of the weight data W1.1~W128.128 in the weight matrix.

As described above, while a 128 KB memory size is allocated to store the weight data W1.1~W128.128 in the weight matrix, an actual data size of all of the weight data W1.1~W128.128 in the weight matrix may be 32 KB. The difference between the allocated memory size of 128 KB and the actual data size of 32 KB may be due to a fact that the data size (i.e., 256 bytes) of each row of the weight matrix is less than the memory capacity (i.e., 1 KB) of each row in the single memory bank BK. Thus, in the present embodiment, after the weight data in one row of the weight matrix are stored into one row of the single memory bank BK, a zero-padding process may be executed to fill the remaining regions in the one row of the single memory bank BK, which are not filled with the weight data, with data having a value of '0'.

Figure 37:
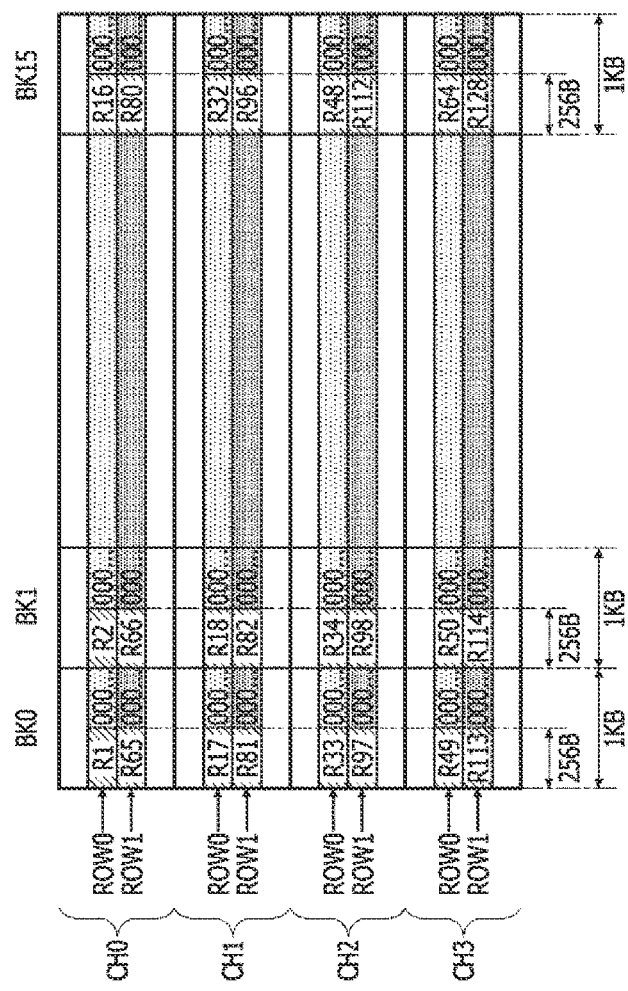
FIG. 37 illustrates a zero-padding process executed during a process for storing weight data of a weight matrix in the PIM device of FIG. 31.

FIG. 37 illustrates the PIM device 1000 to which the zero-padding process is applied while the weight data are stored into the PIM device 1000 of FIG. 31. Referring to FIG. 37, the weight data arrayed in one of the first to $128^{th}$ rows R1~R128 of the weight matrix may be stored into one row (e.g., the first row ROW0) of the single memory bank BK. As described previously, the first row ROW0 or the second row ROW1 in each of the memory banks BK0~BK15 may have a memory size of 1 KB, and the weight data stored into the first row ROW0 or the second row ROW1 of the single memory bank BK may have a data size of 256 bytes. Thus, all of excess regions of 768 bytes in each row of the single memory bank BK may be filled with data having a value of '0'.

In an embodiment, a 256-byte region of the 1 KB memory size allocated to the first row ROW0 of the first memory bank BK0 in the first channel CH0 may be used to store the weight data W1.1~W1.128 arrayed in the first row R1 of the weight matrix, and the remaining 768-byte region of the 1 KB memory size allocated to the first row ROW0 of the first memory bank BK0 in the first channel CH0 may be filled with data having a value of '0'. Similarly, a 256-byte region of the 1 KB memory size allocated to the second row ROW1 of the first memory bank BK0 in the first channel CH0 may be used to store the weight data W65.1~W65.128 arrayed in the $65^{th}$ row R65 of the weight matrix, and the remaining 768-byte region of the 1 KB memory size allocated to the second row ROW1 of the first memory bank BK0 in the first channel CH0 may be filled with data having a value of '0'. This zero-padding process may also be equally executed for all of the rows (of the memory banks BK0~BK15 in all of the channels) into which the weight data of the weight matrix are stored.

Figure 38:
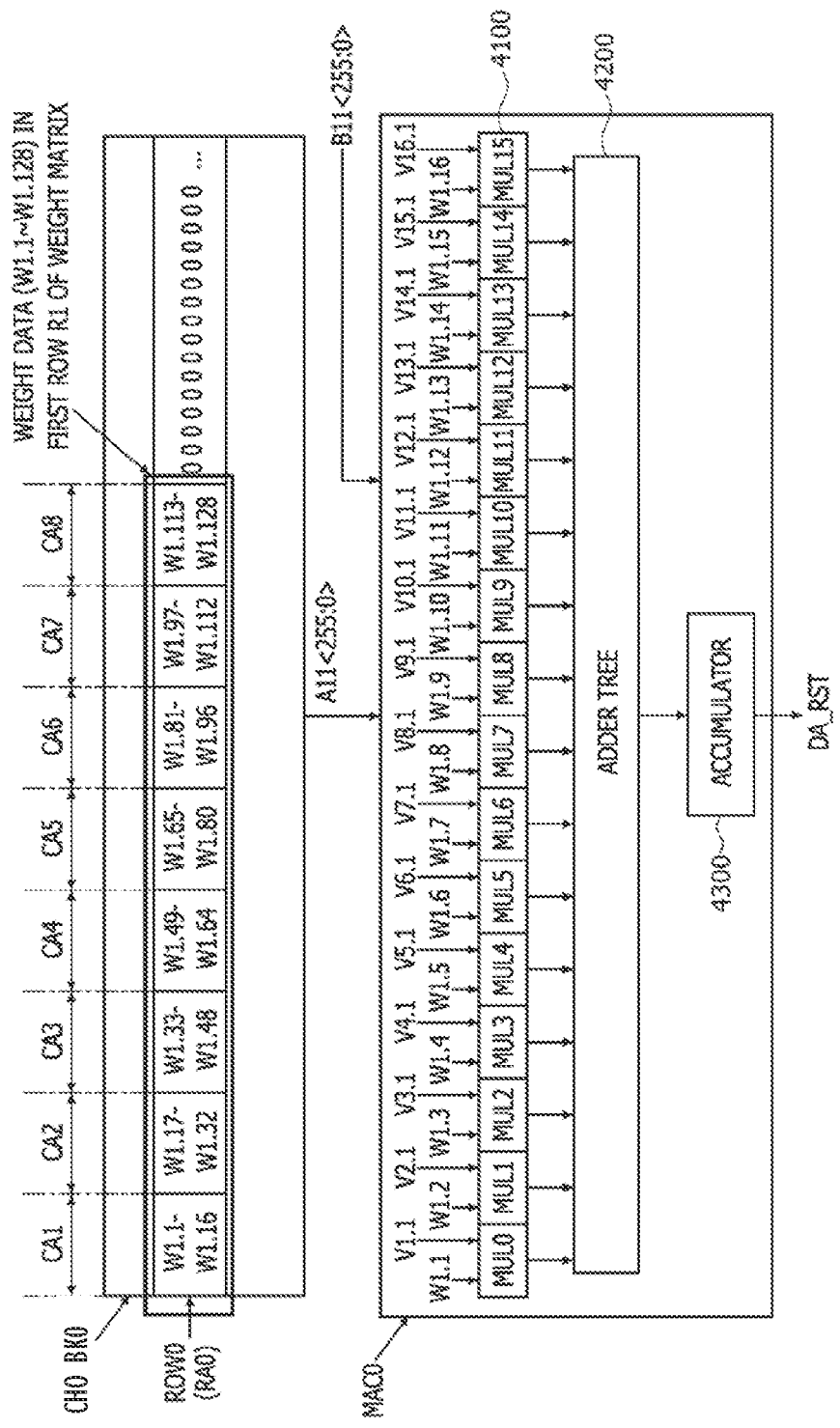
FIG. 38 illustrates a MAC arithmetic operation performed using weight data arrayed in a first row of a weight matrix stored in a first memory bank of a first channel included in the PIM device illustrated in FIG. 31.

FIG. 38 illustrates the MAC arithmetic operation performed using the weight data W1.1~W1.128, which are arrayed in the first row R1 of the weight matrix, stored in the first memory bank BK0 of the first channel CH0 included in the PIM device 1000 illustrated in FIG. 31. In FIG. 38, the remaining weight data other than the weight data W1.1~W1.128 arrayed in the first row R1 of the weight matrix are not illustrated for the purpose of ease and convenience in explanation. Referring to FIG. 38, the weight data W1.1~W1.128 in the first row R1 of the weight matrix, which are stored in the first memory bank BK0 of the first channel CH0, may be transmitted to the first MAC operator MAC0 for the MAC arithmetic operation.

The first MAC operator MAC0 may include a multiplication circuit 4100, an adder tree 4200, and an accumulator 4300. The multiplication circuit 4100 may include 16 multipliers (i.e., first to sixteenth multipliers MUL0~MUL15). Each of the first to sixteenth multipliers MUL0~MUL15 may receive weight data W having 16 bits (i.e., 2 bytes) and vector data V having 16 bits (i.e., 2 bytes). Each of the first to sixteenth multipliers MUL0~MUL15 may perform a multiplying calculation of the weight data W and the vector data V to generate multiplication result data and may transmit the multiplication result data to the adder tree 4200. The adder tree 4200 may sequentially perform adding calculations of the multiplication result data outputted from the first to sixteenth multipliers MUL0~MUL15 to generate addition result data and may transmit the addition result data to the accumulator 4300. The accumulator 4300 may perform an accumulating calculation for adding latched data stored in the accumulator 4300 to the addition result data outputted from the adder tree 4200. Result data generated by the accumulator 4300 may be latched by the accumulator 4300 for a next accumulating calculation or may be outputted as MAC result data DA_RST.

The first MAC operator MAC0 may perform substantially the same operation as the MAC operator 220 described with reference to FIG. 7. In such a case, the multiplication circuit 4100 of the first MAC operator MAC0 may correspond to the multiplication logic circuit 222-1 of the MAC operator 220 illustrated in FIG. 7. In addition, the adder tree 4200 and the accumulator 4300 of the first MAC operator MAC0 may correspond to the addition logic circuit 222-2 and the output latch 223-1 of the MAC operator 220 illustrated in FIG. 7, respectively.

The first MAC operator MAC0 may receive weight data A11<255:0> having 256 bits (i.e., 32B=32 bytes) from the first memory bank BK0 of the first channel CH0 for a first MAC arithmetic operation. In addition, the first MAC operator MAC0 may receive vector data B11<255:0> having 256 bits from the global buffer GB0 of the first channel CH0 for the first MAC arithmetic operation. Thus, 16 weight data W1.1~W1.16 among the weight data W1.1~W1.128 stored in the first row ROW0 of the first memory bank BK0 in the first channel CH0 may be inputted to the first MAC operator MAC0 for the first MAC arithmetic operation. The weight data W1.1~W1.128 stored in the first row ROW0 of the first memory bank BK0 in the first channel CH0 may be divided into 8 groups of weight data (i.e., first to eighth groups of weight data W1.1~W1.16, W1.17~W1.32, . . . , and W1.113~W1.128), and the 8 groups of weight data may have 8 different column addresses CA.

Specifically, the weight data W1.1~W1.16 located on first to sixteenth columns C1~C16 among the weight data W1.1~W1.128 arrayed in the first row R1 of the weight matrix illustrated in FIG. 32 may be transmitted to the first MAC operator MAC0 for the first MAC arithmetic operation. The weight data W1.1~W1.16 may be selected by a first row address RA0 and a first column address CA1. The weight data W1.1~W1.16 transmitted to the first MAC operator MAC0 may be inputted to the first to sixteenth multipliers MUL0~MUL15 of the multiplication circuit 4100, respectively. Next, the weight data W1.17~W1.32 located on $17^{th}$ to $32^{nd}$ columns C17~C32 among the weight data W1.1~W1.128 arrayed in the first row R1 of the weight matrix illustrated in FIG. 32 may be transmitted to the first MAC operator MAC0 for a second MAC arithmetic operation. The weight data W1.17~W1.32 may be selected by the first row address RA0 and a second column address CA2.

Similarly, the weight data W1.33~W1.48 located on $33^{rd}$ to $48^{th}$ columns C33~C48 among the weight data W1.1~W1.128 arrayed in the first row R1 of the weight matrix illustrated in FIG. 32 may be transmitted to the first MAC operator MAC0 for a third MAC arithmetic operation. The weight data W1.33~W1.48 may be selected by the first row address RA0 and a third column address CA3. Subsequently, the weight data W1.49~W1.64 located on $49^{th}$ to $64^{th}$ columns C49~C64 among the weight data W1.1~W1.128 arrayed in the first row R1 of the weight matrix illustrated in FIG. 32 may be transmitted to the first MAC operator MAC0 for a fourth MAC arithmetic operation. The weight data W1.49~W1.64 may be selected by the first row address RA0 and a fourth column address CA4. Further, the weight data W1.65~W1.80 located on $65^{th}$ to $80^{th}$ columns C65~C80 among the weight data W1.1~W1.128 arrayed in the first row R1 of the weight matrix illustrated in FIG. 32 may be transmitted to the first MAC operator MAC0 for a fifth MAC arithmetic operation. The weight data W1.65~W1.80 may be selected by the first row address RA0 and a fifth column address CA5.

Furthermore, the weight data W1.81~W1.96 located on $81^{st}$ to $96^{th}$ columns C81~C96 among the weight data W1.1~W1.128 arrayed in the first row R1 of the weight matrix illustrated in FIG. 32 may be transmitted to the first MAC operator MAC0 for a sixth MAC arithmetic operation. The weight data W1.81~W1.96 may be selected by the first row address RA0 and a sixth column address CA6. Subsequently, the weight data W1.97~W1.112 located on $97^{th}$ to $112^{th}$ columns C97~C112 among the weight data W1.1~W1.128 arrayed in the first row R1 of the weight matrix illustrated in FIG. 32 may be transmitted to the first MAC operator MAC0 for a seventh MAC arithmetic operation. The weight data W1.97~W1.112 may be selected by the first row address RA0 and a seventh column address CA7. Finally, the weight data W1.113~W1.128 located on $113^{th}$ to $128^{th}$ columns C113~C128 among the weight data W1.1~W1.128 arrayed in the first row R1 of the weight matrix illustrated in FIG. 32 may be transmitted to the first MAC operator MAC0 for an eighth MAC arithmetic operation. The weight data W1.113~W1.128 may be selected by the first row address RA0 and an eighth column address CA8.

Figure 39:
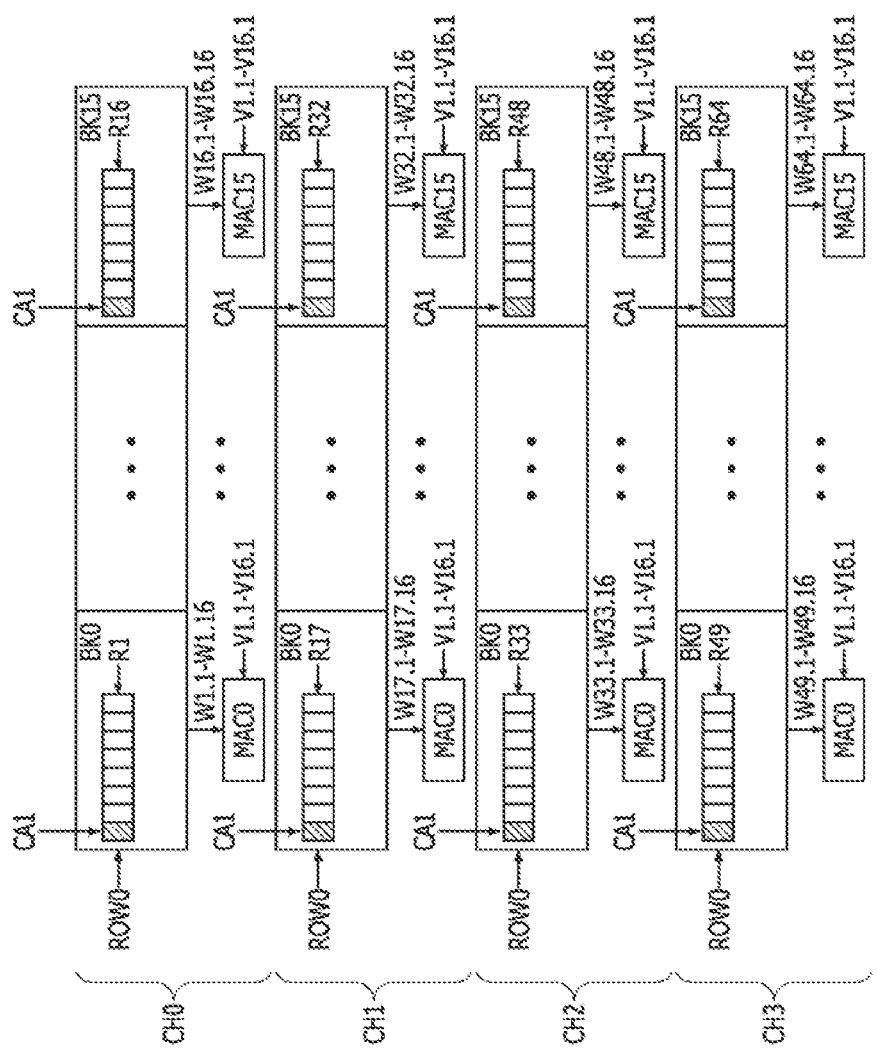
FIGS. 39 to 41 illustrate an example of a parallelism operation for channels and banks in transmitting weight data to each of MAC operators included in the PIM device illustrated in FIG. 31.
Figure 40:
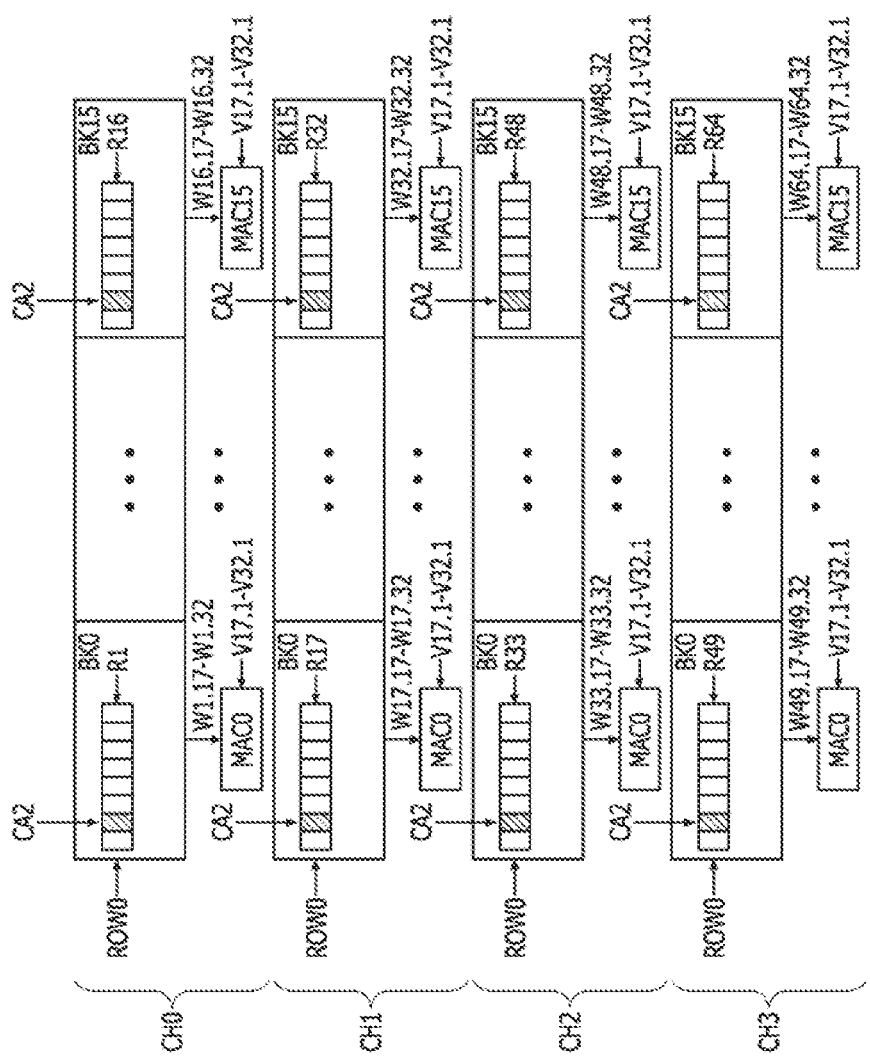
Figure 41:
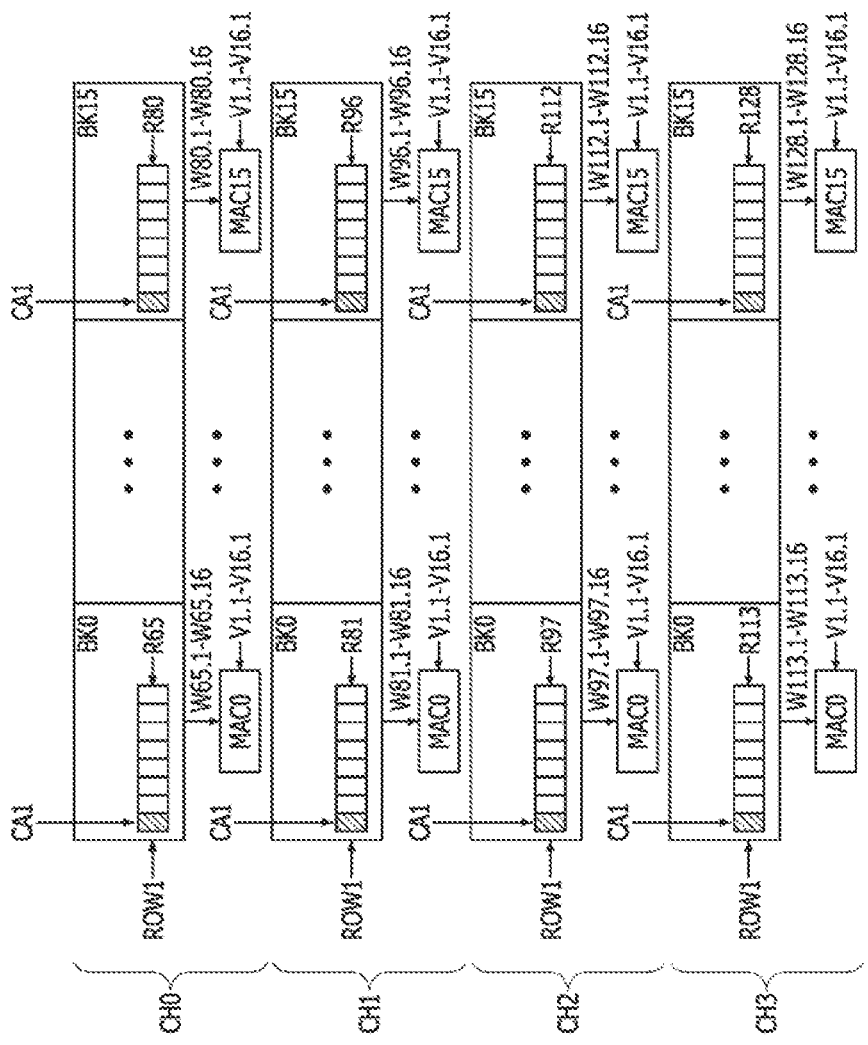

FIGS. 39 to 41 illustrate an example of a parallelism operation for the channels CH and the memory banks BK in transmitting the weight data to each of the MAC operators MAC0~MAC15 included in the PIM device 1000 illustrated in FIG. 31. In the present embodiment, it may be assumed that the weight data W1.1~W128.128 of the weight matrix are stored in the first to fourth channels CH0~CH3 by the same process as described with reference to FIGS. 33 and 34. For the purpose of ease and convenience in explanation, the second rows ROW1 in the memory banks BK0~BK15 are not illustrated in FIGS. 39 and 40 and the first rows ROW0 in the memory banks BK0~BK15 are not illustrated in FIG. 41.

First, referring to FIG. 39, the first row ROW0 in each of the channels CH0~CH3 may be activated by applying an active control signal (not shown) and the first row address RA0 to the channels CH0~CH3. Next, a MAC read control signal (not shown) and the first column address CA1 may be applied to all of the memory banks BK0~BK15 in the first to fourth channels CH0~CH3. As a result, each of the memory banks BK0~BK15 in all of the channels CH0~CH3 may output the weight data (corresponding to the weight data located on the first to sixteenth columns C1~C16 in each row of the weight matrix) stored in the first row ROW0 thereof to the MAC operator coupled thereto, as described with reference to FIG. 38.

Specifically, when the MAC read control signal (not shown) and the first column address CA1 are applied to all of the memory banks BK0~BK15 in the first channel CH0 while the first row ROW0 in the first channel CH0 is activated, the first to sixteenth memory banks BK0~BK15 in the first channel CH0 may output the weight data W1.1~W1.16, W2.1~W2.16, . . . , and W16.1~W16.16 located at cross points of the first to sixteenth rows R1~R16 and the first to sixteenth columns C1~C16 of the weight matrix to the first to sixteenth MAC operators MAC0~MAC15 in the first channel CH0. For example, the first memory bank BK0 in the first channel CH0 may output the weight data W1.1~W1.16 located at cross points of the first row R1 and the first to sixteenth columns C1~C16 of the weight matrix to the first MAC operator MAC0 in the first channel CH0. Similarly, the sixteenth memory bank BK15 in the first channel CH0 may output the weight data W16.1~W16.16 located at cross points of the sixteenth row R16 and the first to sixteenth columns C1~C16 of the weight matrix to the sixteenth MAC operator MAC15 in the first channel CH0.

In the same way as described in conjunction with the first channel CH0, when the MAC read control signal (not shown) and the first column address CA1 are applied to all of the memory banks BK0~BK15 in the second channel CH1 while the first row ROW0 in the second channel CH1 is activated, the first to sixteenth memory banks BK0~BK15 in the second channel CH1 may output the weight data W17.1~W17.16, W18.1~W18.16, . . . , and W32.1~W32.16 located at cross points of the seventeenth to $32^{nd}$ rows R17~R32 and the first to sixteenth columns C1~C16 of the weight matrix to the first to sixteenth MAC operators MAC0~MAC15 in the second channel CH1. For example, the first memory bank BK0 in the second channel CH1 may output the weight data W17.1~W17.16 located at cross points of the 17$^{th}$ row R17 and the first to sixteenth columns C1~C16 of the weight matrix to the first MAC operator MAC0 in the second channel CH1. Similarly, the sixteenth memory bank BK15 in the second channel CH1 may output the weight data W32.1~W32.16 located at cross points of the 32$^{nd}$ row R32 and the first to sixteenth columns C1~C16 of the weight matrix to the sixteenth MAC operator MAC15 in the second channel CH1.

When the MAC read control signal (not shown) and the first column address CA1 are applied to all of the memory banks BK0~BK15 in the third channel CH2 while the first row ROW0 in the third channel CH2 is activated, the first to sixteenth memory banks BK0~BK15 in the third channel CH2 may output the weight data W33.1~W33.16, W34.1~W34.16, . . . , and W48.1~W48.16 located at cross points of the 33$^{rd}$ to 48$^{th}$ rows R33~R48 and the first to sixteenth columns C1~C16 of the weight matrix to the first to sixteenth MAC operators MAC0~MAC15 in the third channel CH2. For example, the first memory bank BK0 in the third channel CH2 may output the weight data W33.1~W33.16 located at cross points of the 33$^{rd}$ row R33 and the first to sixteenth columns C1~C16 of the weight matrix to the first MAC operator MAC0 in the third channel CH2. Similarly, the sixteenth memory bank BK15 in the third channel CH2 may output the weight data W48.1~W48.16 located at cross points of the 48$^{th}$ row R48 and the first to sixteenth columns C1~C16 of the weight matrix to the sixteenth MAC operator MAC15 in the third channel CH2.

When the MAC read control signal (not shown) and the first column address CA1 are applied to all of the memory banks BK0~BK15 in the fourth channel CH3 while the first row ROW0 in the fourth channel CH3 is activated, the first to sixteenth memory banks BK0~BK15 in the fourth channel CH3 may output the weight data W49.1~W49.16, W50.1~W50.16, . . . , and W64.1~W64.16 located at cross points of the 49$^{th}$ to 64$^{th}$ rows R49~R64 and the first to sixteenth columns C1~C16 of the weight matrix to the first to sixteenth MAC operators MAC0~MAC15 in the fourth channel CH3. For example, the first memory bank BK0 in the fourth channel CH3 may output the weight data W49.1~W49.16 located at cross points of the 49$^{th}$ row R49 and the first to sixteenth columns C1~C16 of the weight matrix to the first MAC operator MAC0 in the fourth channel CH3. Similarly, the sixteenth memory bank BK15 in the fourth channel CH3 may output the weight data W64.1~W64.16 located at cross points of the 64$^{th}$ row R64 and the first to sixteenth columns C1~C16 of the weight matrix to the sixteenth MAC operator MAC15 in the fourth channel CH3.

In each of the channels CH0~CH3, the MAC operators MAC0~MAC15 may receive the weight data from respective ones of the memory banks BK0~BK15, and each the MAC operators MAC0~MAC15 may receive vector data V1.1~V16.1 located at cross points of a first column and first to sixteenth rows of the vector matrix from the global buffer GB. In each of the channels CH0~CH3, each of the MAC operators MAC0~MAC15 may perform the MAC arithmetic operation of the weight data and the vector data V1.1~V16.1. When the MAC arithmetic operation of the weight data and the vector data V1.1~V16.1 does not terminate in each MAC operator, the MAC operator may latch the MAC result data to accumulatively add the MAC result data to a next MAC result data generated by a next MAC arithmetic operation.

Next, referring to FIG. 40, while the first row ROW0 in all of the channels CH0~CH3 is activated, the MAC read control signal (not shown) and the second column address CA2 may be applied to all of the memory banks BK0~BK15 in all of the first to fourth channels CH0~CH3. As a result, each of the memory banks BK0~BK15 in all of the channels CH0~CH3 may output the weight data (corresponding to the weight data located on the 17$^{th}$ to 32$^{nd}$ columns C17~C32 in each row of the weight matrix) stored in the first row ROW0 thereof to the MAC operator coupled thereto, as described with reference to FIG. 38.

Specifically, when the MAC read control signal (not shown) and the second column address CA2 are applied to all of the memory banks BK0~BK15 in the first channel CH0 while the first row ROW0 in the first channel CH0 is activated, the first to sixteenth memory banks BK0~BK15 in the first channel CH0 may output the weight data W1.17~W1.32, W2.17~W2.32, . . . , and W16.17~W16.32 located at cross points of the first to sixteenth rows R1~R16 and the 17$^{th}$ to 32$^{nd}$ columns C17~C32 of the weight matrix to the first to sixteenth MAC operators MAC0~MAC15 in the first channel CH0. For example, the first memory bank BK0 in the first channel CH0 may output the weight data W1.17~W1.32 located at cross points of the first row R1 and the 17$^{th}$ to 32$^{nd}$ columns C17~C32 of the weight matrix to the first MAC operator MAC0 in the first channel CH0. Similarly, the sixteenth memory bank BK15 in the first channel CH0 may output the weight data W16.17~W16.32 located at cross points of the sixteenth row R16 and the 17$^{th}$ to 32$^{nd}$ columns C17~C32 of the weight matrix to the sixteenth MAC operator MAC15 in the first channel CH0.

In the same way as described in conjunction with the first channel CH0, when the MAC read control signal (not shown) and the second column address CA2 are applied to all of the memory banks BK0~BK15 in the second channel CH1 while the first row ROW0 in the second channel CH1 is activated, the first to sixteenth memory banks BK0~BK15 in the second channel CH1 may output the weight data W17.17~W17.32, W18.17~W18.32, . . . , and W32.17~W32.32 located at cross points of the 17$^{th}$ to 32$^{nd}$ rows R17~R32 and the 17$^{th}$ to 32$^{nd}$ columns C17~C32 of the weight matrix to the first to sixteenth MAC operators MAC0~MAC15 in the second channel CH1. For example, the first memory bank BK0 in the second channel CH1 may output the weight data W17.17~W17.32 located at cross points of the 17$^{th}$ row R17 and the 17$^{th}$ to 32$^{nd}$ columns C17~C32 of the weight matrix to the first MAC operator MAC0 in the second channel CH1. Similarly, the sixteenth memory bank BK15 in the second channel CH1 may output the weight data W32.17~W32.32 located at cross points of the 32$^{nd}$ row R32 and the 17$^{th}$ to 32$^{nd}$ columns C17~C32 of the weight matrix to the sixteenth MAC operator MAC15 in the second channel CH1.

When the MAC read control signal (not shown) and the second column address CA2 are applied to all of the memory banks BK0~BK15 in the third channel CH2 while the first row ROW0 in the third channel CH2 is activated, the first to sixteenth memory banks BK0~BK15 in the third channel CH2 may output the weight data W33.17~W33.32, W34.17~W34.32, . . . , and W48.17~W48.32 located at cross points of the 33$^{rd}$ to 48$^{th}$ rows R33~R48 and the 17$^{th}$ to 32$^{nd}$ columns C17~C32 of the weight matrix to the first to sixteenth MAC operators MAC0~MAC15 in the third channel CH2. For example, the first memory bank BK0 in the third channel CH2 may output the weight data W33.17~W33.32 located at cross points of the 33$^{rd}$ row R33 and the 17$^{th}$ to 32$^{nd}$ columns C17~C32 of the weight matrix to the first MAC operator MAC0 in the third channel CH2. Similarly, the sixteenth memory bank BK15 in the third channel CH2 may output the weight data W48.17~W48.32 located at cross points of the $48^{th}$ row R48 and the $17^{th}$ to $32^{nd}$ columns C17~C32 of the weight matrix to the sixteenth MAC operator MAC15 in the third channel CH2.

When the MAC read control signal (not shown) and the second column address CA2 are applied to all of the memory banks BK0~BK15 in the fourth channel CH3 while the first row ROW0 in the fourth channel CH3 is activated, the first to sixteenth memory banks BK0~BK15 in the fourth channel CH3 may output the weight data W49.17~W49.32, W50.17~W50.32, . . . , and W64.17~W64.32 located at cross points of the $49^{th}$ to $64^{th}$ rows R49~R64 and the $17^{th}$ to $32^{nd}$ columns C17~C32 of the weight matrix to the first to sixteenth MAC operators MAC0~MAC15 in the fourth channel CH3. For example, the first memory bank BK0 in the fourth channel CH3 may output the weight data W49.17~W49.32 located at cross points of the $49^{th}$ row R49 and the $17^{th}$ to $32^{nd}$ columns C17~C32 of the weight matrix to the first MAC operator MAC0 in the fourth channel CH3. Similarly, the sixteenth memory bank BK15 in the fourth channel CH3 may output the weight data W64.17~W64.32 located at cross points of the $64^{th}$ row R64 and the $17^{th}$ to $32^{nd}$ columns C17~C32 of the weight matrix to the sixteenth MAC operator MAC15 in the fourth channel CH3.

In each of the channels CH0~CH3, the MAC operators MAC0~MAC15 may receive the weight data from respective ones of the memory banks BK0~BK15, and each of the MAC operators MAC0~MAC15 may receive vector data V17.1~V32.1 located at cross points of a first column and $17^{th}$ to $32^{nd}$ rows of the vector matrix from the global buffer GB. In each of the channels CH0~CH3, each of the MAC operators MAC0~MAC15 may perform the MAC arithmetic operation of the weight data and the vector data V17.1~V32.1. When the MAC arithmetic operation of the weight data and the vector data V17.1~V32.1 does not terminate in each MAC operator, the MAC operator may latch the MAC result data to accumulatively add the MAC result data to a next MAC result data generated by a next MAC arithmetic operation.

Subsequently, although not shown in the drawings, the MAC read control signal (not shown) and the third column address CA3 are applied to all of the memory banks BK0~BK15 in the first to fourth channel CH0~CH3 while the first row ROW0 in all of the channels CH0~CH3 is activated. Accordingly, substantially the same data transmission operation as described with reference to FIG. 39 or 40 will be performed. This data transmission operation may be iteratively performed until the weight data (corresponding to the weight data located at cross points of the first to $64^{th}$ rows and the $113^{th}$ to $128^{th}$ columns of the weight matrix) stored in the first row ROW0 of the channels CH0~CH3 are transmitted to the MAC operators MAC0~MAC15 by the MAC read control signal and the eighth column address CA8 which are applied to all of the memory banks BK0~BK15 in the first to fourth channel CH0~CH3.

As described above, whenever the MAC read control signal and the column address are applied to the single memory bank BK once, 16 weight data (i.e., 16 elements in the weight matrix) may be transmitted from the single memory bank BK to the MAC operator coupled to the single memory bank BK. Thus, when the MAC read control signal and the column address are applied to all of the memory banks in all of the channels CH0~CH3 BK once, 1024 weight data (i.e., 1024 elements in the weight matrix) may be transmitted from all of the memory banks to the MAC operators coupled thereto. That is, the MAC arithmetic operations for all of the weight data stored in the first rows ROW0 of the memory banks in all of the channels may be performed by applying the MAC read control signal and the column address to the memory banks in all of the channels eight times.

Next, referring to FIG. 41, the second row ROW1 in each of the channels CH0~CH3 may be activated by applying the active control signal (not shown) and the second row address RA1 to the channels CH0~CH3. Next, the MAC read control signal (not shown) and the first column address CA1 may be applied to all of the memory banks BK0~BK15 in the first to fourth channels CH0~CH3. As a result, each of the memory banks BK0~BK15 in all of the channels CH0~CH3 may output the weight data (corresponding to the weight data located on the first to sixteenth columns C1~C16 in each row of the weight matrix) stored in the second row ROW1 thereof to the MAC operator coupled thereto.

Specifically, the first to sixteenth memory banks BK0~BK15 in the first channel CH0 may output the weight data W65.1~W65.16, W66.1~W66.16, . . . , and W80.1~W80.16 located at cross points of the $65^{th}$ to $80^{th}$ rows R65~R80 and the first to sixteenth columns C1~C16 of the weight matrix to the first to sixteenth MAC operators MAC0~MAC15 in the first channel CH0. In addition, the first to sixteenth memory banks BK0~BK15 in the second channel CH1 may output the weight data W81.1~W81.16, W82.1~W82.16, . . . , and W96.1~W96.16 located at cross points of the $81^{st}$ to $96^{th}$ rows R81~R96 and the first to sixteenth columns C1~C16 of the weight matrix to the first to sixteenth MAC operators MAC0~MAC15 in the second channel CH1.

The first to sixteenth memory banks BK0~BK15 in the third channel CH2 may output the weight data W97.1~W97.16, W98.1~W98.16, . . . , and W112.1~W112.16 located at cross points of the $97^{th}$ to $112^{th}$ rows R97~R112 and the first to sixteenth columns C1~C16 of the weight matrix to the first to sixteenth MAC operators MAC0~MAC15 in the third channel CH2. In addition, the first to sixteenth memory banks BK0~BK15 in the fourth channel CH3 may output the weight data W113.1~W113.16, W114.1~W114.16, . . . , and W128.1~W128.16 located at cross points of the $113^{th}$ to $128^{th}$ rows R113~R128 and first to sixteenth columns C1~C16 of the weight matrix to the first to sixteenth MAC operators MAC0~MAC15 in the fourth channel CH3.

In each of the channels CH0~CH3, the MAC operators MAC0~MAC15 may receive the weight data from respective ones of the memory banks BK0~BK15, and each the MAC operators MAC0~MAC15 may receive the vector data V1.1~V16.1 located at cross points of the first column and the first to sixteenth rows of the vector matrix from the global buffer GB. In each of the channels CH0~CH3, each of the MAC operators MAC0~MAC15 may perform the MAC arithmetic operation of the weight data and the vector data V1.1~V16.1. When the MAC arithmetic operation of the weight data and the vector data V1.1~V16.1 does not terminate in each MAC operator, the MAC operator may latch the MAC result data to accumulatively add the MAC result data to a next MAC result data generated by a next MAC arithmetic operation.

After the transmission operations of the weight data are performed by the MAC read control signal (not shown) and the first column address CA1 and the MAC arithmetic operations are performed for the transmitted weight data, the MAC read control signal (not shown) and the second column address CA2 may be applied to all of the memory banks BK0~BK15 in all of the channels CH0~CH3. As a result, substantially the same data transmission operation as described with reference to FIG. 40 may be performed for the weight data selected by the second column address CA2. In addition, the data transmission operation may be iteratively performed until the weight data (corresponding to the weight data located at cross points of the $65^{th}$ to $128^{th}$ rows and the $113^{th}$ to $128^{th}$ columns of the weight matrix) stored in the second row ROW1 of the channels CH0~CH3 are transmitted to the MAC operators MAC0~MAC15 by the MAC read control signal and the eighth column address CA8 which are applied to all of the memory banks BK0~BK15 in the first to fourth channel CH0~CH3.

As described with reference to FIGS. 39 to 41, all of the weight data (corresponding to the weight data arrayed in the first to $64^{th}$ rows R1~R64 of the weight matrix) stored in the first rows ROW0 of the memory banks BK0~BK15 in all of the channels CH0~CH3 may be completely transmitted to the MAC operators MAC0~MAC15 in all of the channels CH0~CH3 by applying the MAC read control signal and the column address to the memory banks BK0~BK15 in all of the channels CH0~CH3 eight times. Moreover, all of the weight data (corresponding to the weight data arrayed in the $65^{th}$ to $128^{th}$ rows R65~R128 of the weight matrix) stored in the second rows ROW1 of the memory banks BK0~BK15 in all of the channels CH0~CH3 may also be completely transmitted to the MAC operators MAC0~MAC15 in all of the channels CH0~CH3 by applying the MAC read control signal and the column address to the memory banks BK0~BK15 in all of the channels CH0~CH3 eight times. That is, in each row (ROW0 or ROW1) of the channels, the MAC arithmetic operation may be performed eight times by sequentially applying the first to eighth column addresses CA1~CA8 to the channels CH0~CH3, and all of the memory banks BK0~BK15 in all of the channels CH0~CH3 may simultaneously operate through a parallelism process. In the present embodiment, the channels may be configured to have two rows (ROW0 and ROW1). Thus, the MAC arithmetic operations may be performed 16 times to terminate a MAC arithmetic step.

Figure 42:
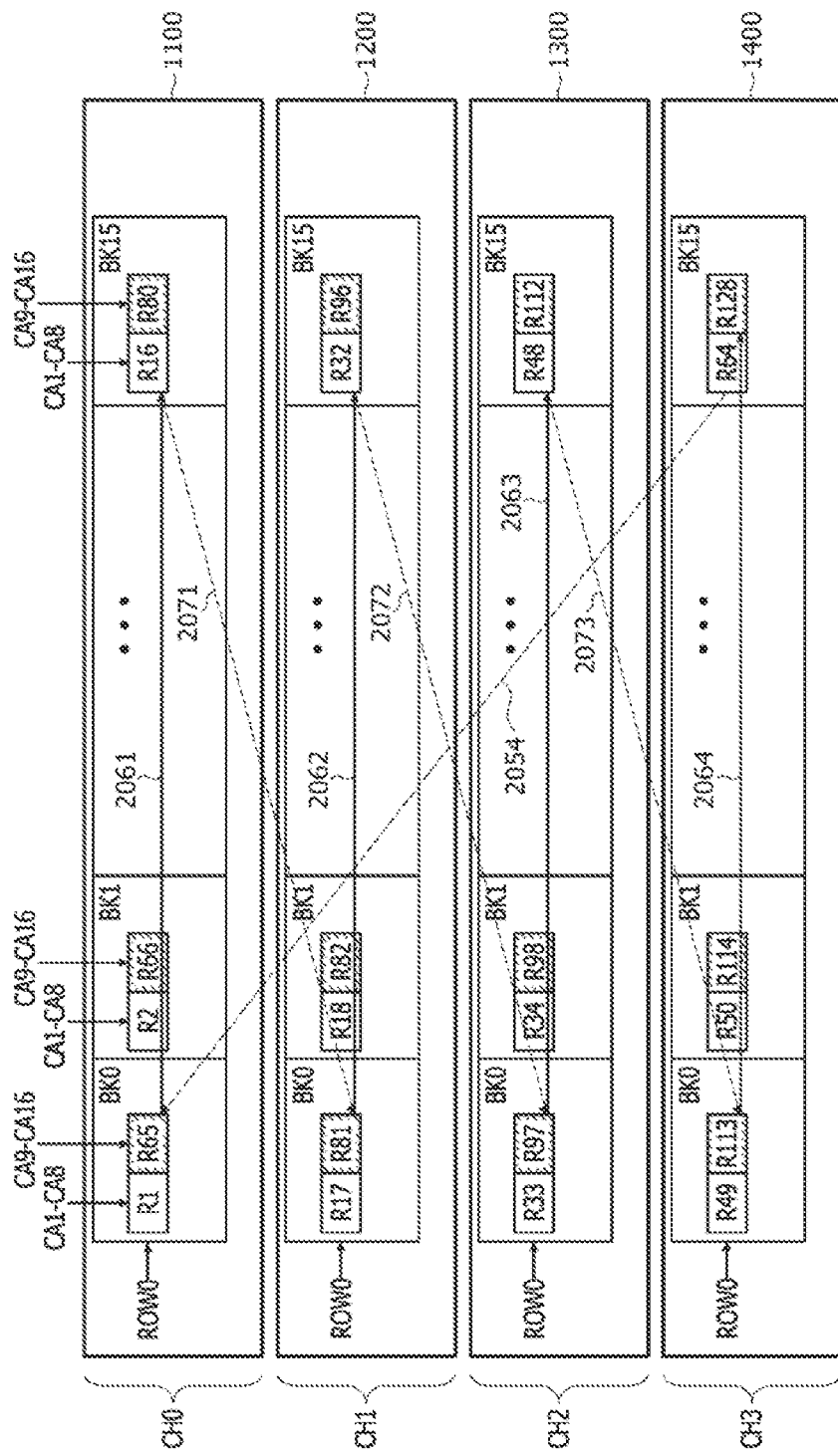
FIG. 42 illustrates another example of a process for storing weight data of a weight matrix illustrated in FIG. 32 in the PIM device of FIG. 31.

FIG. 42 illustrates another example of a process for storing the weight data of the weight matrix illustrated in FIG. 32 into the memory banks BK0~BK15 included in the PIM device 1000 of FIG. 31. In a data storage process proposed by the present embodiment, the weight data arrayed in at least one row of the weight matrix may be stored into one row of one of the memory banks included in one of the channels. According to the present embodiment, the weight data arrayed in two or more rows of the weight matrix may be stored into one row of one of the memory banks. In the present embodiment, the total number of the memory banks disposed in all of the first to fourth channels CH0~CH3 may be '64', and the weight matrix may have first to $128^{th}$ rows. In such a case, the weight data arrayed in two rows of the weight matrix may be stored into one row of one of the memory banks. In the present embodiment, a process for storing the weight data W1.1~W1.128, . . . , and W64.1~W64.128 arrayed in the first to $64^{th}$ rows R1~R64 of the weight matrix into the first to fourth channels CH0~CH3 may be the same as the process described with reference to FIG. 33. Thus, the process for storing the weight data W1.1~W1.128, . . . , and W64.1~W64.128 arrayed in the first to $64^{th}$ rows R1~R64 of the weight matrix into the first to fourth channels CH0~CH3 will be omitted hereinafter to avoid duplicate explanation. In addition, the zero-padding process described with reference to FIG. 37 may also be applicable to the present embodiment.

Referring to FIG. 42, after the weight data arrayed in the $64^{th}$ row R64 of the weight matrix are stored into the first row ROW0 of the sixteenth memory bank BK15 in the fourth channel CH3, the weight data arrayed in the $65^{th}$ row R65 of the weight matrix may be stored into the first memory bank BK0 in the first channel CH0, as indicated by a dotted line arrow 2054. Subsequently, the weight data arrayed in the $66^{th}$ to $80^{th}$ rows R66~R80 of the weight matrix may be sequentially stored into the second to sixteenth memory banks BK1~BK15 in the first channel CH0 along a direction indicated by a solid line arrow 2061. Because the weight data arrayed in the first to $16^{th}$ rows R1~R16 of the weight matrix are stored into the first rows ROW0 having the first to eighth column addresses CA1~CA8 in the first channel CH0, the weight data arrayed in the $65^{th}$ to $80^{th}$ rows R65~R80 of the weight matrix may be stored into the first rows ROW0 having the ninth to $16^{th}$ column addresses CA9~CA16 in the first channel CH0.

After the weight data arrayed in the $80^{th}$ row R80 of the weight matrix are stored into the first row ROW0 of the sixteenth memory bank BK15 in the first channel CH0, the weight data arrayed in the $81^{st}$ row R81 of the weight matrix may be stored into the first memory bank BK0 in the second channel CH1, as indicated by a dotted line arrow 2071. Subsequently, the weight data arrayed in the $82^{nd}$ to $96^{th}$ rows R82~R96 of the weight matrix may be sequentially stored into the second to sixteenth memory banks BK1~BK15 in the second channel CH1 along a direction indicated by a solid line arrow 2062. Because the weight data arrayed in the $17^{th}$ to $32^{nd}$ rows R17~R32 of the weight matrix are stored into the first rows ROW0 having the first to eighth column addresses CA1~CA8 in the second channel CH1, the weight data arrayed in the $81^{st}$ to $96^{th}$ rows R81~R96 of the weight matrix may be stored into the first rows ROW0 having the ninth to $16^{th}$ column addresses CA9~CA16 in the second channel CH1.

After the weight data arrayed in the $96^{th}$ row R96 of the weight matrix are stored into the first row ROW0 of the sixteenth memory bank BK15 in the second channel CH1, the weight data arrayed in the $97^{th}$ row R97 of the weight matrix may be stored into the first memory bank BK0 in the third channel CH2, as indicated by a dotted line arrow 2072. Subsequently, the weight data arrayed in the $98^{th}$ to $112^{th}$ rows R98~R112 of the weight matrix may be sequentially stored into the second to sixteenth memory banks BK1~BK15 in the third channel CH2 along a direction indicated by a solid line arrow 2063. Because the weight data arrayed in the $33^{rd}$ to $48^{th}$ rows R33~R48 of the weight matrix are stored into the first rows ROW0 having the first to eighth column addresses CA1~CA8 in the third channel CH2, the weight data arrayed in the $97^{th}$ to $112^{th}$ rows R97~R112 of the weight matrix may be stored into the first rows ROW0 having the ninth to $16^{th}$ column addresses CA9~CA16 in the third channel CH2.

After the weight data arrayed in the $112^{th}$ row R112 of the weight matrix are stored into the first row ROW0 of the sixteenth memory bank BK15 in the third channel CH2, the weight data arrayed in the $113^{th}$ row R113 of the weight matrix may be stored into the first memory bank BK0 in the fourth channel CH3, as indicated by a dotted line arrow 2073. Subsequently, the weight data arrayed in the $114^{th}$ to $128^{th}$ rows R114~R128 of the weight matrix may be sequentially stored into the second to sixteenth memory banks BK1~BK15 in the fourth channel CH3 along a direction indicated by a solid line arrow 2064. Because the weight data arrayed in the 49$^{th}$ to 64$^{th}$ rows R49~R64 of the weight matrix are stored into the first rows ROW0 having the first to eighth column addresses CA1~CA8 in the fourth channel CH3, the weight data arrayed in the 113$^{th}$ to 128$^{th}$ rows R113~R128 of the weight matrix may be stored into the first rows ROW0 having the ninth to 16$^{th}$ column addresses CA9~CA16 in the fourth channel CH3.

As such, the weight data arrayed in two rows of the weight matrix may be stored in the first rows ROW0 of the memory banks BK0~BK15 disposed in the first to fourth channels CH0~CH3. The number of rows of the weight data stored in one row (ROW) of each of the memory banks BK0~BK15 disposed in each channel may vary according to a size of the row (ROW) in each memory bank, a size of the weight matrix, a size of each element in the weight matrix, the number of the memory banks, and the number of the channels.

In an embodiment, when the weight matrix has 'M'-number of rows and 'N'-number of columns, the number of the memory banks is 'BKN' in each channel, and the number of the channels is 'CHN', the number of rows of the weight data stored in one row (ROW) of each memory bank may be calculated by a formula of 'M/(BKN×CHN)' (where, "M", "N", "BKN", and "CHN" may be natural numbers which are equal to or greater than two). In addition, when a number "i" has one among the integers of '0', '1', '2', . . . , and '(M/BKN−1)', the weight data arrayed in "BKN"-number of rows from a (i×BKN+1)$^{th}$ row to a ((i+1)×BKN)$^{th}$ row among the "M"-number of rows of the weight matrix may be stored into respective ones of the "BKN"-number of memory banks disposed in an (i+1)$^{th}$ channel. Moreover, when a number "F" has one among the integers of '1', '2', . . . , and 'K', the weight data arrayed in an F$^{th}$ row among the "BKN"-number of rows from a (i×BKN+1)$^{th}$ row to a ((i+1)×BKN)$^{th}$ row of the weight matrix may be stored into an F$^{th}$ memory bank among the memory banks in the (i+1)$^{th}$ channel.

In an embodiment, when the number 'M' of the rows in the weight matrix and the number 'N' of the columns in the weight matrix are '512', the number 'BKN' of the memory banks in each channel is '16', and the number 'CHN' of the channels is '8', the weight data arrayed in four rows of the weight matrix may be stored into one row in one of the memory banks. In another embodiment, when the number 'M' of the rows in the weight matrix and the number 'N' of the columns in the weight matrix are '1024', the number 'BKN' of the memory banks in each channel is '16', and the number 'CHN' of the channels is '8', the weight data arrayed in eight rows of the weight matrix may be stored into one row in one of the memory banks. In any case, a total data size of the weight data arrayed in each of the rows of the weight matrix is not greater than a memory capacity allocated to each of the memory banks. In the event that a total data size of the weight data arrayed in each of the rows of the weight matrix is greater than a memory capacity allocated to each of the memory banks, the PIM device may be designed such that the weight data arrayed in each of the rows of the weight matrix are stored into at least two rows of each of the memory banks, as described with reference to FIGS. 33 and 34.

Figure 43:
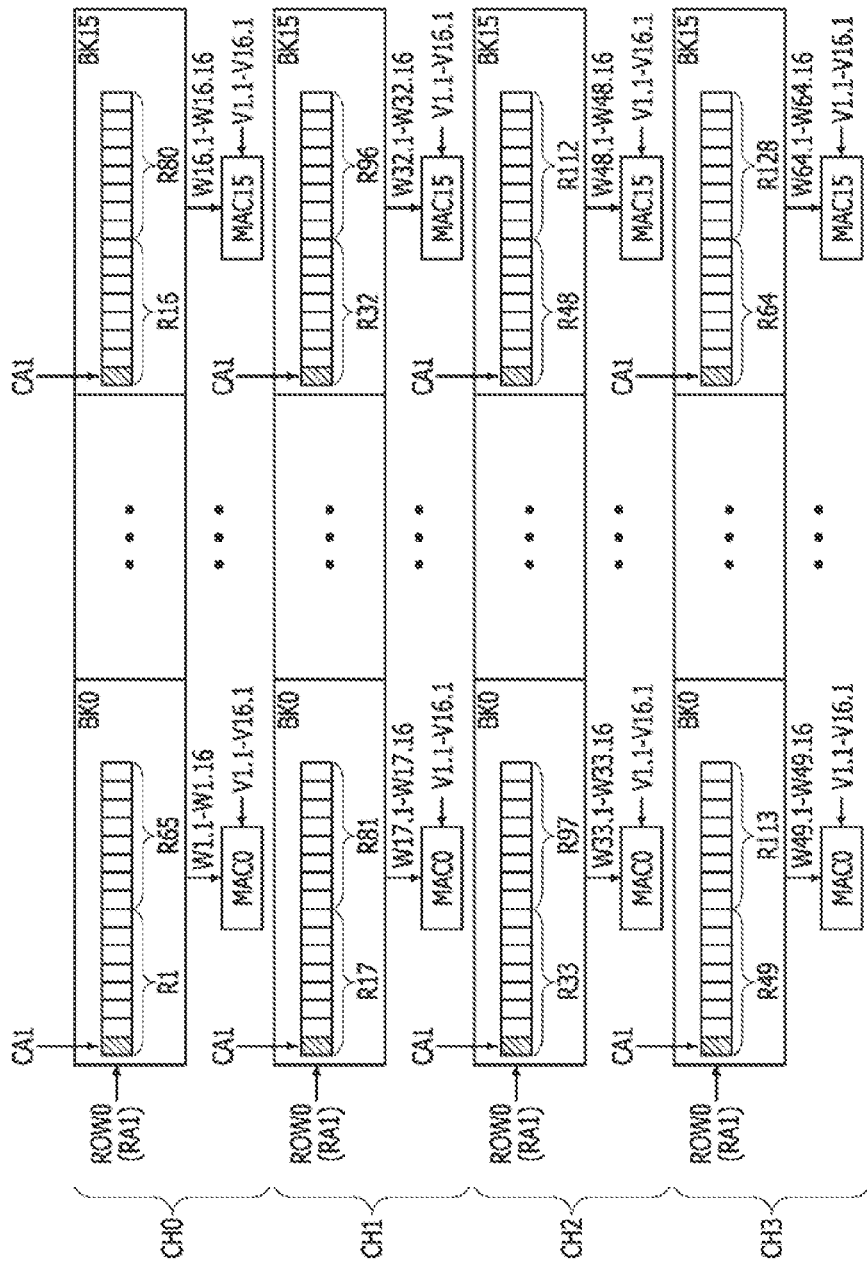
FIGS. 43 and 44 illustrate another example of a parallelism operation for channels and banks in transmitting weight data to each of MAC operators included in the PIM device illustrated in FIG. 31.
Figure 44:
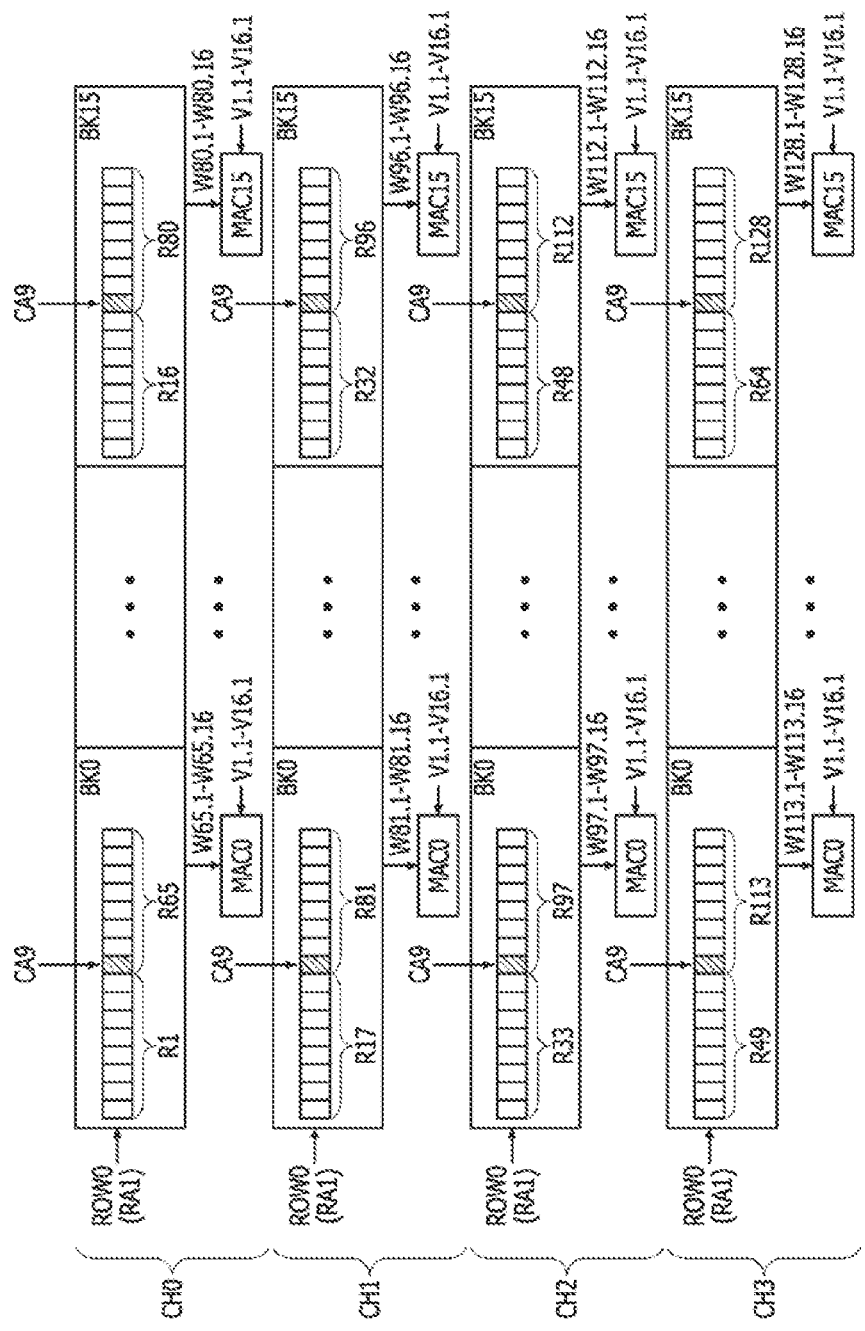

FIGS. 43 and 44 illustrate another example of the parallelism operation for the channels and the banks in transmitting the weight data to each of the MAC operators MAC0~MAC15 included in the PIM device 1000 illustrated in FIG. 31. In the present embodiment, it may be assumed that the weight data of the weight matrix are stored into the memory banks through the data storage process described with reference to FIG. 42. In addition, the vector data may also be transmitted to the MAC operators by the same process as described with reference to FIGS. 39 to 41, and the MAC arithmetic operations may be performed in the same way as described with reference to FIGS. 39 to 41. Thus, the same descriptions as indicated with reference to FIGS. 39 to 41 may be omitted hereinafter to avoid duplicate explanation.

Referring to FIGS. 43 and 44, it may be assumed that the first row ROW0 in all of the channels CH0~CH3 is activated by applying the active control signal (not shown) and the first row address RA1 to all of the memory banks. Whenever the MAC read control signal (not shown) and the column address CA are applied to the all of the memory banks, the memory banks BK0~BK15 in each channel may output and transmit the weight data selected by the column address CA to respective ones of the MAC operators MAC0~MAC15. As described with reference to FIG. 38, when only the weight data arrayed in one among the rows of the weight matrix are stored in one row of the single memory bank BK, all of the weight data stored in one row of the single memory bank BK may be transmitted to the MAC operator coupled to the single memory bank BK by sequentially applying the first to eighth column addresses CA1~CA8 to the single memory bank BK. However, according to the present embodiment, the weight data arrayed in two rows of the weight matrix are stored in one row of the single memory bank BK (refer to FIG. 42). Thus, in the present embodiment, all of the weight data stored in one row of the single memory bank BK may be transmitted to the MAC operator coupled to the single memory bank BK by sequentially applying the first to sixteenth column addresses CA1~CA16 to the single memory bank BK.

First, as illustrated in FIG. 43, the following description will be developed in conjunction with a case that the MAC read control signal (not shown) and the first column address CA1 are applied to the all of the memory banks BK0~BK15 in the channels CH0~CH3. As described with reference to FIG. 39, each of the memory banks BK0~BK15 in each channel may transmit the weight data located at cross points of any one row (corresponding to one of the first to 64$^{th}$ rows R1~R64) and the first to 16$^{th}$ columns C1~C16 of the weight matrix among the weight data stored in the first row ROW0 to the MAC operator coupled thereto.

Specifically, the first to sixteenth memory banks BK0~BK15 in the first channel CH0 may transmit the weight data W1.1~W1.16, W2.1~W2.16, . . . , and W16.1~W16.16, which are located at cross points of the first to 16$^{th}$ rows R1~R16 and the first to 16$^{th}$ columns C1~C16 of the weight matrix, to the first to sixteenth MAC operators MAC0~MAC15 in the first channel CH0, respectively. Similarly, the first to sixteenth memory banks BK0~BK15 in the second channel CH1 may transmit the weight data W17.1~W17.16, W18.1~W18.16, . . . , and W32.1~W32.16, which are located at cross points of the 17$^{th}$ to 32$^{nd}$ rows R17~R32 and the first to 16$^{th}$ columns C1~C16 of the weight matrix, to the first to sixteenth MAC operators MAC0~MAC15 in the second channel CH1, respectively.

The first to sixteenth memory banks BK0~BK15 in the third channel CH2 may transmit the weight data W33.1~W33.16, W34.1~W34.16, . . . , and W48.1~W48.16, which are located at cross points of the 33$^{rd}$ to 48$^{th}$ rows R33~R48 and the first to 16$^{th}$ columns C1~C16 of the weight matrix, to the first to sixteenth MAC operators MAC0~MAC15 in the third channel CH2, respectively. Similarly, the first to sixteenth memory banks BK0~BK15 in the fourth channel CH3 may transmit the weight data W49.1~W49.16, W50.1~W50.16, . . . , and W64.1~W64.16, which are located at cross points of the $49^{th}$ to $64^{th}$ rows R49~R64 and the first to $16^{th}$ columns C1~C16 of the weight matrix, to the first to sixteenth MAC operators MAC0~MAC15 in the fourth channel CH3, respectively.

In the same way as described above, if the second to eighth column addresses CA2~CA8 are sequentially applied to all of the first to sixteenth memory banks BK0~BK15 in all of the channels CH0~CH3 while the MAC read control signal is applied to all of the first to sixteenth memory banks BK0~BK15 in all of the channels CH0~CH3, each of the memory banks BK0~BK15 in each channel may transmit the weight data, which are located at cross points of one row (corresponding to one of the first to $64^{th}$ rows R1~R64) and the 16 columns (corresponding to one of the second to eighth column addresses CA2~CA8) of the weight matrix, among the weight data stored in the first row ROW0 to the MAC operator coupled thereto.

Next, as illustrated in FIG. 44, the MAC read control signal (not shown) and the ninth column address CA9 may be applied to the all of the memory banks BK0~BK15 in the channels CH0~CH3. In such a case, each of the memory banks BK0~BK15 in each channel may transmit the weight data located at cross points of any one row (corresponding to one of the $65^{th}$ to $128^{th}$ rows R65~R128) and the first to $16^{th}$ columns C1~C16 of the weight matrix among the weight data stored in the first row ROW0 to the MAC operator coupled thereto.

Specifically, the first to sixteenth memory banks BK0~BK15 in the first channel CH0 may transmit the weight data W65.1~W65.16, W66.1~W66.16, . . . , and W80.1~W80.16, which are located at cross points of the $65^{th}$ to $80^{th}$ rows R65~R80 and the first to $16^{th}$ columns C1~C16 of the weight matrix, to the first to sixteenth MAC operators MAC0~MAC15 in the first channel CH0, respectively. Similarly, the first to sixteenth memory banks BK0~BK15 in the second channel CH1 may transmit the weight data W81.1~W81.16, W82.1~W82.16, . . . , and W96.1~W96.16, which are located at cross points of the $81^{st}$ to $96^{th}$ rows R81~R96 and the first to $16^{th}$ columns C1~C16 of the weight matrix, to the first to sixteenth MAC operators MAC0~MAC15 in the second channel CH1, respectively.

The first to sixteenth memory banks BK0~BK15 in the third channel CH2 may transmit the weight data W97.1~W97.16, W98.1~W98.16, . . . , and W112.1~W112.16, which are located at cross points of the $97^{th}$ to $112^{th}$ rows R97~R112 and the first to $16^{th}$ columns C1~C16 of the weight matrix, to the first to sixteenth MAC operators MAC0~MAC15 in the third channel CH2, respectively. Similarly, the first to sixteenth memory banks BK0~BK15 in the fourth channel CH3 may transmit the weight data W113.1~W113.16, W114.1~W114.16, . . . , and W128.1~W128.16, which are located at cross points of the $113^{th}$ to $128^{th}$ rows R113~R128 and the first to $16^{th}$ columns C1~C16 of the weight matrix, to the first to sixteenth MAC operators MAC0~MAC15 in the fourth channel CH3, respectively.

In the same way as described above, if the $10^{th}$ to $16^{th}$ column addresses CA10~CA16 are sequentially applied to all of the first to sixteenth memory banks BK0~BK15 in all of the channels CH0~CH3 while the MAC read control signal is applied to all of the first to sixteenth memory banks BK0~BK15 in all of the channels CH0~CH3, each of the memory banks BK0~BK15 in each channel may transmit the weight data, which are located at cross points of one row (corresponding to one of the $65^{th}$ to $128^{th}$ rows R65~R128) and the 16 columns (corresponding to one of the $10^{th}$ to $16^{th}$ column addresses CA10~CA16) of the weight matrix, among the weight data stored in the first row ROW0 to the MAC operator coupled thereto.

As described with reference to FIGS. 43 and 44, all of the weight data (corresponding to the weight data arrayed in the first to $128^{th}$ rows R1~R128 of the weight matrix) stored in the first rows ROW0 of the memory banks BK0~BK15 in all of the channels CH0~CH3 may be completely transmitted to the MAC operators MAC0~MAC15 in all of the channels CH0~CH3 by applying the MAC read control signal and the column address to the memory banks BK0~BK15 in all of the channels CH0~CH3 sixteen times. That is, in one row of the channels CH0~CH3, the MAC arithmetic operation may be performed sixteen times by sequentially applying the first to sixteenth column addresses CA1~CA16 to one row of the channels CH0~CH3, and all of the memory banks BK0~BK15 in all of the channels CH0~CH3 may simultaneously operate through a parallelism process. In the present embodiment, only one row of the channels may be used to store the weight data into channels. Thus, it may be unnecessary to apply the active control signal and the row address to additional rows other than the first row ROW0 of the channels for a MAC arithmetic step.

Figure 45:
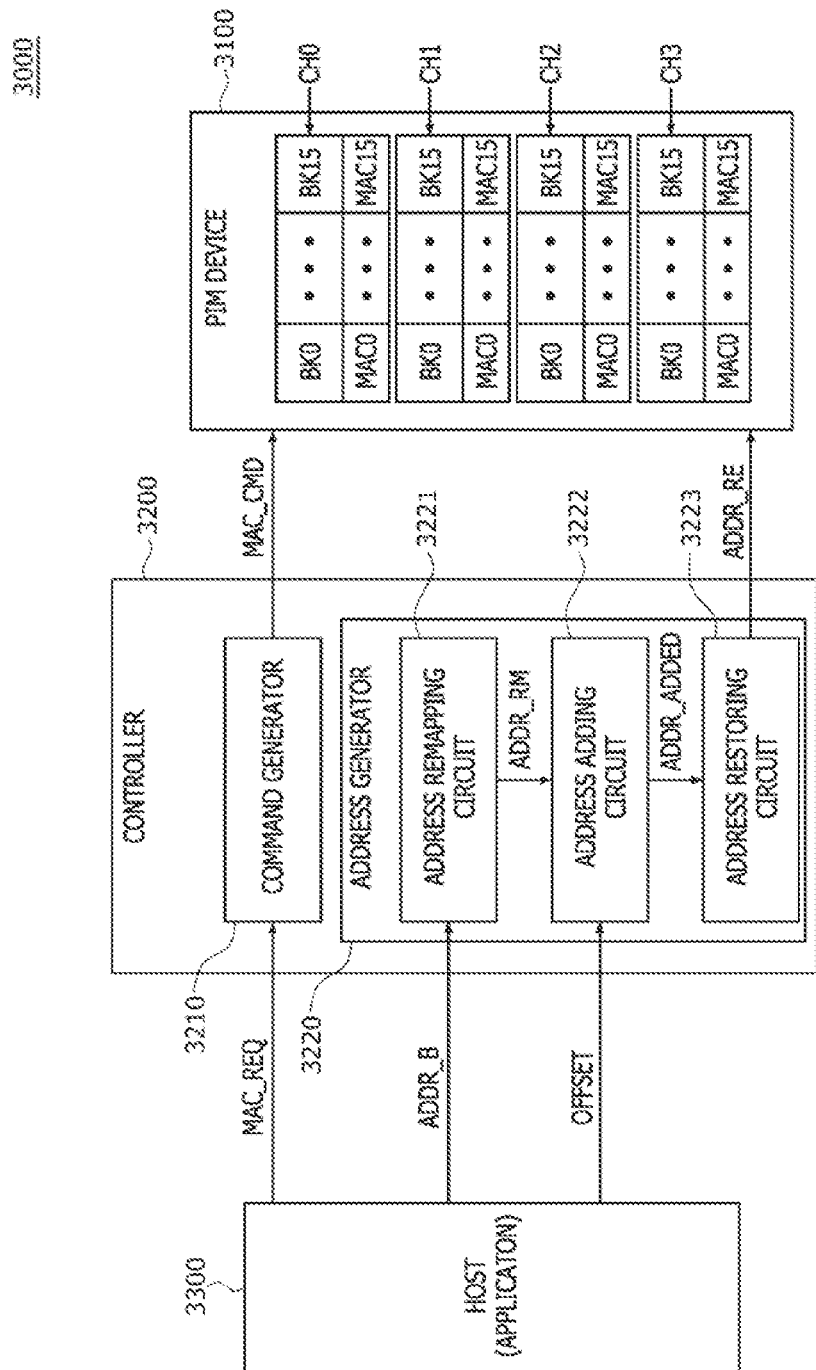
FIG. 45 illustrates a configuration of a PIM system according to an embodiment of the present disclosure.

FIG. 45 is a block diagram a configuration of a PIM system 3000 according to an embodiment of the present disclosure. Referring to FIG. 45, the PIM system 3000 may include a PIM device 3100, a controller 3200 for controlling the PIM device 3100, and a host 3300 requesting operations of the PIM device 3100 through the controller 3200. In the present embodiment, the host 3300 may include a processor executing various applications.

The PIM device 3100 may include the first to sixteenth memory banks BK0~BK15 and the first to sixteenth MAC operators MAC0~MAC15 which are disposed in each of the channels CH0~CH3, as described with reference to FIG. 31. Although not shown in FIG. 31, a global buffer may be included in each of the channels. The PIM device 3100 may have the same configuration as the PIM device 1000 described with reference to FIG. 31. Thus, all of the descriptions developed with reference to FIG. 31 may be equally applicable to the PIM device 3100. Thus, the weight data of the weight matrix (used for the MAC arithmetic operation) may be transmitted and stored into the memory banks BK0~BK15 by the process described with reference to FIGS. 33 and 34 or FIG. 42.

The controller 3200 may include a command generator 3210 and an address generator 3220. The command generator 3210 may generate a MAC command MAC_CMD in response to a MAC request MAC_REQ outputted from the host 3300 and may transmit the MAC command MAC_CMD to the PIM device 3100. The MAC command MAC_CMD may control the MAC arithmetic operations of the MAC operators MAC0~MAC15 in the channels CH0~CH3 included in the PIM device 3100. For example, the PIM device 3100 may generate the MAC read control signal, which transmits the weight data from the memory banks BK0~BK15 to the MAC operators MAC0~MAC15, in response to the MAC command MAC_CMD.

The address generator 3220 may receive a base address ADDR_B and an offset signal OFFSET from the host 3300. The address generator 3220 may generate a restored address ADDR_RE having a restored address map state with change of a column address in the base address ADDR_B in response to the offset signal OFFSET and may output the restored address ADDR_RE to the PIM device 3100. In an embodiment, the address generator 3220 may include an address remapping circuit 3221, an address adding circuit 3222, and an address restoring circuit 3223. The base address ADDR_B and the offset signal OFFSET outputted from the host 3300 may be transmitted to the address remapping circuit 3221 and the address adding circuit 3222 included in the address generator 3220, respectively.

The address remapping circuit 3221 may perform an address remapping operation of the base address ADDR_B outputted from the host 3300 to generate a remapped address ADDR_RM. Specifically, when the base address ADDR_B is mapped in order of a row address, a bank address, a column address, and a channel address so that a column address included in the base address ADDR_B is not located in least significant bits (LSBs) of the base address ADDR_B, the address remapping circuit 3221 may perform the address remapping operation such that the column address included in the base address ADDR_B is located in the LSBs of the base address ADDR_B. That is, the remapped address ADDR_RM generated by the address remapping circuit 3221 may have a remapped state such that the column address included in the remapped address ADDR_RM is located in the LSBs of the remapped address ADDR_RM.

The address adding circuit 3222 may receive the remapped address ADDR_RM from the address remapping circuit 3221. The address adding circuit 3222 may add a set value to the remapped address ADDR_RM in response to the offset signal OFFSET outputted from the host 3300, thereby generating an added address ADDR_ADDED. Because the column address in the remapped address ADDR_RM is located in the LSBs of the remapped address ADDR_RM, a value of the column address in the added address ADDR_ADDED may be changed by the set value as compared with the column address in the base address ADDR_B.

The address restoring circuit 3223 may receive the added address ADDR_ADDED from the address adding circuit 3222 to generate the restored address ADDR_RE which is restored to have an original address map state and may output the restored address ADDR_RE to the PIM device 3100. That is, the restored address ADDR_RE generated by the address restoring circuit 3223 may have the same address map state as the base address ADDR_B outputted from the host 3300. Thus, the column address in the restored address ADDR_RE is not located in the LSBs of the restored address ADDR_RE to have its original location. Nevertheless, the added address ADDR_ADDED includes the column address whose value is already changed. Thus, the column address in the restored address ADDR_RE may also have a value which is changed by the set value as compared with the column address in the base address ADDR_B.

Figure 46:
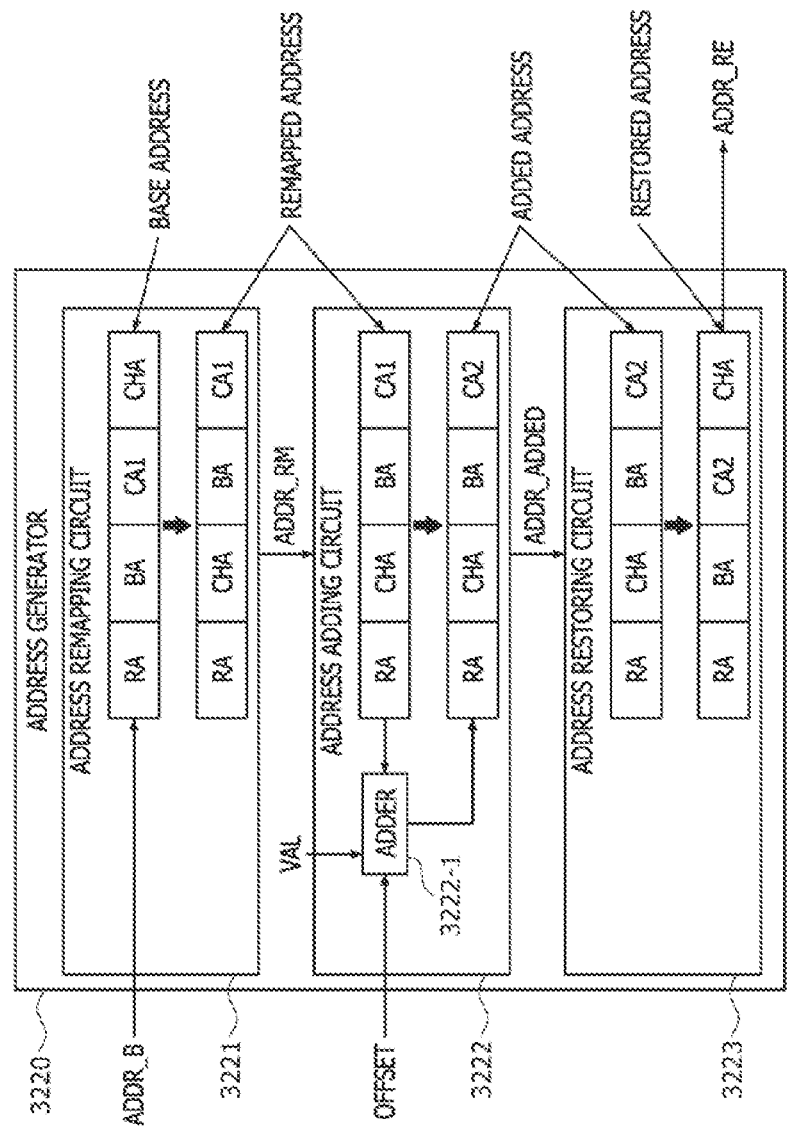
FIG. 46 illustrates an operation of an address generator of a controller included in the PIM system illustrated in FIG. 45.

FIG. 46 illustrates an operation of the address generator 3220 included in the PIM system 3000 illustrated in FIG. 45 in more detail. In FIG. 46, the same reference numerals as used in FIG. 45 denote the same elements. Referring to FIG. 46, the address generator 3220 may receive the base address ADDR_B from the host (3300 of FIG. 45). The base address ADDR_B may have information on target regions which are accessed to read out the weight data used for the MAC arithmetic operation. The base address ADDR_B may include a rank address, a row address, a bank address, a column address, a channel address, a burst length, and so on. In the present embodiment, it may be assumed that the base address ADDR_B includes a row address RA, a bank address BA, a column address CA, and a channel address CHA and the base address ADDR_B is mapped in order of the row address RA, the bank address BA, the column address CA, and the channel address CHA.

The base address ADDR_B outputted from the host 3300 may be transmitted to the address remapping circuit 3221. In the present embodiment, for the purpose of ease and convenience in explanation, the column address CA included in the base address ADDR_B will be referred to as a first column address CA1 hereinafter. Because the first column address CA1 is not located in the LSBs of the base address ADDR_B, the address remapping circuit 3221 may perform the address remapping operation. Specifically, the address remapping circuit 3221 may perform the address remapping operation to relocate the first column address CA1 into the LSBs of the base address ADDR_B. In an embodiment, the address remapping operation may be executed through a shifting operation for the base address ADDR_B. The address remapping circuit 3221 may perform the address remapping operation to generate the remapped address ADDR_RM having the first column CA1 which is located in the LSBs of the remapped address ADDR_RM. The present embodiment will be described in conjunction with a case that the base address ADDR_B is remapped in order of the row address RA, the channel address CHA, the bank address BA, and the column address CA.

The address adding circuit 3222 may receive the remapped address ADDR_RM from the address remapping circuit 3221. The address adding circuit 3222 may include an adder 3222-1. The adder 3222-1 may receive the remapped address ADDR_RM from the address remapping circuit 3221. Further, the adder 3222-1 may receive a set value VAL which is set in the address generator 3220. The set value VAL may be set by the address generator 3220 to correspond to the column address of a position in which the weight data are stored in the PIM device 3100. The adder 3222-1 may perform an adding operation for adding the set value VAL to the remapped address ADDR_RM to generate the added address ADDR_ADDED. The added address ADDR_ADDED may include a second column address CA2 generated by adding the set value VAL to the first column address CA1.

The address restoring circuit 3223 may receive the added address ADDR_ADDED from the address adding circuit 3222. The address restoring circuit 3223 may perform an address map restoring operation of the added address ADDR_ADDED to generate the restored address ADDR_RE having the same address map state as the base address ADDR_B. Accordingly, the restored address ADDR_RE may have an address map state that is remapped in order of the row address RA, the bank address BA, the second column address CA2, and the channel address CHA. That is, the restored address ADDR_RE may have the same address map state as the base address ADDR_B except that the first column address CA1 is replaced with the second column address CA2.

When the restored address ADDR_RE and the MAC command MAC_CMD are transmitted to the PIM device 3100, the PIM device 3100 may generate various control signals (including the MAC read control signal) necessary for the MAC arithmetic operations in response to the MAC command MAC_CMD and may transmit the weight data stored in the memory banks BK0~BK15 to the MAC operators MAC0~MAC15 based on the various control signals to perform the MAC arithmetic operations. In such a case, the weight data transmitted from the memory banks BK0~BK15 to the MAC operators MAC0~MAC15 may be selected by the second column address CA2 included in the restored address ADDR_RE.

According to the PIM system 3000 described above, the weight data may be stored into the memory banks of the channels through a parallelism process as described with reference to FIGS. 33 and 34 or FIG. 43. In such a case, the controller 3200 may set the set value VAL in the address generator 3220 of the controller 3200 to generate the column address (i.e., the second column address CA2) of the memory bank to be accessed to perform a MAC read operation for the weight data. The set value VAL may be added to the first column address CA1 included in the base address ADDR_B outputted from the host 3300. As a result of the adding operation, only the first column address CA1 may be changed into the second column address CA2, but the restored address ADDR_RE may have the same address map state as the base address ADDR_B. The restored address ADDR_RE may be used for the parallelism process for transmitting the weight data to the memory banks in the channels in the PIM device 3100 during the MAC read operation.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A controller for controlling a processing-in-memory (PIM) device, the controller comprising:
    an address generator configured to receive a base address and an offset signal from a host and configured to change a column address included in the base address based on the offset signal to generate and transmit a restored address including the changed column address to the PIM device.

2. The controller of claim 1, wherein the base address has an address map state for which an address other than the column address is located in least significant bits (LSBs) of the base address.

3. The controller of claim 2, wherein the address generator includes:
    an address remapping circuit configured to perform an address remapping operation of the base address to generate a remapped address including the column address which is located in LSBs of the remapped address;
    an address adding circuit configured to add a set value to the remapped address based on the offset signal to generate an added address having the changed column address; and
    an address restoring circuit configured to perform an address map restoring operation of the added address to generate a restored address having the same address map state as the base address.

* * * * *